United States Patent
Sano et al.

(10) Patent No.: US 8,866,539 B2
(45) Date of Patent: Oct. 21, 2014

(54) SEMICONDUCTOR DEVICE HAVING VOLTAGE GENERATION CIRCUIT

(71) Applicant: Renesas Electronics Corporation, Kawasaki (JP)

(72) Inventors: Shinya Sano, Kanagawa (JP); Yasuhiko Takahashi, Kanagawa (JP); Masashi Horiguchi, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 13/913,082

(22) Filed: Jun. 7, 2013

(65) Prior Publication Data

US 2013/0328615 A1 Dec. 12, 2013

(30) Foreign Application Priority Data

Jun. 7, 2012 (JP) .................. 2012-129683

(51) Int. Cl.
*G05F 1/10* (2006.01)
*G05F 3/02* (2006.01)

(52) U.S. Cl.
USPC .......................................... 327/539; 327/513

(58) Field of Classification Search
USPC ............................ 327/512–513, 539; 323/313
See application file for complete search history.

(56) References Cited

U.S. PATENT DOCUMENTS

| | | | |
|---|---|---|---|
| 3,887,863 A | 6/1975 | Brokaw | |
| 4,797,577 A * | 1/1989 | Hing | 327/539 |
| 5,053,640 A | 10/1991 | Yum | |
| 5,767,664 A * | 6/1998 | Price | 323/313 |
| 6,160,391 A | 12/2000 | Banba | |
| 7,420,359 B1 * | 9/2008 | Anderson et al. | 323/316 |
| 7,728,575 B1 | 6/2010 | Ozalevli et al. | |
| 8,493,130 B2 * | 7/2013 | Fukazawa et al. | 327/513 |
| 2008/0036524 A1 * | 2/2008 | Oberhuber | 327/512 |
| 2009/0066313 A1 | 3/2009 | Kimura | |
| 2009/0289697 A1 * | 11/2009 | Gabillard et al. | 327/539 |
| 2010/0156384 A1 * | 6/2010 | Ozalevli et al. | 323/313 |
| 2010/0301832 A1 | 12/2010 | Katyal et al. | |

FOREIGN PATENT DOCUMENTS

JP 11-45125 A 2/2011

OTHER PUBLICATIONS

Kuijk, K.E., "A Precision Reference Voltage Source", IEEE Journal of Solid-State Circuits, vol. sc-8, No. 3, Jun. 1973.
Tsividis, Y.P., "Accurate Analysis of Temperature Effects in Ic-VBE Characteristics with Application to Bandgap References Sources", IEEE Journal of Solid-State Circuits, vol. sc-15, No. 6, Dec. 1980.
Malcovati, P., "Curvature-Compensated BiCMOS Bandgap with 1-V Supply Voltage", IEEE Journal of Solid-State Circuits, vol. sc-36, No. 7, Jul. 2001.

(Continued)

*Primary Examiner* — Quan Tra
(74) *Attorney, Agent, or Firm* — Miles & Stockbridge P.C.

(57) ABSTRACT

The present invention provides a voltage generation circuit which outputs high-precision output voltage in a wide temperature range. A semiconductor device has a voltage generation circuit. The voltage generation circuit has a reference voltage generation circuit which outputs reference voltage, and a plurality of correction circuits for generating a correction current and making it fed back to the reference voltage generation circuit. The correction circuits generate sub correction currents which monotonously increase from predetermined temperature which varies among the correction circuits toward a low-temperature side or a high-temperature side. The correction current is sum of a plurality of sub correction currents.

20 Claims, 40 Drawing Sheets

(56) References Cited

OTHER PUBLICATIONS

Pease, Robert A., "A New Fahrenheit Temperature Sensor", IEEE Journal of Solid-State Circuits, vol. sc-19, No. 6, Dec. 1984.
Paul, Rajarshi et al., "A Temperature-Compensated Bandgap Voltage Reference Circuit for High Precision Applications", India Annual Conference, 2004, Proceedings of the IEEE INDICON 2004, First Publication Date: Dec. 20-22, 2004.
Paul, Rajarshi et al., "Design of Second-Order Sub-Bandgap Mixed-Mode Voltage Reference Circuit for Low Voltage Applications", VLSI Design, 2005, 18$^{th}$ International Conference on Issue, Date: Jan. 3-7, 2005.
Sundar, Siddharth, "A Low Power High Power Supply Rejection Ratio Bandgap Reference for Portable Applications", Massachusetts Institute of Technology, 2008.
Extended European Search Report dated Oct. 7, 2013, in European Patent Application No. 13168330.2.

* cited by examiner

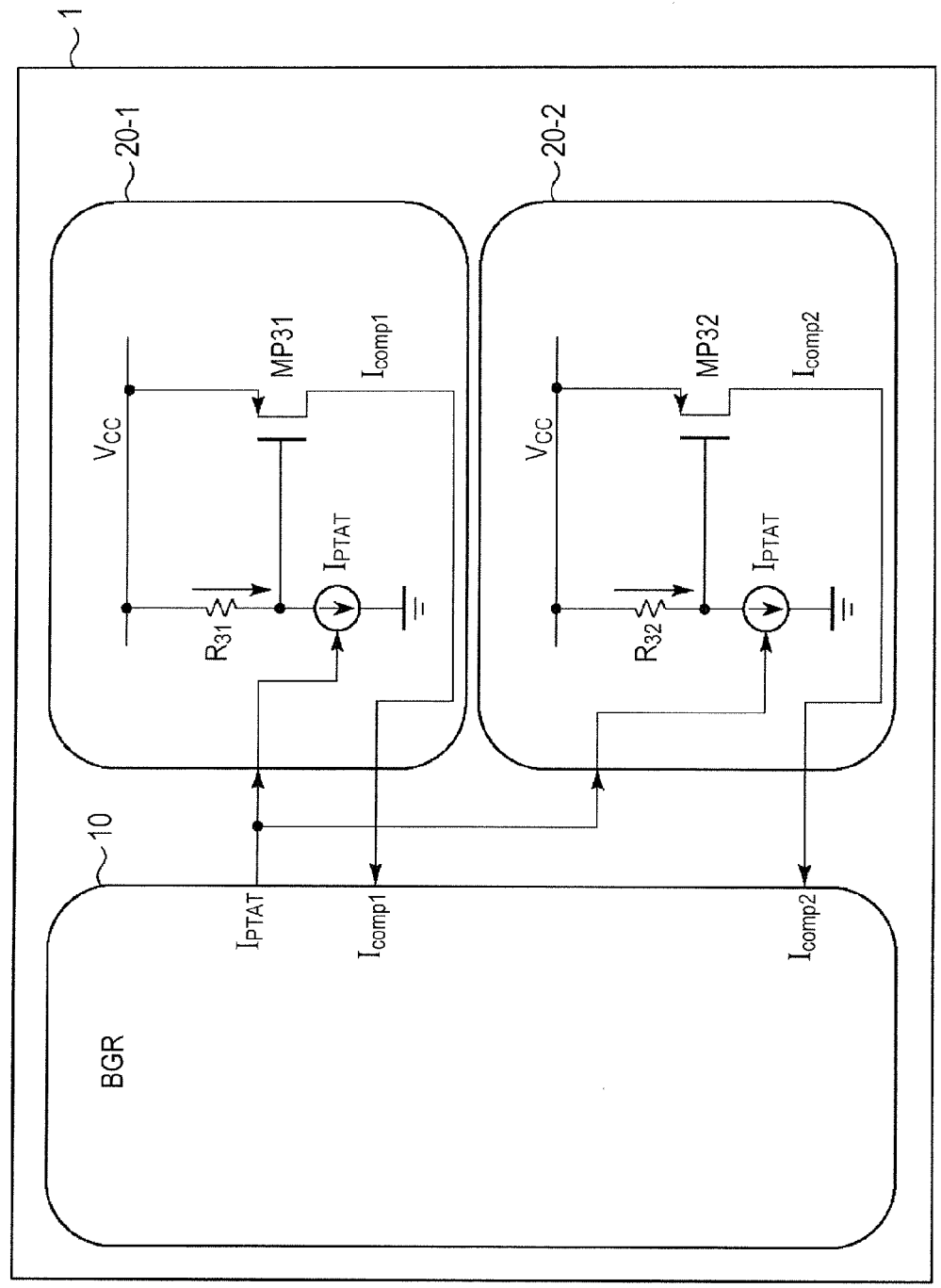

SEMICONDUCTOR DEVICE HAVING VOLTAGE GENERATION CIRCUIT

CROSS-REFERENCE TO RELATED APPLICATIONS

The disclosure of Japanese Patent Application No. 2012-129683 filed on Jun. 7, 2012 including the specification, drawings and abstract is incorporated herein by reference in its entirety.

BACKGROUND

The present invention relates to a semiconductor device and, more particularly, to a technique suitably used for a semiconductor device having therein a voltage generation circuit.

In a semiconductor device such as an LSI (Large Scale Integration) or the like, a reference voltage generation circuit for generating reference voltage is known. From the viewpoint of precision, the reference voltage generation circuit is required to have low dependency of semiconductor manufacture process and low temperature dependency. From the viewpoint of power saving, the circuit is also requested to operate on low power supply voltage. As the reference voltage generation circuit satisfying such a request, a band gap reference (hereinbelow, called "BGR") circuit is known.

Patent literature 1 and non-patent literature 1 disclose examples of the BGR circuit. Patent literature 2 discloses a BGR circuit adapted to low power supply voltage.

On the other hand, the BGR circuit includes a bipolar transistor as a basic element. It is known that the temperature dependency of a base-emitter voltage of a bipolar transistor is non-linear (refer to, for example, non-patent literature 2). Non-patent literature 3 discloses a BGR circuit with improved non-linear temperature dependency of output voltage. Non-patent literatures 4 to 6 disclose a correction circuit for correcting the nonlinear temperature dependency in the BGR circuit of the patent literature 1 and the like. Further, non-patent literature 7 discloses a method of correcting the temperature characteristic by a current ($I_{PTAT}^2$) proportional to the square of the absolute temperature.

PRIOR ART LITERATURE

Patent Literature

Patent literature 1: U.S. Pat. No. 3,887,863
Patent literature 2: Japanese Unexamined Patent Application Publication No. H11-45125 (corresponding to U.S. Pat. No. 6,160,391)

Non-Patent Literature

Non-Patent Literature 1: Kuijk, K. E, "A Precision Reference Voltage Source", IEEE Journal of Solid-State Circuits, Vol. sc-8, No. 3, June 1973
Non-Patent Literature 2: Tsividis, Y. P., "Accurate Analysis of Temperature Effects in Ic-VBE Characteristics with Application to Bandgap Reference Sources", IEEE Journal of Solid-State Circuits, Vol. sc-15, No. 6, December 1980
Non-Patent Literature 3: P. Malcovati, "Curvature-Compensated BiCMOS Bandgap with 1-V Supply Voltage", IEEE Journal of Solid-State Circuits, Vol. sc-36, No. 7, July 2001
Non-Patent Literature 4: Pease, R. A., "A New Fahrenheit Temperature sensor", IEEE Journal of Solid-State Circuits, Vol. sc-19, No. 6, December 1984
Non-Patent Literature 5: Paul, R. Patra, A., "A Temperature-Compensated Bandgap Voltage Reference Circuit for High Precision Applications", India Annual Conference, 2004, Proceedings of the IEEE INDICON 2004, First Publication, Date: 20-22 Dec. 2004
Non-Patent Literature 6: Paul, R. Patra, A. Baranwal, S. Dash, K., "Design of Second-Order Sub-Bandgap Mixed-Mode Voltage Reference Circuit For Low Voltage Applications", VLSI Design, 2005, 18th International Conference on Issue, Date: 3-7 Jan. 2005
Non-Patent Literature 7: Sundar, Siddharth, "A Low Power High Power Supply Rejection Ratio Bandgap-Reference For Portable Applications", Massachusetts Institute of Technology, 2008

SUMMARY

In recent years, a BGR circuit is being requested to operate on power supply voltage of 1V or less and to have high precision of output voltage (for example, variation is 1% or less) in a wide temperature range (for example, from −50° C. to 150° C.). In a typical related-art technique, such a BGR circuit generates a reference voltage $V_{BGR}$ by adding a difference voltage $V_{PTAT}$ (Proportional to absolute temperature) of base-emitter voltages of two bipolar transistors having different emitter areas and a base-emitter voltage VBE (which monotonously decreases with temperature) of a bipolar transistor.

The graph of the reference voltage $V_{BGR}$ has a mountain shape which is convex upward with respect to temperature. Temperature $T_1$ corresponding to the apex portion of the mountain is set to be central use temperature of a semiconductor device having a BGR circuit. In this case, in a temperature range using the temperature $T_1$ around the apex of the mountain as a center, temperature coefficient of the reference voltage $V_{BGR}$ becomes almost zero. As a result, the BGR circuit of the related-art technique can generate the reference voltage $V_{BGR}$ having small temperature dependency in the temperature range.

However, in the BGR circuit of the related-art technique, when the temperature is largely apart from the temperature $T_1$ toward the high-temperature side or the low-temperature side, the tilt of the graph of the reference voltage $V_{BGR}$ becomes large. Specifically, when the temperature is out of the temperature range using the temperature $T_1$ as a center, the temperature coefficient becomes large, so that the precision of the reference voltage $V_{BGR}$ deteriorates considerably. Moreover, by the temperature range, it is considered to be difficult to cover a temperature range to which demand is increasing in recent years. A BGR circuit whose output voltage has high precision in a wide temperature range is being demanded.

The other objects and novel features will become apparent from the description of the specification and the appended drawings.

According to an embodiment, a semiconductor device corrects a reference voltage ($V_{BGR}$) generated by a reference voltage generation circuit with a plurality of correction currents (Icomp1, Icomp2, . . . ) output from a plurality of correction circuits. Each of the plurality of correction currents (Icomp1, Icmop2, . . . ) generated by the plurality of correction circuits is a current which monotonously increases from a predetermined temperature which varies among the correction circuits toward the low-temperature side or the high-temperature side.

According to the embodiment, in the semiconductor device, the precision of the reference voltage ($V_{BGR}$) can be further increased in a desired temperature range.

BRIEF DESCRIPTION OF THE DRAWINGS

FIG. 21 is a circuit diagram illustrating an example of a concrete circuit configuration of a voltage generation circuit according to a fifth embodiment.

DETAILED DESCRIPTION

Hereinafter, embodiments of a semiconductor device having a voltage generation circuit will be described with reference to the appended drawings.

1. Outline of Embodiment

Hereinafter, the outline of a semiconductor device as an embodiment will be described.

Figure 1:
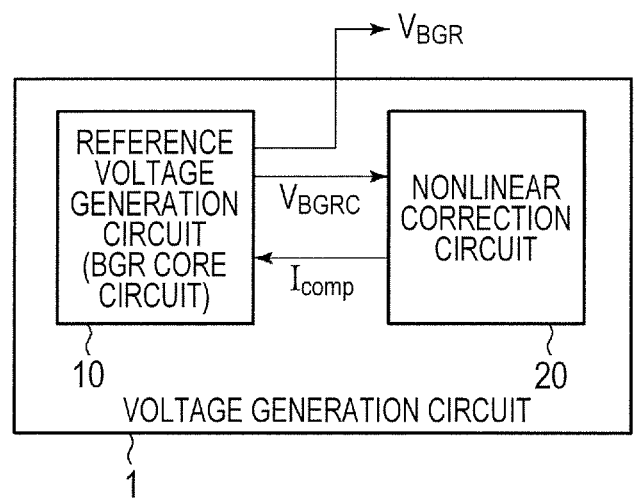
FIG. 1 is a block diagram illustrating an example of a voltage generation circuit provided in a semiconductor device according to an embodiment.

FIG. 1 is a block diagram illustrating an example of a voltage generation circuit provided in a semiconductor device according to an embodiment. A voltage generation circuit 1 has a reference voltage generation circuit 10 and a correction circuit 20. In the diagram, the number of the correction circuit 20 is one. The reference voltage generation circuit 10 generates and outputs a reference voltage $V_{BGR}$ (hereinbelow, also called "BGR core circuit"). The correction circuit 20 generates correction current Icomp on the basis of a reference voltage $V_{BGRC}$ and makes it fed back to the BGR core circuit 10. The correction current Icomp is current for correcting the temperature characteristic of the reference voltage $V_{BGR}$.

FIGS. 2A to 2F are graphs illustrating the principle of a method of correcting a temperature characteristic in the voltage generation circuit according to the embodiment. Those graphs illustrate the principle of the method of correcting the temperature characteristic in the voltage generation circuit 1 of FIG. 1. In each of the graphs, the vertical axis indicates voltage, and the horizontal axis indicates temperature. The graphs are directed to illustrate the concept and are not always numerically accurate.

Figure 2A:
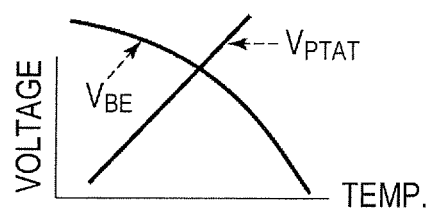
FIG. 2A is a graph illustrating the principle of a method of correcting a temperature characteristic in the voltage generation circuit according to the embodiment.
Figure 2B:
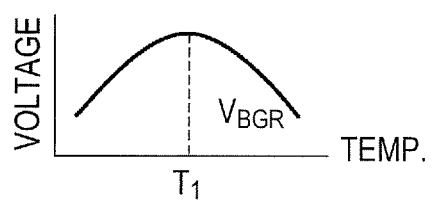
FIG. 2B is a graph illustrating the principle of the method of correcting a temperature characteristic in the voltage generation circuit according to the embodiment.

FIGS. 2A and 2B illustrate the principle of a method of generating the reference voltage $V_{BGR}$ which is conventionally known. The reference voltage $V_{BGR}$ is generated by adding a difference voltage $V_{PTAT}$ (proportional to the absolute temperature) between the base-emitter voltages of two bipolar transistors having different emitter areas and a forward voltage $V_{BE}$ (which monotonously decreases together with temperature) of a PN junction between the base and emitter of the bipolar transistor. The graph of the reference voltage $V_{BGR}$ has a mountain shape which is convex upward. The temperature $T_1$ corresponding to the apex portion of the mountain is set to be central use temperature of the voltage generation circuit 1. As a result, in a temperature range using the temperature $T_1$ as a center, temperature coefficient becomes almost zero, and the reference voltage $V_{BGR}$ having small temperature dependency is generated. When the temperature is largely apart from the temperature $T_1$ toward the high-temperature side or the low-temperature side, the tilt of the graph of the reference voltage $V_{BGR}$ becomes large, that is, the temperature coefficient becomes large, so that the precision of the reference voltage $V_{BGR}$ deteriorates.

Figure 2C:
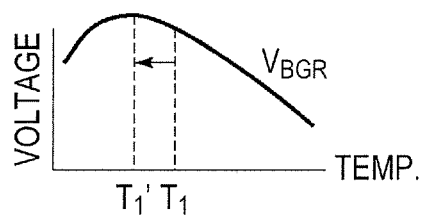
FIG. 2C is a graph illustrating the principle of the method of correcting a temperature characteristic in the voltage generation circuit according to the embodiment.

In the voltage generation circuit 1 of the embodiment illustrated in FIG. 1, to prevent deterioration in the precision of the reference voltage $V_{BGR}$ even at a temperature apart from the central use temperature toward the high-temperature or low-temperature side, the correction circuit 20 is provided. FIGS. 2C to 2F illustrate the principle of the method of generating the reference voltage $V_{BGR}$ of the embodiment. First, as illustrated in FIG. 2C, the BGR core circuit 10 generates the reference voltage $V_{BGR}$ so as to move the temperature corresponding to the apex portion of the mountain of the graph of the reference voltage $V_{BGR}$ toward the low-temperature side. In the diagram, the temperature $T_1$ is moved to temperature $T_1'$ on the low-temperature side. The reason of moving the temperature toward the low-temperature side is to correct the high-temperature side. By moving the temperature $T_1$ toward the low-temperature side, the precision on the low-temperature side improves. By correcting the high-temperature side, the precision on the high-temperature side improves. As a result, the precision can be improved in a wide temperature range. On the contrary, in the case of correcting the low-temperature side, the temperature $T_1$ is moved to the high-temperature side.

Figure 2D:
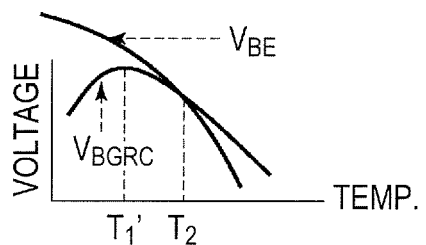
FIG. 2D is a graph illustrating the principle of the method of correcting a temperature characteristic in the voltage generation circuit according to the embodiment.
Figure 2E:
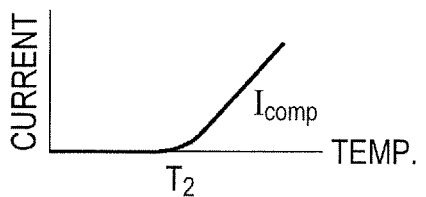
FIG. 2E is a graph illustrating the principle of the method of correcting a temperature characteristic in the voltage generation circuit according to the embodiment.

As illustrated in FIGS. 2D and 2E, the correction circuit 20 performs subtraction between the reference voltage $V_{BGR}$ or the voltage $V_{BGRC}$ proportional to the reference voltage $V_{BGR}$ and the forward voltage $V_{BE}$ of the P-N junction between the base and emitter of the bipolar transistor to generate the correction current Icomp in the range where the subtraction result is positive. The voltage $V_{BGRC}$ or the voltage $V_{BE}$ is generated so that the temperature $T_2$ at the crossing point of the voltage $V_{BGRC}$ and the voltage $V_{BE}$ is smaller than the temperature $T_1'$ ($T_2 > T_1'$). As a result, the correction circuit 20 generates, as the correction current Icomp (FIG. 2E), a current which monotonously increases from the predetermined temperature $T_2$ toward the high-temperature side. The predetermined temperature $T_2$ is also called threshold temperature.

Figure 2F:
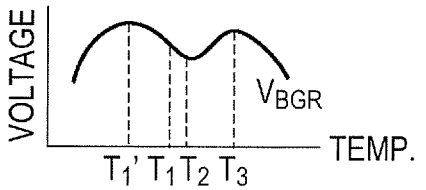
FIG. 2F is a graph illustrating the principle of the method of correcting a temperature characteristic in the voltage generation circuit according to the embodiment.

As illustrated in FIG. 2F, the correction current Icomp (FIG. 2E) of the correction circuit 20 is fed back to the BGR core circuit 10 and added to the reference voltage $V_{BGR}$ (FIG. 2C), thereby generating final reference voltage $V_{BGR}$ (FIG. 2F). The graph of the final reference voltage $V_{BGR}$ (FIG. 2F) has the apexes of the mountain in two points of the temperature $T_1'$ and a temperature $T_3$ ($>T_2$) and its shape has a valley around the temperature $T_2$. The relation $T_1' < T_2 < T_3$ is satisfied. In a range of temperatures from a temperature slightly lower than the temperature $T_1'$ to a temperature slightly higher than the temperature $T_3$, the fluctuation width of the reference voltage $V_{BGR}$ with respect to temperature is small. That is, in the temperature range, the temperature coefficient is suppressed to be small. In other words, as compared with the reference voltage $V_{BGR}$ of FIG. 28, changes in the reference voltage $V_{BGR}$ of FIG. 2F can be reduced in a wider range. That is, the precision of the reference voltage $V_{BGR}$ can be further increased. A concrete circuit configuration of the voltage generation circuit 1 of FIG. 1 will be described later.

Although the number of the correction circuit 20 is one in FIG. 1, by providing a plurality of correction circuits, the precision of the reference voltage $V_{BGR}$ can be further increased. In the following, the case of providing a plurality of correction circuits will be described.

Figure 3:
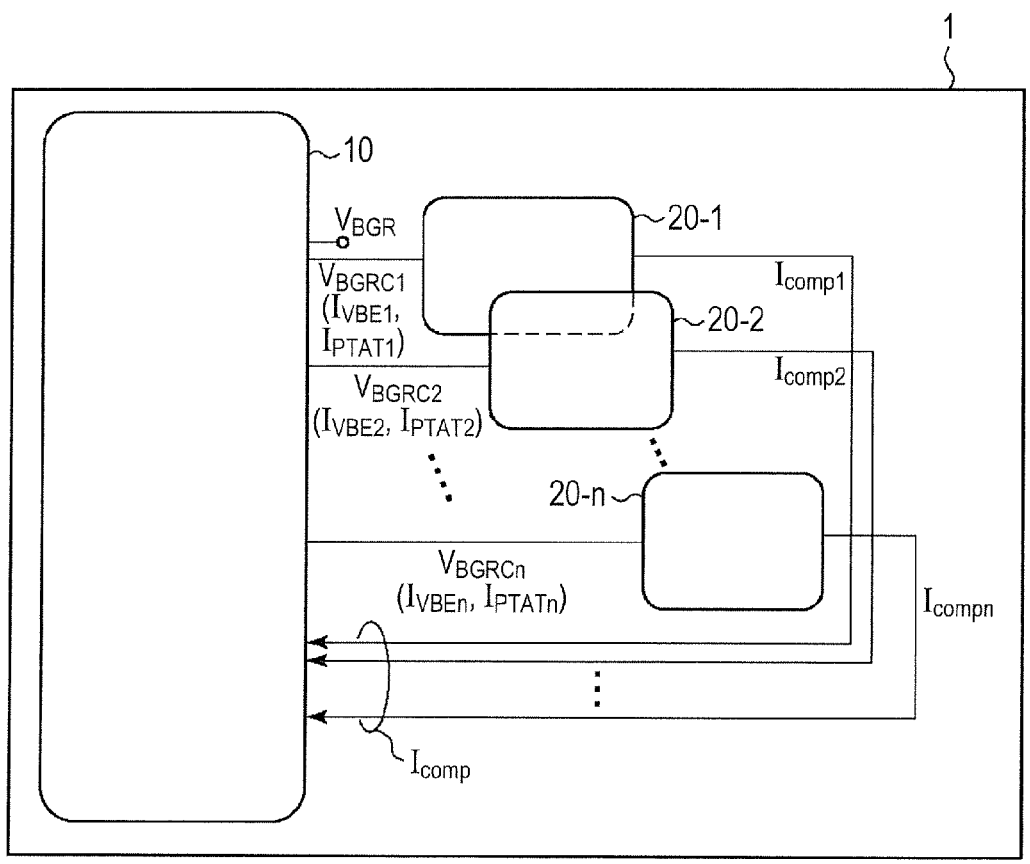
FIG. 3 is a block diagram illustrating another example of the voltage generation circuit provided in the semiconductor device according to the embodiment.

FIG. 3 is a block diagram illustrating another example of the voltage generation circuit provided in the semiconductor device according to the embodiment. The voltage generation circuit 1 has the BGR core circuit 10 and a plurality of correction circuits 20-1 to 20-n (where "n" is natural number; the number of correction circuits). The BGR core circuit 10 generates and outputs the reference voltage $V_{BGR}$. The plurality of correction circuits 20-1 to 20-n generate the correction current Icomp and make it fed back to the BGR core circuit 10. Each of the correction circuits 20-i (i=1 to n; natural number) generates a correction current Icompi (also called "sub correction current") which monotonously increases from a predetermined temperature (threshold temperature) which varies among the correction circuits 20-i toward a low-temperature side or a high-temperature side. The correction current Icomp is current for correcting the temperature characteristic of the reference voltage $V_{BGR}$ and is the sum of a plurality of correction currents Icomp1 to 0 generated by the plurality of correction circuits 20-1 to 20-n. The correction circuit 20-i generates a correction current Icompi on the basis of the reference voltage $V_{BGR}$ or the voltage $V_{BGRC}$ corresponding to the reference voltage $V_{BGR}$.

The correction circuit 20-i may generate the correction current Icompi on the basis of the voltage $V_{PTAT}$ or current $I_{PTAT}$ corresponding to the voltage $V_{PTAT}$ and the voltage $V_{BE}$ or current $I_{VBE}$ corresponding to the voltage $V_{BE}$. The voltage $V_{PTAT}$ is a difference voltage between the base-emitter voltages of two bipolar transistors having different emitter areas. The voltage $V_{BE}$ is the forward voltage $V_{BE}$ of a P-N junction between the base and emitter of the bipolar transistor.

In the embodiment illustrated. in FIG. 3, to prevent deterioration in the precision of the reference voltage $V_{BGR}$ even at a temperature apart from the central use temperature toward the high-temperature or low-temperature side, the plurality of correction circuits 20-1 to 20-n are provided. Each of the correction circuits 20-i generates the correction current Icompi. The correction current Icompi monotonously increases from the threshold temperature $T_2$ toward the high-temperature side or the low-temperature side. The predetermined temperature $T_2$ is different from the predetermined temperature $T_2$ of a correction current Icompi' of another correction circuit 20-i' (i'≠i). It is unnecessary to use all of the plurality of correction circuits 20-1 to 20-n, and arbitrary one or more of the plurality of correction circuits 20-1 to 20-n may be operated by a method of, for example, controlling the power supply to the correction circuit 20-i.

In other words, the plurality of correction circuits 20-1 to 20-n may be circuits which are cascaded to the BGR core circuit 10, detect different threshold temperatures, and generate different correction currents Icomp1 to Icompn. The correction current Icomp (=ΣIcompi) can be arbitrarily changed by arbitrarily varying the number of stages of the cascade. Hereinafter, it will be described concretely.

First, a method of correcting the temperature characteristic on the high-temperature side of the reference voltage $V_{BGR}$ will be described.

FIGS. 4A to 4E are graphs illustrating the principle of a method of correcting the temperature characteristic in the voltage generation circuit according to the embodiment. The diagram's illustrate the principle of the method of correcting the temperature characteristic in the voltage generation circuit 1 of FIG. 3. In each of the graphs, the vertical axis indicates voltage, and the horizontal axis indicates temperature. The graphs are directed to illustrate the concept and are not always numerically accurate. The diagrams illustrate the case where the number of the correction circuits 20 is three (n=3, the correction circuits 20-1 to 20-3). The basic functions of each of the correction circuits 20-i are similar to those of the correction circuit 20 of FIG. 1. That is, each of the correction circuits 20-i generates the correction current Icompi as illustrated in FIGS. 2D and 2E. Each of the correction currents Icompi monotonously increases from the threshold temperature $T_2$ toward the high-temperature side. At least, the threshold temperature $T_2$ is different from that of the correction current Icompi' of another correction circuit 20-i' (i'≠i). Further, the ratio of increase/decrease to the temperature of the correction current Icompi may be different.

Figure 4A:
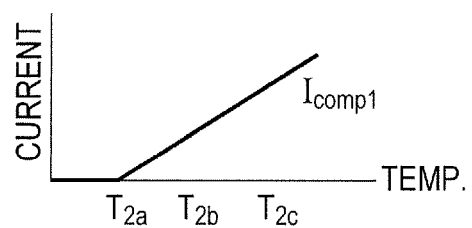
FIG. 4A is a graph illustrating the principle of a method of correcting a temperature characteristic in the voltage generation circuit according to the embodiment.
Figure 4B:
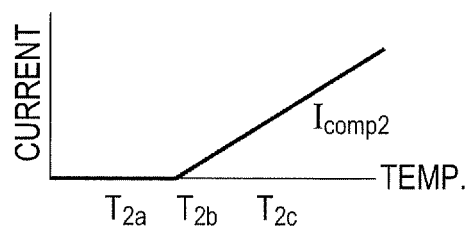
FIG. 4B is a graph illustrating the principle of the method of correcting a temperature characteristic in the voltage generation circuit according to the embodiment.
Figure 4C:
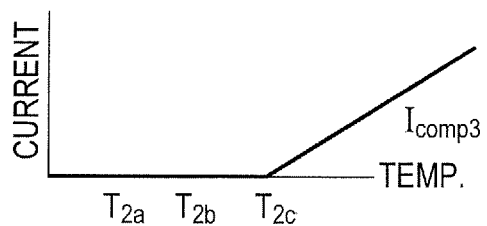
FIG. 4C is a graph illustrating the principle of the method of correcting a temperature characteristic in the voltage generation circuit according to the embodiment.

FIG. 4A is a diagram corresponding to FIG. 2E regarding the correction circuit 20-1 and illustrates the correction current Icomp1. The correction current Icomp1 monotonously increases from a threshold temperature $T_{2a}$ toward the high-temperature side. FIG. 4B is a diagram corresponding to FIG. 2E regarding the correction circuit 20-2 and illustrates the correction current Icomp2. The correction current Icomp2 monotonously increases from a threshold temperature $T_{2b}$ toward the high-temperature side. FIG. 4C is a diagram corresponding to FIG. 2E regarding the correction circuit 20-3 and illustrates the correction current Icomp3. The correction current Icomp3 monotonously increases from a threshold temperature $T_2$ toward the high-temperature side. In this case, the relation $T_{2a} < T_{2b} < T_{2c}$ is satisfied. Change in the threshold temperature $T_2$ can be realized by, for example, changing the voltage $V_{BGRC}$ among the correction circuits 20-$i$. In the examples of FIGS. 4A to 4C, it can be realized by reducing the voltage $V_{BGRC}$ in the order of the correction circuits 20-1, 20-2, and 20-3. The method of generating the correction current Icompi is not limited to the example of FIG. 2D ($V_{BGRC} + V_{BE}$).

Figure 4D:
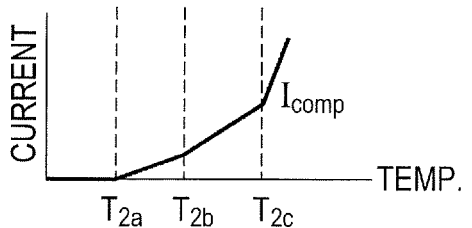
FIG. 4D is a graph illustrating the principle of the method of correcting a temperature characteristic in the voltage generation circuit according to the embodiment.
Figure 4E:
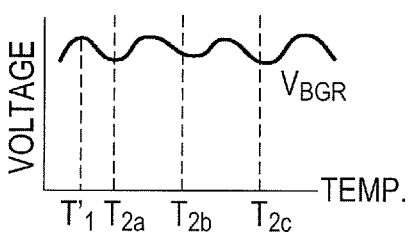
FIG. 4E is a graph illustrating the principle of the method of correcting a temperature characteristic in the voltage generation circuit according to the embodiment.

As illustrated in FIG. 4D, the final correction current Icomp is the sum of the correction currents Icomp1, Icomp2, and Icomp3. The correction current Icomp is Icomp1 between the threshold temperatures $T_{2a}$ and $T_{2b}$, Icomp1+Icomp2 between the threshold temperatures $T_{2b}$ and $T_{2c}$, and Icomp1+Icomp2+Icomp3 at the threshold temperature $T_{2c}$ or higher. That is, the correction current Icomp gradually increases as the temperature rises. It corresponds to the case that the reference voltage $V_{BGR}$ (FIG. 2C) before the correction current Icomp is added gradually decreases toward the high-temperature side. By adding the correction current Icomp to the voltage $V_{BGR}$ of FIG. 2C, the reference voltage $V_{BGR}$ of FIG. 4E is generated. Changes in the reference voltage $V_{BGR}$ of FIG. 4E with respect to the temperature side in a wider range as compared with the reference voltage $V_{BGR}$ of FIG. 2F. That is, the precision of the reference voltage $V_{BGR}$ can be further increased. A concrete circuit configuration of the voltage generation circuit 1 of FIG. 3 in this case will be described later.

Next, a method of correcting the temperature characteristic on the low-temperature side of the reference voltage $V_{BGR}$ will be described.

FIGS. 5A to 5E are graphs illustrating the principle of the method of correcting the temperature characteristic in the voltage generation circuit according to the embodiment. The diagrams illustrate the principle of the method of correcting the temperature characteristic in the voltage generation circuit 1 of FIG. 3. In each of the graphs, the vertical axis indicates voltage, and the horizontal axis indicates temperature. The graphs are directed to illustrate the concept and are not always numerically accurate. The diagrams also illustrate the case where the number of the correction circuits 20 is three (n=3, the correction circuits 20-1 to 20-3). The basic functions of each of the correction circuits 20-$i$ are opposite to those of the correction circuit 20 of FIG. 1. That is, each of the correction circuits 20-$i$ performs subtraction between the voltage $V_{BGRC}$ proportional to the reference voltage $V_{BGR}$ (or the reference voltage $V_{BGR}$) and the forward voltage $V_{BE}$ of the P-N junction between the base and the emitter generates the correction current Icompi in the range where the subtraction result is positive. That is, the positive voltage in FIG. 2D is opposite. Each of the correction currents Icompi monotonously increases from the threshold temperature $T_2$ toward the low-temperature side. At least, the threshold temperature $T_2$ is different from that of the correction current Icompi' of another correction circuit 20-$i$' ($i' \ne i$). Further, the ratio of increase/decrease to the temperature of the correction current Icompi may be different.

Figure 5A:
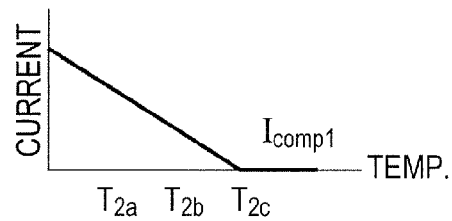
FIG. 5A is a graph illustrating the principle of a method of correcting a temperature characteristic in the voltage generation circuit according to the embodiment.
Figure 5B:
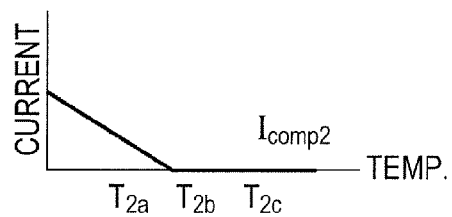
FIG. 5B is a graph illustrating the principle of the method of correcting a temperature characteristic in the voltage generation circuit according to the embodiment.
Figure 5C:
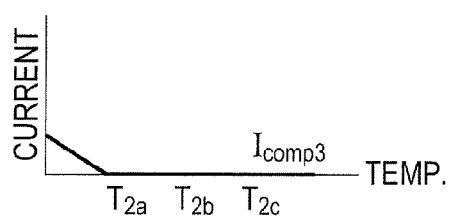
FIG. 5C is a graph illustrating the principle of the method of correcting a temperature characteristic in the voltage generation circuit according to the embodiment.

FIG. 5A is a diagram corresponding to FIG. 2E regarding the correction circuit 20-1 and illustrates the correction current Icomp1. The correction current Icomp1 monotonously increases from the threshold temperature $T_{2c}$ toward the low-temperature side. FIG. 5B is a diagram corresponding to FIG. 2E regarding the correction circuit 20-2 and illustrates the correction current Icomp2. The correction current Icomp2 monotonously increases from the threshold temperature $T_{2b}$ toward the low-temperature side. FIG. 5C is a diagram corresponding to FIG. 2E regarding the correction circuit 20-3 and illustrates the correction current Icomp3. The correction current Icomp3 monotonously increases from the threshold temperature $T_{2a}$ toward the low-temperature side. In this case, the relation $T_{2a} < T_{2b} < T_{2c}$ is satisfied. Change in the threshold temperature $T_2$ can be realized by, for example, changing the voltage $V_{BGRC}$ among the correction circuits 20-$i$. In the examples of FIGS. 5A to 5C, it can be realized by increasing the voltage $V_{BGRC}$ in the order of the correction circuits 20-1, 20-2, and 20-3. The method of generating the correction current Icompi is not limited to the case of FIG. 2D ($V_{BGRC} + V_{BE}$) where the positive voltage is opposite.

Figure 5D:
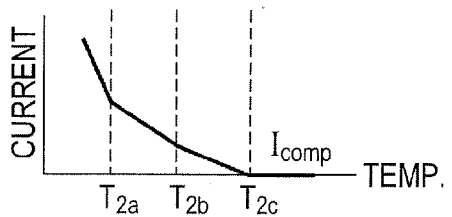
FIG. 5D is a graph illustrating the principle of the method of correcting a temperature characteristic in the voltage generation circuit according to the embodiment.
Figure 5E:
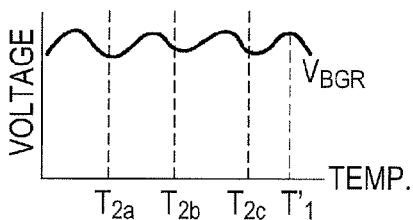
FIG. 5E is a graph illustrating the principle of the method of correcting a temperature characteristic in the voltage generation circuit according to the embodiment.

As illustrated in FIG. 5D, the final correction current Icomp is the sum of the correction currents Icomp1, Icomp2, and Icomp3. The correction current Icomp is Icomp3 between the threshold temperatures $T_{2c}$ and $T_{2b}$, Icomp2+Icomp3 between the threshold temperatures $T_{2b}$ and $T_{2a}$, and Icomp1+Icomp2+Icomp3 at the threshold temperature $T_{2a}$ or lower. That is, the correction current Icomp gradually increases as the temperature decreases. It corresponds to the case that the reference voltage $V_{BGR}$ (FIG. 2C) before the correction current Icomp is added gradually decreases toward the low-temperature side. By adding the correction current Icomp to the voltage $V_{BGR}$ of FIG. 2C, the reference voltage $V_{BGR}$ of FIG. 5E is generated. In this case, it is preferable use a curve of the voltage $V_{BGR}$ of FIG. 2C at the temperature $T_1'$ obtained by moving the temperature $T_1$ at the apex of the mountain shape to the high-temperature side (not the low-temperature side). Changes in the reference voltage $V_{BGR}$ of FIG. 5E with respect to the temperature can be reduced on the low-temperature side in a wider range as compared with the reference voltage $V_{BGR}$ of FIG. 2F. That is, the precision of the reference voltage $V_{BGR}$ can be further increased. A concrete circuit configuration of the voltage generation circuit 1 of FIG. 3 in this case will be described later. According to precision to be obtained, the number of the correction circuit 20-$i$ may be one like in the case of FIG. 1.

Next, a method of correcting the temperature characteristics on both of the high-temperature side and the low-temperature side of the reference voltage $V_{BGR}$ will be described.

FIGS. 6A to 6D are graphs illustrating the principle of the method of correcting the temperature characteristic in the voltage generation circuit according to the embodiment. The diagrams illustrate the principle of the method of correcting the temperature characteristic in the voltage generation circuit 1 of FIG. 3. In each of the graphs, the vertical axis indicates voltage, and the horizontal axis indicates temperature. The graphs are directed to illustrate the concept and are not always numerically accurate. The diagrams illustrate the case where the number of the correction circuits 20 is two (n=2, the correction circuits 20-1 and 20-2). The basic functions of the correction circuit 20-1 (low-temperature side) are opposite to those of the correction circuit 20 of FIG. 1 like in the case of FIG. 5A. The basic functions of the correction circuit 20-2 (high-temperature side) are similar to those of the correction circuit 20 of FIG. 1 like in the case of FIGS. 4A to 4E. The correction current Icomp1 monotonously increases from the threshold temperature $T_{2a}$ toward the low-temperature side. The correction current Icomp2 monotonously increases from the threshold temperature $T_{2b}$ toward the high-temperature side. The predetermined temperature $T_{2a}$ is different from another predetermined temperature $T_{2b}$. Hereinafter, it will be concretely described. Further, the ratio of increase/decrease with respect to the temperature of the correction current Icompi may be different.

Figure 6A:
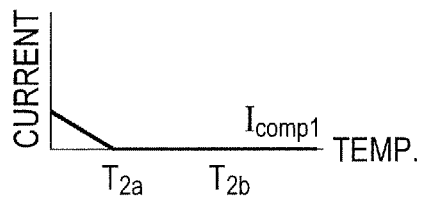
FIG. 6A is a graph illustrating the principle of a method of correcting a temperature characteristic in the voltage generation circuit according to the embodiment.
Figure 6B:
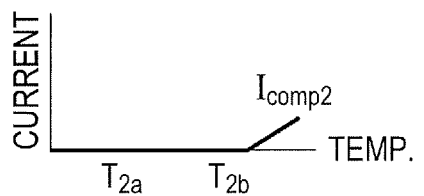
FIG. 6B is a graph illustrating the principle of the method of correcting a temperature characteristic in the voltage generation circuit according to the embodiment.

FIG. 6A is a diagram corresponding to FIG. 5C regarding the correction circuit 20-1 and illustrates the correction current Icomp1. The correction current Icomp1 monotonously increases from the threshold temperature $T_{2a}$ toward the low-temperature side. FIG. 6B is a diagram corresponding to FIG. 4C regarding the correction circuit 20-2 and illustrates the correction current Icomp2. The correction current Icomp2 monotonously increases from the threshold temperature $T_{2b}$ toward the high-temperature side. In this case, the relation $T_{2a} < T_{2b}$ is satisfied. Change in the threshold temperature $T_2$ can be realized by, for example, changing the voltage $V_{BGRC}$ among the correction circuits 20-$i$. The method of generating the correction current Icompi is not limited to the example of FIG. 2D ($V_{BGRC} + V_{BE}$).

Figure 6C:
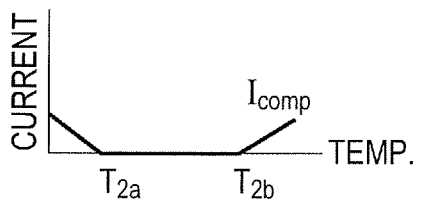
FIG. 6C is a graph illustrating the principle of the method of correcting a temperature characteristic in the voltage generation circuit according to the embodiment.
Figure 6D:
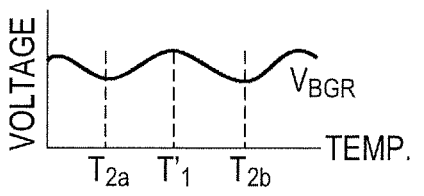
FIG. 6D is a graph illustrating the principle of the method of correcting a temperature characteristic in the voltage generation circuit according to the embodiment.

As illustrated in FIG. 6C, the final correction current Icomp is the sum of the correction currents Icomp1 and Icomp2. The correction current Icomp is Icomp1 at the threshold temperatures $T_{ea}$ or lower and Icomp2 at the threshold temperature $T_{2b}$ or higher. That is, the correction current Icomp increases as the temperature decreases on the low-temperature side, and increases as the temperature rises on the high-temperature side. It corresponds to the case that the reference voltage $V_{BGR}$ (FIG. 2B) before the correction current Icomp is added decreases toward the low-temperature side and decreases toward the high-temperature side. By adding the correction current Icomp to the voltage $V_{BGR}$ of FIG. 2B, the reference voltage $V_{BGR}$ of FIG. 6D is generated. In this case, as the voltage $V_{BGR}$ of FIG. 2B, it is not always necessary to move the temperature $T_1$ at the apex of the mountain shape to the low-temperature side or the high-temperature side. Changes in the reference voltage $V_{BGR}$ of FIG. 6D with respect to the temperature can be reduced on both of the low-temperature side and the high-temperature side in a wider range as compared with the reference voltage $V_{BGR}$ of FIG. 2B. That is, the precision of the reference voltage $V_{BGR}$ can be further increased. A concrete circuit configuration of the voltage generation circuit 1 of FIG. 3 in this case will be described later. According to precision to be obtained, a plurality of the correction circuits 20-$i$ may be provided on each of the high-temperature side and the low-temperature side. The number of the correction circuits 20-$i$ on the low-temperature side and that on the high-temperature side may be different from each other.

2. Details of Embodiments

Hereinafter, the details of concrete examples for realizing the configurations and effects described in the outline of the embodiments will be described.

First Embodiment

A semiconductor device according to a first embodiment will be described. In the first embodiment, the case where the correction circuit 20 generates the correction current Icomp on the basis of the reference voltage $V_{BGR}$ (or voltage $V_{BGRC}$) and the voltage $V_{BE}$ between the base and the emitter of a bipolar transistor and the high-temperature side of the reference voltage $V_{BGR}$ is corrected with the correction current Icomp will be described. In the embodiment, the number of the correction circuit 20 is one.

A voltage generation circuit in the embodiment is the voltage generation circuit as illustrated in FIG. 1 and performs correction on the high-temperature side as illustrated in FIGS. 2C to 2F.

Figure 7:
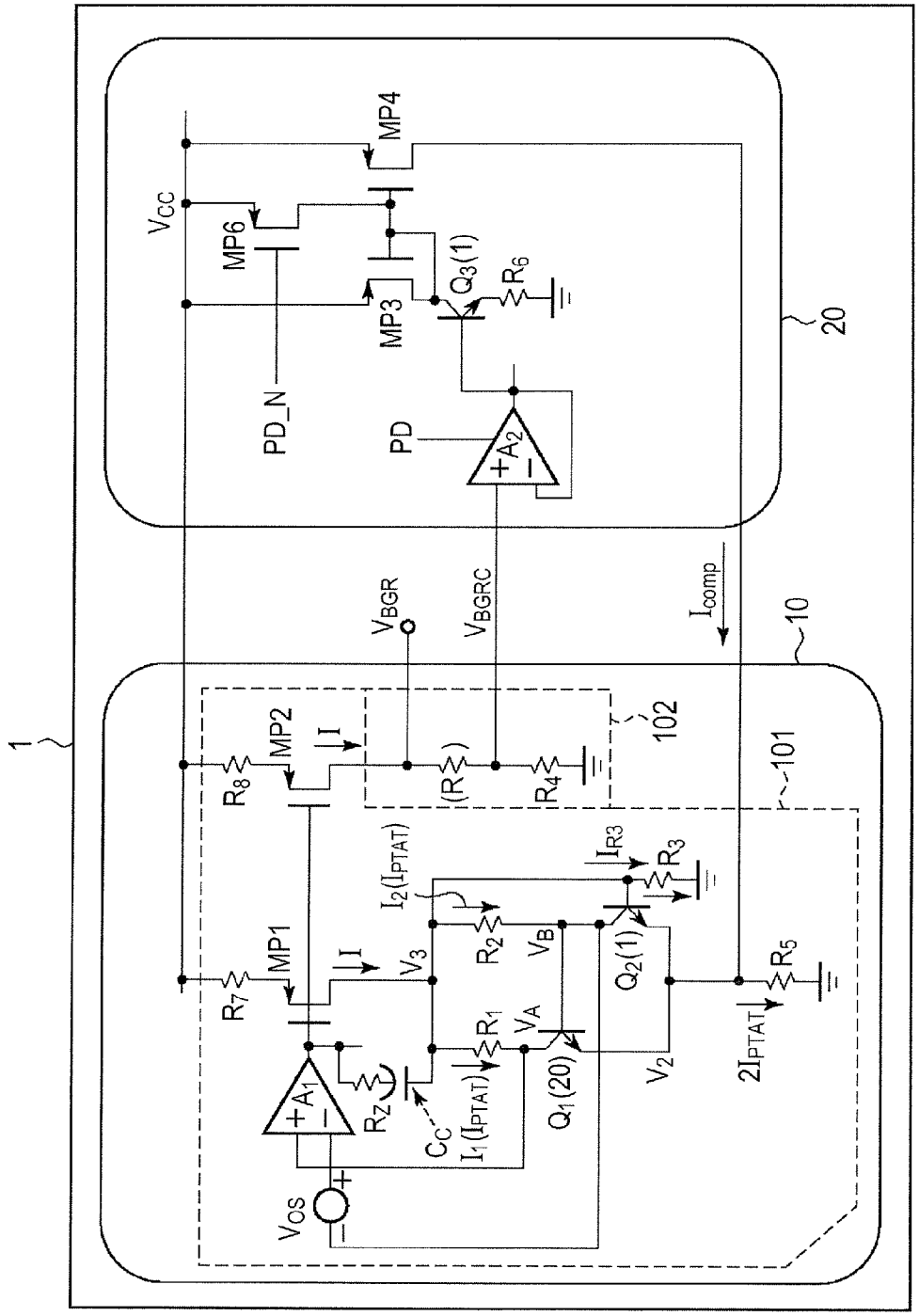
FIG. 7 is a circuit diagram illustrating an example of a concrete circuit configuration of a voltage generation circuit according to a first embodiment.

FIG. 7 is a circuit diagram illustrating an example of a concrete circuit configuration of a voltage generation circuit according to the first embodiment. The voltage generation circuit 1 is, although not limited, formed on a semiconductor substrate such as a single silicon substrate by the known CMOS integrated circuit manufacturing technique. This configuration is the same in the following embodiments.

The BGR core circuit 10 has a current generation unit 101 and a voltage output unit 102. The current generation unit 101 generates current I obtained by adding current according to the difference voltage ($\Delta V_{BE}$) between the base and emitter voltages of two bipolar transistors $Q_1$ and $Q_2$ having different emitter areas, current according to the base-emitter voltage $V_{BE2}$ of the bipolar transistor $Q_2$, and the correction current Icomp generated by the correction circuit 20. The voltage output unit 102 converts the generated current to the reference voltage $V_{BGR}$ and outputs it.

The current generation unit 101 has, for example, the NPN-type bipolar transistors $Q_1$ and $Q_2$, resistors $R_1$, $R_2$, $R_3$, $R_5$, $R_7$, $R_8$, and $R_z$, a capacitor Cc, a differential amplifier $A_1$, and P-channel-type MOS transistors MP1 and MP2. The output unit 102 has, for example, a resistor $R_4$.

The emitter terminals of the bipolar transistors $Q_1$ and $Q_2$ are commonly coupled. The base terminal of the bipolar transistor $Q_1$ is coupled to the collector terminal of the bipolar transistor $Q_2$. The emitter area of the bipolar transistor $Q_1$ is "n" times as large as that of the bipolar transistor $Q_2$ (n is an integer of two or larger). That is, it is set so that when the same current is passed to the bipolar transistors $Q_1$ and $Q_2$, the emitter current density of the bipolar transistor $Q_2$ is "n" times as high as that of the transistor $Q_1$. In the example of the diagram, "n" is equal to 20. One end of the resistor $R_1$ is coupled to the base terminal of the bipolar transistor $Q_2$, and the other end is coupled to the collector terminal of the bipolar transistor $Q_1$. One end of the resistor $R_2$ is coupled to one end of the resistor $R_1$, and the other end is coupled to the collector terminal of the bipolar transistor $Q_1$. The resistor $R_5$ is provided between the emitter terminal commonly coupled to the bipolar transistors $Q_1$ and $Q_2$ and the ground node. The resistor $R_3$ is provided between the base terminal of the bipolar transistor $Q_2$ and the ground node. the differential amplifier $A_1$, the potential on the collector side of each of the bipolar transistors $Q_1$ and $Q_2$ is supplied. Each of the PMOS transistors MP1 and MP2 has the gate terminal to which the output voltage of the differential amplifier $A_1$ is supplied, and has the source terminal to which the power supply node Vcc is coupled via the resistor $R_7$ or $R_8$. The drain terminal of the PMOS transistor MP1 is coupled to the connection nodes of the resistors $R_1$ and $R_2$. In such a manner, a feedback loop is formed. One end of the resistor $R_4$ is coupled to the drain terminal of the PMOS transistor MP2 and the other end is coupled to the ground node. Consequently, the current I is supplied to the resistor $R_4$ from the drain terminal of the PMOS transistor MP2. The voltage at the connection node between the drain terminal of the PMOS transistor MP2 and the resistor $R_4$ is the reference voltage $V_{BGR}$. The operation principle of the BGR core circuit 10 will be described later.

The resistor Rz and the capacitor Cc are coupled in series in this order and coupled to the output side of the differential amplifier $A_1$ and the drain terminal of the PMOS transistor MP1. Those elements are elements for phase compensation to prevent oscillation of the circuit and have no direct relation to generation of current and voltage. The resistors $R_7$ and $R_8$ are source resistors for reducing the influence of a mismatch in the PMOS transistors MP1 and MP2 and may be omitted in the case where the influence of a mismatch can be ignored.

The correction circuit 20 generates the correction current Icomp according to the voltage obtained by subtracting the base emitter voltage $V_{BE3}$ of a bipolar transistor $Q_3$ from the output voltage $V_{BGR}$ or the voltage $V_{BGRC}$ corresponding to the output voltage $V_{BGR}$, and makes the generated correction current Icomp fed back to the current generation unit 101.

The correction circuit 20 has, for example, differential amplifier $A_2$, the bipolar transistor $Q_3$, a resistor $R_6$, and P-channel-type MOS transistors MP3 and MP4. Preferably, it has a P-channel-type MOS transistor MP6.

The differential amplifier $A_2$ receives the output voltage $V_{BGR}$ of the BGR core circuit 10 and the voltage $V_{BGRC}$ corresponding to the output voltage $V_{BGR}$ and serves as a voltage follower. The bipolar transistor $Q_3$ has the base terminal to which the output terminal of the differential amplifier $A_2$ is coupled. The resistor $R_6$ is provided between the emitter terminal of the bipolar transistor $Q_3$ and the ground node. The PMOS transistor MP3 has the source terminal to which the power supply node Vcc is coupled and has the drain terminal to which the gate terminal and the collector terminal of the bipolar transistor $Q_3$ is coupled. The source terminal of the PMOS transistor MP4 is coupled to the power supply node Vcc, and the gate terminal is coupled to the gate terminal of the PMOS transistor MP3. The PMOS transistors MP3 and MP4 configure a current mirror circuit which outputs the correction current Icomp from the PMOS transistor MP4 in accordance with the current flowing on the collector side of the bipolar transistor $Q_3$. Although not limited, the correction current Icomp is fed back to a node between the resistor $R_5$ of the current generation unit 101 and the commonly coupled emitter terminals of the bipolar transistors $Q_1$ and $Q_2$. By employing the feedback method, the precision can be improved without requiring high precision of the element circuits such as the differential amplifier and the current mirror used for the correction circuit 20 and without adding large area and current.

The differential amplifier $A_2$ is provided to supply the base current of the bipolar transistor $Q_3$. However, it may be omitted in the case where the influence of the reference voltage $V_{BGR}$ can be ignored by supplying the base current directly from the PMOS transistor MP2. The detailed operation principle of the correction circuit 20 will be described later.

The operation principle of the voltage generation circuit 1 will be described with respect to each of the BGR core circuit 10 and the correction circuit 20.

(1) BGR Core Circuit 10

In FIG. 7, the current flowing in the resistor $R_1$ is expressed as $I_1$, the current flowing in the resistor $R_2$ is expressed as $I_2$, the current flowing in the PMOS transistors MP1 and MP2 is expressed as I, and the voltage at the connection point of the resistors $R_1$ and $R_2$ is expressed as $V_3$, and it is assumed that the relation $R_1=R_2=R_{12}$ is satisfied. In the following description, the mirror ratio of the current mirror circuit and the like is 1:1. However, the invention is not limited to the ratio, and the mirror ratio can be changed. In the following description, for easier understanding, calculation is performed without considering the base current of the bipolar transistors. However, in simulation or the like in actual designing, calculation including the base current is performed.

Saturation current density of the bipolar transistor is expressed as Js, unit area is expressed as A, thermal voltage is expressed as $V_T=kT/q$, k is expressed as Boltzmann constant is expressed as k, absolute temperature is expressed as T, and charge elementary quantum is expressed as q. Equations 1 are satisfied with respect to the base-emitter voltage $V_{BE1}$ of the bipolar transistor $Q_1$ and the base-emitter voltage $V_{BE2}$ of the bipolar transistor $Q_2$. When feedback by the differential amplifier $A_1$ operates normally, the following equation 2 is satisfied.

$$V_{BE1} = V_T \ln\left(\frac{I_1}{nJ_sA}\right), \; V_{BE2} = V_T \ln\left(\frac{I_2}{J_sA}\right) \quad (1)$$

$$R_{12}I_2 + V_{BE1} = V_{BE2} \quad (2)$$

When the equations 1 are substituted for the equation 2, the following equation 3 is satisfied.

$$I_2 = \frac{V_{BE2} - V_{BE1}}{R_{12}} = \frac{V_T \ln\left(\frac{I_2}{J_sA}\right) - V_T \ln\left(\frac{I_1}{nJ_sA}\right)}{R_{12}} = \frac{V_T \ln\left(\frac{I_2}{I_1}n\right)}{R_{12}} \quad (3)$$

The following equation 4 is satisfied from the Kirchhoff's voltage law from the node of the potential $V_3$ to the input terminal of the differential amplifier $A_1$. When the equation 4 is organized, the following equation 5 as the relation of the currents $I_1$ and $I_2$ is satisfied. When the current $I_2$ is erased from the equations 3 and 5, the equation can be approximated as the following equation 6. $V_{OS}$ denotes input offset voltage of the differential amplifier $A_1$. In the equation 6, it is assumed that $V_{OS}/I_1 \cdot R_{12} \ll 1$ is satisfied.

$$V_3 - R_{12}I_1 + V_{OS} = V_3 - R_{12}I_2 \quad (4)$$

$$I_2 = I_1 - \frac{V_{OS}}{R_{12}} \quad (5)$$

$$I_1 - \frac{V_{OS}}{R_{12}} = \frac{V_T \ln\left(\frac{I_2}{I_1}n\right)}{R_{12}} = \quad (6)$$

$$\frac{V_T \ln\left(\frac{I_1 - \frac{V_{OS}}{R_{12}}}{I_1}n\right)}{R_{12}} = \frac{V_T \ln\left\{\left(1 - \frac{V_{OS}}{I_1 R_{12}}\right)n\right\}}{R_{12}} \approx \frac{V_T}{R_{12}}\left\{\ln(n) - \frac{V_{OS}}{I_1 R_{12}}\right\}$$

By solving a quadratic equation on $I_1$ in the equation 6, I1 is expressed as the following equation 7A. D in the equation 7A is expressed as the following equation 7B.

$$I_1 = \frac{\sqrt{D} + V_T \ln(n) + V_{OS}}{2R_{12}} \quad (7A)$$

$$D = (V_T \ln(n))^2 + (2\ln(n) - 4)V_{OS}V_T + V_{OS}^2 \quad (7B)$$

Therefore, the output voltage $V_{BGR}$ can be expressed by the following equation 8. As obvious from the equation, by the relation $R_4 < R_3$, the output voltage $V_{BGR}$ can be lowered (about 1.0V or less).

$$V_{BGR} = R_4 I = R_4\left(\frac{V_{BE2}}{R_3} + I_1 + I_2\right) = R_4\left(\frac{V_{BE2}}{R_3} + 2I_1 - \frac{V_{OS}}{R_{12}}\right) = \quad (8)$$

$$R_4\left(\frac{V_{BE2}}{R_3} + 2\frac{\sqrt{D} + V_T \ln(n) + V_{OS}}{2R_{12}} - \frac{V_{OS}}{R_{12}}\right)$$

When the error $\Delta V_{BGR}$ of the output voltage $V_{BGR}$ from $V_{OS}=0$ is obtained on the basis of the equation 8, the value of the BGR core circuit 10 of the embodiment can be made extremely small as compared with that of the BGR core circuits described in the non-patent literature 1 and the patent literature 1.

It is understood that the output voltage $V_{BGR}$ of the BGR core circuit 10 of the embodiment is 1.0V or less, and the operation can be performed from about 1.0V as the power supply voltage Vcc. It is easily understood also from the equation 8. That is, the BGR core circuit 10 of the embodiment cancels the coefficient proportional to the temperature by adding a current ($I_{R3}=V_{BE2}/R_3$) according to $V_{BE}$ of the bipolar transistor $Q_2$ flowing in the resistor $R_3$ and a PTAT (Proportional to Absolute Temperature) current ($I=I_1+I_2$) proportional to the absolute temperature. The resistor $R_4$ converts the current obtained by the addition to voltage and outputs the voltage. Therefore, by adjusting the proportion between the resistors $R_3$ and $R_4$, the low output voltage $V_{BGR}$ which is 1.0 V or less can be output.

As described above, in the BGR core circuit 10, by adjusting the ratio between the resistors $R_3$ and $R_4$, the lower output voltage $V_{BGR}$ can be generated and the operation at lower power supply voltage Vcc can be realized. Further, as illustrated in FIG. 7, by inserting the resistor $R_5$ between the emitter terminals of the bipolar transistors $Q_1$ and $Q_2$ and the ground node, the common input voltage of the differential amplifier $A_1$ can be shifted to be higher, so that the designing is facilitated.

(II) Correction Circuit 20

First, the temperature dependency of the base-emitter voltage $V_{BE}$ of the bipolar transistor will be described. When the temperature dependency of the collector current $I_C$ is expressed by the following equation 9 as described in the non-patent literature 2, the temperature dependency of the base-emitter voltage is expressed as the following equation 10.

$$I_C \propto T^m \qquad (9)$$

$$V_{BE}(T) = V_{G0}\left(1 - \frac{T}{T_R}\right) + \frac{T}{T_R}V_{BE}(T_R) - (\eta - m)\frac{kT}{q}\ln\left(\frac{T}{T_R}\right) \qquad (10)$$

In the equation, $T_R$ denotes reference temperature. $\eta$ denotes a constant which depends on the device structure of the bipolar transistor and its value is about 3.6 to 4.0. $V_{G0}$ denotes an extrapolation value to the absolute temperature 0K of the band gap voltage. As described above, "m" becomes "1" when the collector current $I_C$ is proportional to the absolute temperature. The equation 10 is deformed to the following equation 11.

$$V_{BE}(T) = \left\{V_{G0} + (\eta - m)\frac{kT_R}{q}\right\} - \qquad (11)$$

$$\frac{V_{G0} + (\eta - m)\frac{kT_R}{q} - V_{BE}(T_R)}{T_R}T + (\eta - m)\frac{k}{q}\left\{T - T_R - T\ln\left(\frac{T}{T_R}\right)\right\}$$

In the equation 11, the first term is a constant which does not depend on temperature, and the second term is proportional to the absolute temperature. The third term is not proportional to the absolute temperature and expresses non-linear dependency. That is, the base-emitter voltage $V_{BE}$ expresses non-linear dependency to temperature.

A general formula (equation 8) of the BGR core circuit illustrated in "(1) BGR core circuit 10" can be expressed by the following equation 12 when constants determined by the resistance ratio are set as K and L $\Delta V_{BE}$ denotes the difference voltage of the base-emitter voltages $V_{BE}$ of the two bipolar transistors $Q_1$ and $Q_2$.

$$V_{BGR} = LV_{BE} + K\Delta V_{BE} = LV_{BE} + K'V_T = LV_{BE} + K'\frac{kT}{q} < 1.2V \qquad (12)$$

As understood also from the equation 12, the temperature dependency of the base-emitter voltage $V_{BE}$ in the first term has non-linearity. It is impossible in theory to correct the non-linear temperature dependency only by the second term which is proportional to the absolute temperature. In the voltage generation circuit 1 of the embodiment, therefore, the non-linear temperature dependency of the output voltage $V_{BGR}$ is corrected by the following method.

In FIG. 7, the potential at the coupling node of the resistor $R_5$ and the emitter terminals of the bipolar transistors $Q_1$ and $Q_2$ is set to $V_2$, and the correction current is set as Icomp. For easier understanding, it is assumed that $R_1=R_2=R_{12}$, and $I_1=I_2=I_{PTAT}$. $I_{PTAT}$ can be expressed by the following equation 13 from $V_{BE2}=V_{BE1}+R_{12} \cdot I_{PTAT}$.

$$I_{PTAT} = \frac{V_{BE2} - V_{BE1}}{R_{12}} = \frac{\Delta V_{BE}}{R_{12}} = V_T\frac{\ln(n)}{R_{12}} \propto T \qquad (13)$$

The current I is expressed by the following equation 14 from the Kirchhoff's current law, and the current $I_{R3}$ flowing in the resistor $R_2$ is expressed as the following equation 15, so that the current I is expressed by the following equation 16.

$$I = 2I_{PTAT} + I_{R3} \qquad (14)$$

$$I_{R3} = \frac{V_{BE2} + V_2}{R_3} = \frac{V_{BE2} + (2I_{PTAT} + I_{comp})R_5}{R_3} \qquad (15)$$

$$I = 2I_{PTAT} + \frac{V_{BE2} + (2I_{PTAT} + I_{comp})R_5}{R_3} \qquad (16)$$

Therefore, the output voltage $V_{BGR}$ is expressed by the following equation 17.

$$V_{BGR} = R_4I = R_4\left\{2I_{PTAT} + \frac{V_{BE2} + (2I_{PTAT} + I_{comp})R_5}{R_3}\right\} = \qquad (17)$$

$$R_4\left\{\frac{V_{BE2}}{R_3} + \left(2 + \frac{2R_5}{R_3}\right)I_{PTAT} + \frac{I_{comp}R_5}{R_3}\right\}$$

Like by the BGR core circuit 10 of FIG. 3, the output voltage $V_{BGR}$ can be lowered by adjusting the resistors $R_3$ and $R_4$.

When the mirror ratio of the PMOS transistors MP3 and MP4 is set to 1:1, the correction current Icomp can be expressed by the following equation 18.

$$I_{comp} = \frac{V_{BGR} - V_{BE3}}{R_6} \qquad (18)$$

As expressed by the equation 18, the correction current Icomp is generated on the basis of the difference voltage between the output voltage $V_{BGRC}$ and the base-emitter voltage $V_{BE3}$ of the bipolar transistor $Q_3$. Since $V_{BGRC}$ is smaller than $V_{BE3}$ on the low-temperature side, the correction current Icomp does not flow. On the high-temperature side, the correction current Icomp is added from the temperature at which $V_{BGRC}$ becomes equal to $V_{BE3}$. Consequently, the correction current Icomp is expressed by the following equation 19.

$$I_{comp} \begin{cases} 0 & (V_{BGR} < V_{BE3}) \\ \dfrac{V_{BGR} - V_{BE3}}{R_6} & (V_{BGR} \geq V_{BE3}) \end{cases} \quad (19)$$

Therefore, in the voltage generation circuit 1, the nonlinearity of the base-emitter voltage $V_{BE}$ (corresponding to $V_{BE}$ in FIG. 2A) of the first term of the equation 17 is subjected to linear correction with $I_{PTAT}$ (corresponding to Icomp in FIG. 2E) of the second term and is also subjected to nonlinear correction with the correction current Icomp (corresponding to Icomp in FIG. 2E) of the third term. By generating the correction current Icomp in accordance with the difference between two voltages having temperature dependency (the output voltage $V_{BGRC}$ and the base-emitter voltage $V_{BE3}$, corresponding to $V_{BGRC}$ and $V_{BE}$ in FIG. 2D), the correction current Icomp is added from the temperature at which $V_{BGRC}=V_{BE3}$). The tilt of the correction current Icomp can be controlled by the value of the resistor $R_6$. Consequently, by adjusting the characteristic of $V_{BGR}$ so as to satisfy the relation $V_{BGR} \geq V_{BE3}$ within a desired temperature range to correct the temperature characteristic, the nonlinear temperature characteristic can be corrected.

The above-described calculation is approximation calculation. In practice, a loop is formed between the BGR core circuit 10 and the correction circuit 20 and feedback is performed. Therefore, slight deviations from the above calculation occur in the values of the resistance, the correction current Icomp, and the like. Accurate values can be obtained by simulation. In the example, since the power supply voltage Vcc is about 1.0V and the case where the output voltage $V_{BGR}$ is set to about 0.63V is assumed, the number of stage of the bipolar transistor $Q_3$ in the correction circuit 20 is one. In the case where the output voltage is about 1.2V, it is desirable to set the number of stages of the bipolar transistor $Q_3$ in the correction circuit 20 to two.

Whether the correction circuit 20 is used or not can be controlled by a control signal (powerdown signal). As an example, there is a following method. The PMOS transistor MP6 has the source terminal to which the power supply node Vcc is coupled and has the drain terminal to which the gate terminal of the PMOS transistor MP3 is coupled. To the power supply switch (not illustrated) of the differential amplifier A$_2$ and the gate terminal of the PMOS transistor MP6, a power-down signal PD and its inversion signal PD_N are supplied, respectively. The power-down signal PD is a control signal for decreasing the power of the correction circuit 20 when it is at the high level. That is, in the case where the correction circuit 20 is not used, the power-down signal PD is set to the high level. In this case, the power supply switch of the differential amplifier A$_2$ is turned off, power supply to the differential amplifier A$_2$ is stopped, the PMOS transistor MP6 is turned on, and the PMOS transistors MP3 and MP4 are turned off. As a result, the operation of the correction circuit 20 can be stopped. This method can be used also in the following other embodiments.

In the voltage generation circuit 1, by making the resistors $R_1$ to $R_5$ of the BGR core circuit 10 and the resistor $R_6$ variable, the reference voltage $V_{BGR}$ can be adjusted (trimmed) after manufacture of the voltage generation circuit 1. That is, to correct the influence of device variations at the time of manufacture, the resistors $R_1$ to $R_6$ are provided with the function of adjusting resistance values after manufacture.

For example, by providing taps for the resistors and performing switching by semiconductor switches, fuses, or the like, the resistors can be adjusted after manufacture. The place to hold tap switching information may be on the inside or outside of the semiconductor chip. However, the information is held in a nonvolatile manner so as to be rewritable after manufacture like in a fuse or a nonvolatile memory. The characteristics influenced by the device variations in manufacture include the absolute value of an output (reference voltage $V_{BGR}$) and the temperature characteristic. For example, in the circuit of FIG. 7, by adjusting the resistor $R_3$, that is, by changing the size of the resistor $R_3$ after manufacture of the BGR core circuit 10, the temperature characteristic of an output (reference voltage $V_{BGR}$) can be improved. It can be also similarly improved by changing the size of the resistors $R_1=R_2=R_{12}$. By adjusting the resistor $R_4$, the absolute value of an output (reference voltage $V_{BGR}$) can be improved. By adjusting the resistors $R_5$ and $R_6$, the non-linear effect of an output (reference voltage $V_{BGR}$) can be improved. Those are obvious also from the equations 17, 19, and the like. As the resistors $R_1$ to $R_6$, it is preferable to use resistors of the same device kind (for example, resistors using polysilicon). This method can be also used in the following other embodiments.

Modification

Next, a modification of a concrete circuit configuration of the voltage generation circuit 1 of the first embodiment will be described.

Figure 8:
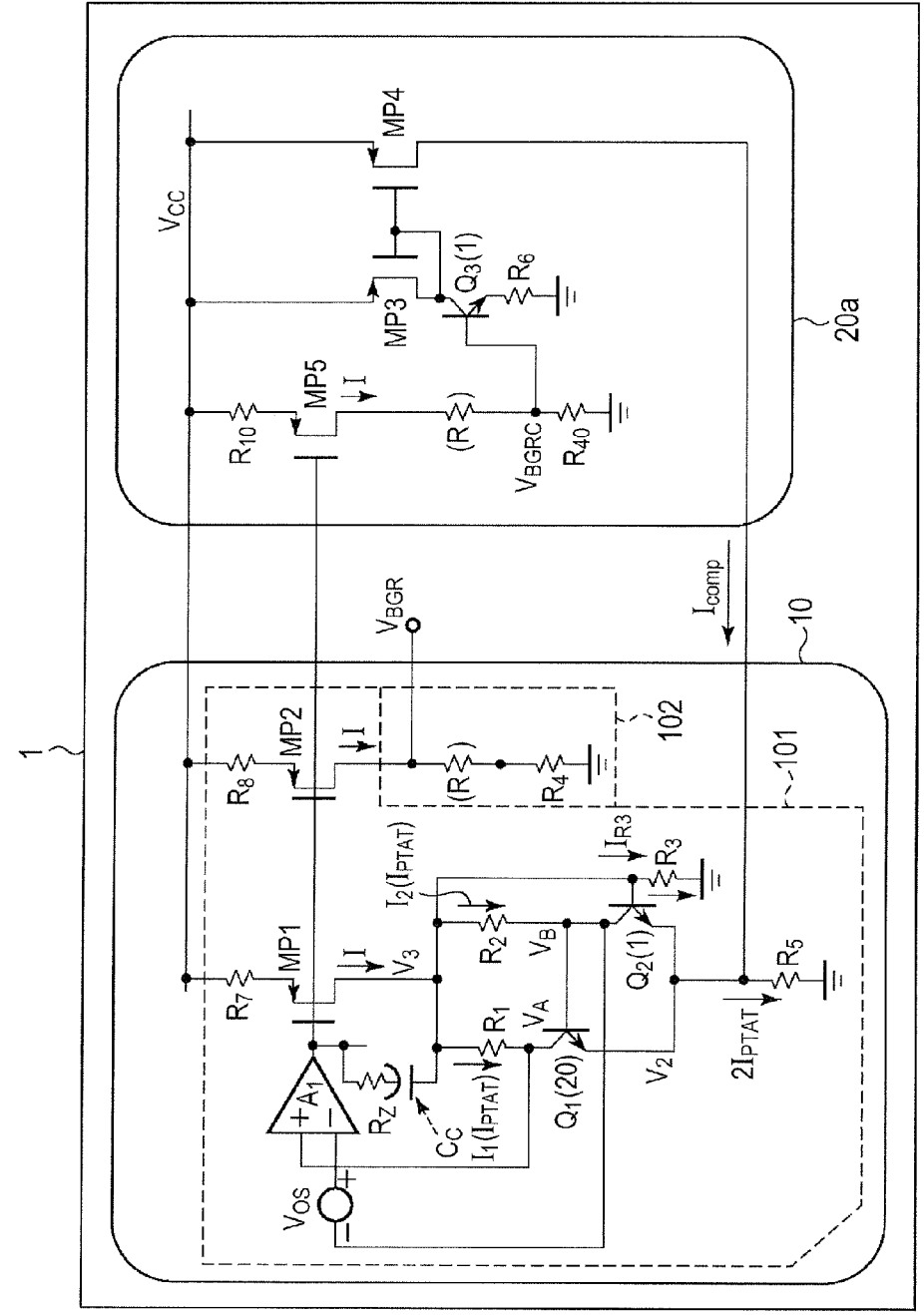
FIG. 8 is a circuit diagram illustrating a modification of the concrete circuit configuration of the voltage generation circuit according to the first embodiment.

FIG. 8 is a circuit diagram illustrating a modification of the concrete circuit configuration of the voltage generation circuit 1 according to the first embodiment. The voltage generation circuit 1 of FIG. 8 is different from the voltage generation circuit 1 of FIG. 7 with respect to the point that the differential amplifier A$_2$ is not used in a correction circuit 20a. In the following, the point different from the voltage, generation circuit 1 of FIG. 7 will be mainly described.

In this case, the BGR core circuit 10 supplies the current I, not the reference voltage $V_{BGR}$ to the correction circuit 20a. The current I is the sum of $I_1(I_{PTAT})+I_2(I_{PTAT})$ and $I_{R3}$ like in the case of FIG. 7 and is the current flowing in the PMOS transistor MP2.

The correction circuit 20a generates the correction current Icomp by subtracting the base-emitter voltage $V_{BE3}$ of the bipolar transistor $Q_3$ from the voltage $V_{BGRC}$ corresponding to the reference voltage $V_{BGR}$ generated from the current I, and makes the correction current Icomp fed back to the current generation unit 101.

The correction circuit 20a has, for example, the bipolar transistor $Q_3$, resistors $R_6$, $R_{10}$, and $R_{40}$, and the P-channel-type MOS transistors MP3 and MP4. The P-channel-type MOS transistor MP6 illustrated in FIG. 7 is not illustrated here.

The PMOS transistor MP5 has the gate terminal to which the gate terminal of the PMOS transistor MP2 in the BGR core circuit 10 is coupled and has the source terminal to which the power supply node Vcc is coupled via the resistor $R_{10}$. One end of the resistor $R_{40}$ is coupled to the drain of the PMOS transistor MP5 and the other end is coupled to the ground node. The coupling node between the PMOS transistor MP5 and the resistor $R_{40}$ is coupled to the base terminal of the bipolar transistor $Q_3$. The other bipolar transistor $Q_3$, the resistors $R_6$, and the PMOS transistors MP3 and MP4 are similar to those in the case of FIG. 7. In the case of omitting the resistors $R_7$ and $R_8$ in the BGR core circuit, the resistor $R_{10}$ is also omitted.

A current mirror circuit is comprised of the PMOS transistor MP5, and the PMOS transistor MP2 in the BGR core circuit 10. Therefore, the current I flowing in the PMOS transistor MP2 flows also in the PMOS transistor MP5. As a result, the voltage $V_{BGRC}$ corresponding to the output voltage $V_{BGR}$ is generated at the connection node between the PMOS transistor MP5 and the resistor $R_{40}$. The reference voltage $V_{BGRC}$ is supplied to the base terminal of the bipolar transistor $Q_3$. As a result, the correction circuit 20a of FIG. 8 can perform operations similar to those of the correction circuit 20 of FIG. 7.

In the embodiment, also in the case of the voltage generation circuit 1 of FIG. 8, effects similar to those of the case of the voltage generation circuit 1 of FIG. 7 can be obtained. In addition, the correction circuit 20a of FIG. 8 does not use the differential amplifier $A_2$ unlike the correction circuit 20 of FIG. 7. Therefore, the circuit area can be reduced as compared with that of the correction circuit 20 of FIG. 7.

Second Embodiment

A semiconductor device according to a second embodiment will be described. In the second embodiment, the case where the correction circuit 20 generates the correction current Icomp on the basis of the reference voltage $V_{BGR}$ (or voltage $V_{BGRC}$) and the base-emitter voltage $V_{BE}$ of the bipolar transistor and corrects the high-temperature side of the reference voltage $V_{BGR}$ with the correction current Icomp will be described. In the embodiment, a plurality of correction circuits 20 are provided. In other words, the embodiment in which the plurality of correction circuits 20 are provided is different from the first embodiment in which the number of the correction circuit 20 is one. In the following, the point different from the first embodiment will be mainly described.

A voltage generation circuit in the second embodiment is the voltage generation circuit as illustrated in FIG. 3 and performs correction on the high-temperature side as illustrated in FIGS. 4A to 4E.

Figure 9:
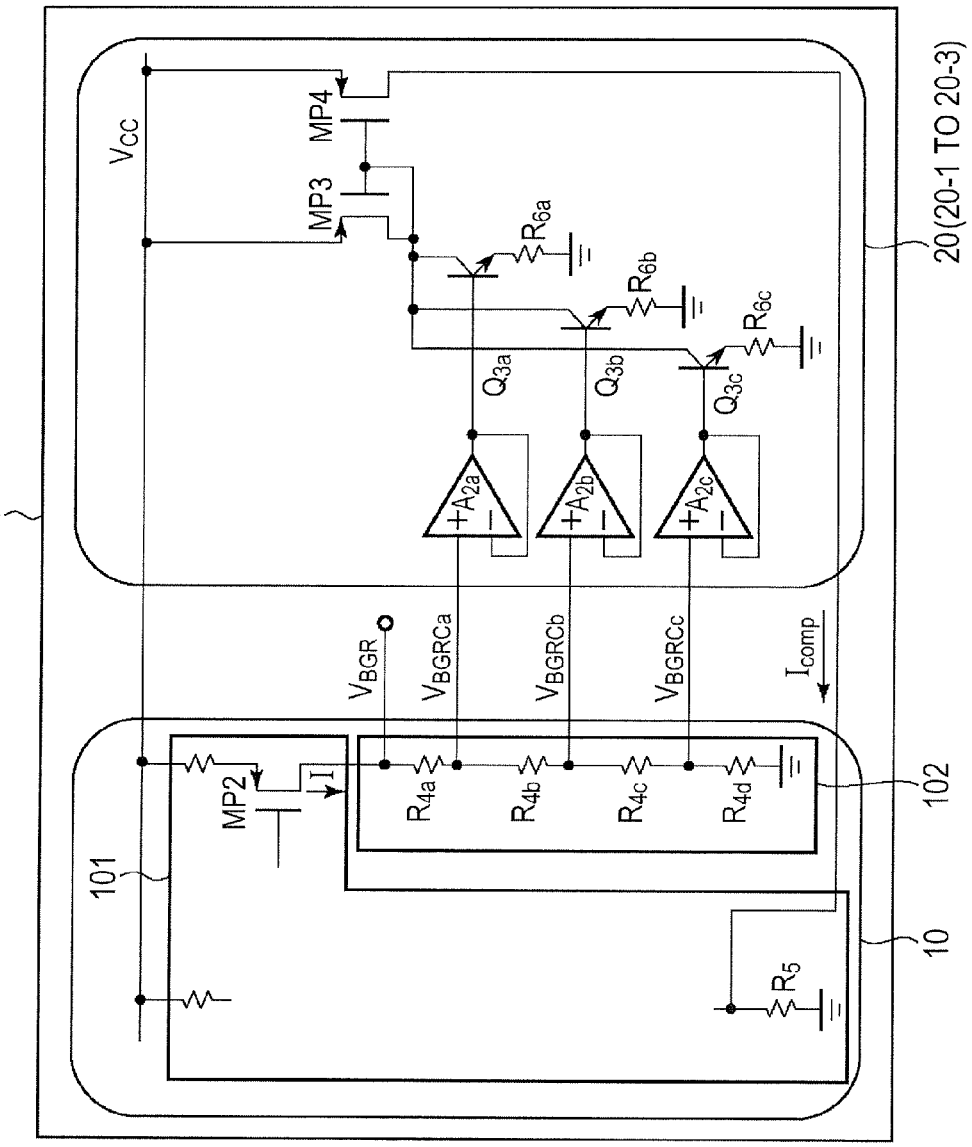
FIG. 9 is a circuit diagram illustrating an example of a concrete circuit configuration of a voltage generation circuit according to a second embodiment.

FIG. 9 is a circuit diagram illustrating an example of the concrete circuit configuration of the voltage generation circuit 1 according to the second embodiment. The voltage generation circuit 1 is different from the voltage generation circuit 1 of FIG. 7 with respect to the point that the number of the correction circuits 20 is plural, for example, three. In the example of the diagram, three correction circuits 20 do not exist independently of one another but are regarded as three from the view point of substantive functions of the circuits. The three correction circuits 20 may exist independently of one another. In the following, the point different from the voltage generation circuit 1 of FIG. 7 will be mainly described.

The output unit 102 of the BGR core circuit 10 has four resistors $R_{4a}$, $R_{4b}$, $R_{4c}$, and $R_{4d}$. The resistors $R_{4a}$, $R_{4b}$, $R_{4c}$, and $R_{4d}$ are coupled in series in this order between the drain terminal of the PMOS transistor MP2 and the ground node. The voltage at the connection node between the drain terminal of the P-channel-type MOS transistor MP2 and the resistor $R_{4a}$ serves as the reference voltage $V_{BGR}$. The reference voltage $V_{BGR}$ is divided by the resistors $R_{4a}$, $R_{4b}$, $R_{4c}$, and $R_{4d}$. As a result, the voltage at the connection node between the resistors $R_{4a}$ and $R_{4b}$ is output as a voltage $V_{BGRCa}$ to the correction circuit 20. Similarly, the voltage at the connection node between the resistors $R_{4b}$ and $R_{4c}$ is output as a voltage $V_{BGRCb}$ to the correction circuit 20. Further, the voltage at the connection node between the resistors $R_{4c}$ and $R_{4d}$ is output as a voltage $V_{BGRCc}$ to the correction circuit 20. The relation the reference voltage $V_{BGR}$>voltage $V_{BGRCa}$>voltage $V_{BGRCb}$>voltage $V_{BGRCc}$ is satisfied. It can be said that the voltages $V_{BGRCa}$, $V_{BGRCb}$, and $V_{BGRCc}$ are the voltages $V_{BGRC}$ corresponding to the voltage $V_{BGR}$.

The correction circuit 20 has, for example, differential amplifiers $A_{2a}$, $A_{2b}$ and $A_{2c}$, bipolar transistors $Q_{3a}$, $Q_{3b}$, and $Q_{3c}$, resistors $R_{6a}$, $R_{6b}$, and $R_{6c}$, and the P-channel-type MOS transistors MP3 and MP4. In the correction circuit 20, a correction circuit 20-1 is comprised of the differential amplifier $A_{2a}$, the bipolar transistor $Q_{3a}$, the resistor $R_{6a}$, and the P-channel-type MOS transistors MP3 and MP4. Similarly, another correction circuit 20-2 is comprised of the differential amplifier $A_{2b}$, the bipolar transistor $Q_{3b}$, the resistor $R_{6b}$, and the P-channel-type MOS transistors MP3 and MP4. Further another correction circuit 20-3 is comprised of the differential amplifier $A_{2c}$, the bipolar transistor $Q_{3c}$, the resistor $R_{6c}$, and the P-channel-type MOS transistors MP3 and MP4. Therefore, the PMOS transistors MP3 and MP4 configuring the current mirror circuit are commonly used by the three correction circuits 20-1 to 20-3. In the diagram, the P-channel-type MOS transistor MP6 illustrated in FIG. 7 is not illustrated.

In the correction circuit 20-1, the differential amplifier $A_{2a}$ receives the output voltage $V_{BGRCa}$ of the BGR core circuit 10 and configures as a voltage follower. The bipolar transistor $Q_{3a}$ has the base terminal to which the output terminal of the differential amplifier $A_{2a}$ is coupled and having the collector terminal to which the drain terminal of the PMOS transistor MP3 is coupled. The resistor $R_{6a}$ is provided between the emitter terminal of the bipolar transistor $Q_{3a}$ and the ground node. The correction circuit 20-1 generates a correction current Icomp1 corresponding to a voltage obtained by subtracting the base-emitter voltage $V_{BE3a}$ of the bipolar transistor $Q_{3a}$ from the voltage $V_{BGRCa}$. The threshold temperature at this time is $T_{ea}$ in FIG. 4A.

Similarly, in the correction circuit 20-2, the differential amplifier $A_{2b}$ receives the output voltage $V_{BGRCb}$ of the BGR core circuit 10 and configures as a voltage follower. The bipolar transistor $Q_{3b}$ has the base terminal to which the output terminal of the differential amplifier $A_{2b}$ is coupled and having the collector terminal to which the drain terminal of the PMOS transistor MP3 is coupled. The resistor $R_{6b}$ is provided between the emitter terminal of the bipolar transistor $Q_{3b}$ and the ground node. The correction circuit 20-2 generates a correction current Icomp2 corresponding to a voltage obtained by subtracting the base-emitter voltage $V_{BE3b}$ of the bipolar transistor $Q_{3b}$ from the voltage $V_{BGRCb}$. The threshold temperature at this time is $T_{2b}$ in FIG. 4B.

Similarly, in the correction circuit 20-3, the differential amplifier $A_{2c}$ receives the output voltage $V_{BGRCc}$ of the BGR core circuit 10 and configures as a voltage follower. The bipolar transistor $Q_{3c}$ has the base terminal to which the output terminal of the differential amplifier $A_{2c}$ is coupled and having the collector terminal to which the drain terminal of the PMOS transistor MP3 is coupled. The resistor $R_{6c}$ is provided between the emitter terminal of the bipolar transistor $Q_{3c}$ and the ground node. The correction circuit 20-3 generates a correction current Icomp3 corresponding to a voltage obtained by subtracting the base-emitter voltage $V_{BE3c}$ of the bipolar transistor $Q_{3c}$ from the voltage $V_{BGRCc}$. The threshold temperature at this time is $T_{2c}$ in FIG. 4C.

The PMOS transistors MP3 and MP4 are similar to those in the case of FIG. 7. The PMOS transistors MP3 and MP4 configure a current mirror circuit which outputs current flowing on the collector side of the bipolar transistor $Q_3$ ($Q_{3a}$, $Q_{3b}$, and $Q_{3c}$) as the correction current Icomp from the PMOS transistor MP4. The PMOS transistors MP3 and MP4 are commonly used by the three correction circuits 20-1 to 20-3. Consequently, the correction current Icomp output from the PMOS transistor MP4 is total of the correction currents Icomp1, Icomp2, and Icomp3.

In this case, as a method of changing the threshold temperature $T_2$ ($T_{2a}$, $T_{2b}$, and $T_{2c}$) in each correction circuit 20, for example, there is a method of changing the values of the resistors $R_{4a}$, $R_{4b}$, $R_{4c}$, and $R_{4d}$. Accordingly, the voltages $V_{BGRCa}$, $V_{BGRCb}$, and $V_{BGRCc}$ are changed, so that crossing points with the voltage $V_{BE3}$ are changed (refer to FIG. 2D). As a result, the threshold temperatures $T_{2a}$, $T_{2b}$, and $T_{2c}$ are changed. On the other hand, as a method of changing the temperature dependency (the tilt of the graphs in FIGS. 4A, 4B, and 4C) of increase/decrease of the correction current Icomp, there is a method of changing the size of the resistors $R_{6a}$, $R_{6b}$, and $R_{6c}$. The larger the resistors are, the smaller the tilt becomes.

The other configuration, operation and principle of the BGR core circuit 10 and the correction circuit 20 are similar to those in the case of FIG. 7.

Also in the embodiment, effects similar to those of the voltage generation circuit 1 of FIG. 7 can be obtained. In addition, in this case, by increasing the correction circuit 20, the effects described with reference to FIGS. 4A to 4E can be obtained.

Modification 1

A modification of the concrete circuit configuration of the voltage generation circuit 1 according to the second embodiment will now be described.

Figure 10:
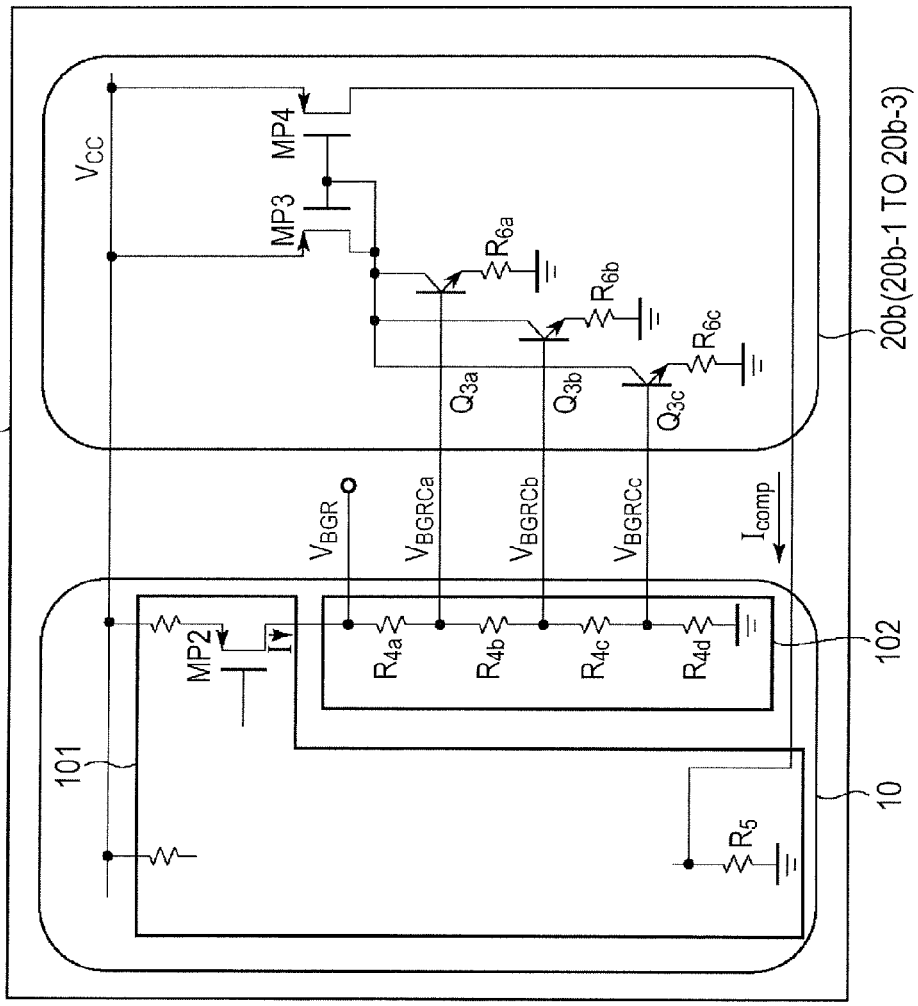
FIG. 10 is a circuit diagram illustrating a modification of the concrete circuit configuration of the voltage generation circuit according to the second embodiment.

FIG. 10 is a circuit diagram illustrating a modification of the concrete circuit configuration of the voltage generation circuit 1 according to the second embodiment. The voltage generation circuit 1 of FIG. 10 is different from the voltage generation circuit 1 of FIG. 9 with respect to the point that the differential amplifiers $A_{2a}$ to $A_{2c}$ are not used in correction circuits 20b (20b-1 to 20b-3). In the following, the point different from the voltage generation circuit 1 of FIG. 9 will be mainly described.

The differential amplifiers $A_{2a}$ to $A_{2c}$ are provided to supply base current of the bipolar transistors $Q_{3a}$ to $Q_{3c}$. They may be omitted in the case where the influence on the reference voltage $V_{BGR}$ of direct supply of the base current from the PMOS transistor MP2 can be ignored.

In the embodiment, also in the case of the voltage generation circuit 1 of FIG. 10, effects similar to those of the case of the voltage generation circuit 1 of FIG. 9 can be obtained. In addition, different from the correction circuit 20 of FIG. 9, the correction circuits 20b of FIG. 10 do not use the differential amplifiers $A_{2a}$ to $A_{2c}$. Therefore, as compared with the correction circuit 20 of FIG. 9, the circuit area can be reduced.

Modification 2

Further, a modification of the concrete circuit configuration of the voltage generation circuit 1 according to the second embodiment will be described.

Figure 11:
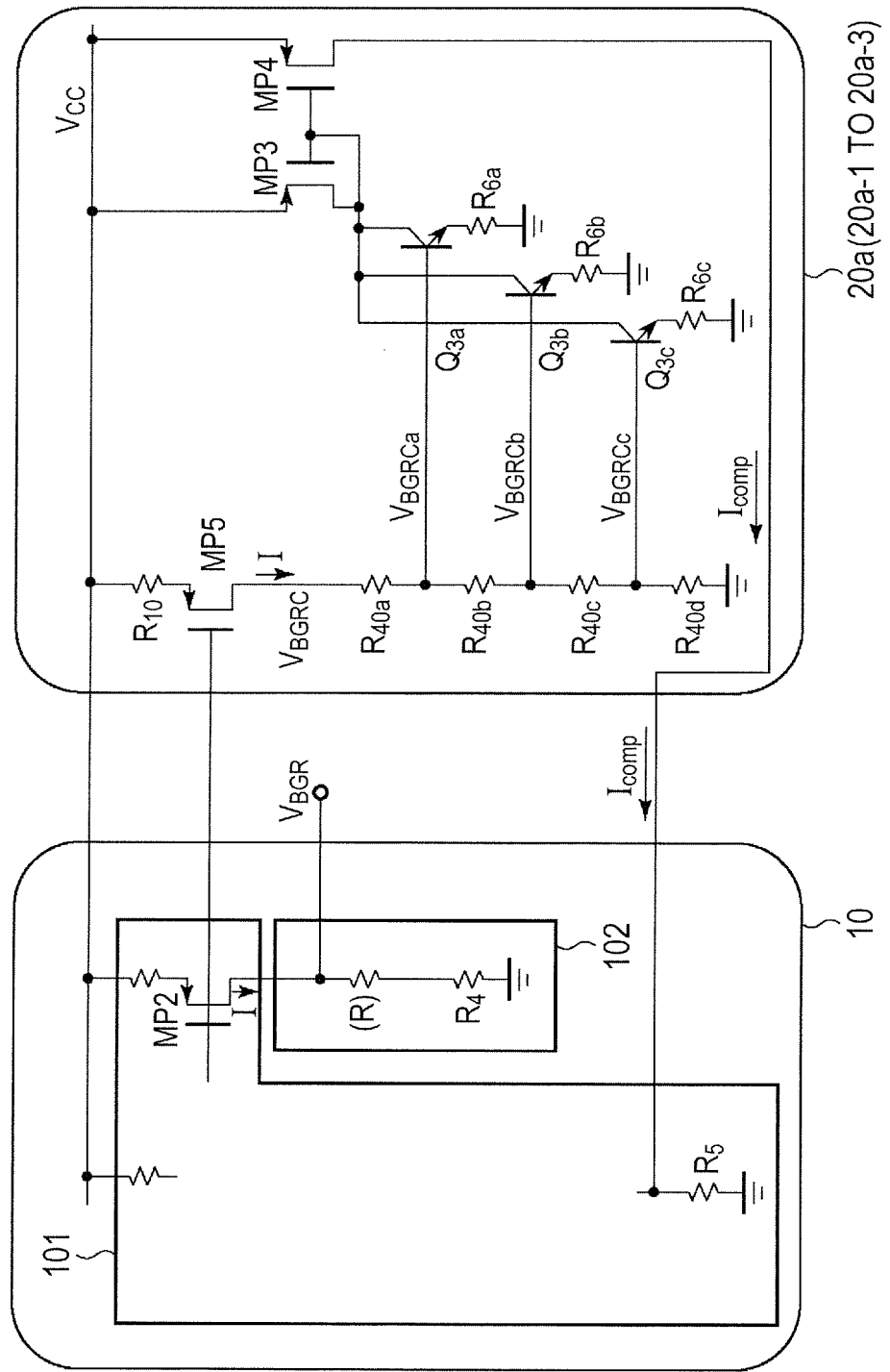
FIG. 11 is a circuit diagram illustrating a modification of the concrete circuit configuration of the voltage generation circuit according to the second embodiment.

FIG. 11 is a circuit diagram illustrating a modification of the concrete circuit configuration of the voltage generation circuit 1 according to the second embodiment. The voltage generation circuit 1 of FIG. 11 is different from the voltage generation circuit 1 of FIG. 10 with respect to the point that the BGR core circuit 10 does not have the resistors $R_{4a}$ to $R_{4d}$ which divide the reference voltage $V_{BGR}$ but the correction circuit 20a has resistors $R_{40a}$ to $R_{40d}$ having the same function. In the following, the point different from the voltage generation circuit 1 of FIG. 10 will be mainly described.

In this case, the BGR core circuit 10 supplies the current I, not the reference voltage $V_{BGR}$, to the correction circuit 20a. The current I is the sum of $I_1(I_{PTAT})+I_2(I_{PTAT})$ and $I_{R3}$ like in the case of FIG. 9 and is the current flowing in the PMOS transistor MP2. The resistors $R_{4a}$, $R_{4b}$, $R_{4c}$, and $R_{4d}$ for dividing the reference voltage $V_{BGR}$ are not provided.

The correction circuit 20a generates the correction current Icomp by subtracting the base-emitter voltage $V_{BE3}$ of the bipolar transistor $Q_3$ from the voltage $V_{BGRC}$ corresponding to the reference voltage $V_{BGR}$ generated from the current I, and makes the correction current Icomp fed back to the current generation unit 101.

The correction circuit 20a has, for example, the bipolar transistors $Q_{3a}$, $Q_{3b}$, and $Q_{3c}$, resistors $R_{6a}$, $R_{6b}$, $R_{6c}$, $R_{10}$, $R_{40a}$, $R_{40b}$, $R_{40c}$, and $R_{40d}$ and the P-channel-type MOS transistors MP3, MP4, and MP5. In the correction circuit 20a, a correction circuit 20a-1 is comprised of the bipolar transistor $Q_{3a}$, the resistor $R_{6a}$, $R_{10}$, $R_{40a}$, $R_{40b}$, $R_{40c}$, and $R_{40d}$, and the P-channel-type MOS transistors MP3, MP4, and MP5. Similarly, another correction circuit 20a-2 is comprised of the bipolar transistor $Q_{3b}$, the resistor $R_{6b}$, $R_{10}$, $R_{40a}$, $R_{40b}$, $R_{40c}$, and $R_{40d}$, and the P-channel-type MOS transistors MP3, MP4, and MP5. Further another correction circuit 20a-3 is comprised of the bipolar transistor $Q_{3c}$, the resistor $R_{6c}$, $R_{10}$, $R_{40a}$, $R_{40b}$, $R_{40c}$, and $R_{40d}$, and the P-channel-type MOS transistors MP3, MP4, and MP5. Therefore, the resistors $R_{10}$, $R_{40a}$, $R_{40b}$, $R_{40c}$, and $R_{40d}$ and the P-channel-type MOS transistor MP5 configuring the current mirror circuit and the PMOS transistors MP3 and MP4 configuring another current mirror circuit are commonly used by the three correction circuits 20a-1 to 20a-3. In the diagram, the P-channel-type MOS transistor MP6 illustrated in FIG. 7 is not illustrated. The resistor $R_{40a}$ may be omitted.

The PMOS transistor MP5 has the gate terminal to which the gate terminal of the PMOS transistor MP2 in the BGR core circuit 10 is coupled and has the source terminal to which the power supply node Vcc is coupled via the resistor $R_{10}$. The resistors $R_{40a}$, $R_{40b}$, $R_{40c}$, and $R_{40d}$ are coupled in series in this order between the drain terminal of the PMOS transistor MP5 and the ground node. The voltage at the connection node between the drain terminal of the PMOS transistor MP5 and the resistor $R_{40a}$ is equal to the reference voltage $V_{BGRC}$ (in this case, which is equal to $V_{BGR}$). The voltage $V_{BGRC}$ is divided by the resistors $R_{40a}$, $R_{40b}$, $R_{40c}$, and $R_{40d}$. As a result, the voltage at the connection node between the resistors $R_{40a}$ and $R_{40b}$ is output as the voltage $V_{BGRCa}$ to the base terminal of the bipolar transistor $Q_{3a}$. Similarly, the voltage at the connection node between the resistors $R_{40b}$ and $R_{40c}$ is output as the voltage $V_{BGRCb}$ to the base terminal of the bipolar transistor $Q_{3b}$. Further, the voltage at the connection node between the resistors $R_{40c}$ and $R_{40d}$ is output as the voltage $V_{BGRCc}$ to the base terminal of the bipolar transistor $Q_{3c}$. The relation the reference voltage $V_{BGR}$>voltage $V_{BGRCa}$>voltage $V_{BGRCb}$>voltage $V_{BGRCc}$ is satisfied. It can be said that the voltages $V_{BGRCa}$, $V_{BGRCb}$, and $V_{BGRCc}$ are the voltages $V_{BGRC}$ corresponding to the voltage $V_{BGR}$. The relations among the bipolar transistors $Q_{3a}$, $Q_{3b}$, and $Q_{3c}$, the resistors $R_{6a}$, $R_{6b}$, and $R_{6c}$, and the P-channel-type MOS transistors MP3 and MP4 are similar to those in the case of FIG. 10.

A current mirror circuit is comprised of the PMOS transistor MP5, and the PMOS transistor MP2 in the BGR core circuit 10. Therefore, the current I flowing in the PMOS transistor MP2 flows also in the PMOS transistor MP5. As a result, the voltage $V_{BGRC}$ (=voltage $V_{BGR}$) is generated at the connection node between the PMOS transistor MP5 and the resistor $R_{40a}$. The reference voltage $V_{BGRC}$ is divided by the resistors $R_{40a}$, $R_{40b}$, $R_{40c}$, and $R_{40d}$ and supplied as the voltages $V_{BGRCa}$, $V_{BGRCb}$, and $V_{BGRCc}$ to the base terminals of the bipolar transistor $Q_{3a}$, $Q_{3b}$, and $Q_{3c}$. As a result, the correction circuits 20a-1 to 20a-3 of FIG. 11 can perform operations similar to those of the correction circuits 20a-1 to 20a-3 of FIG. 10.

In this case, as a method of changing the threshold temperature $T_2$ ($T_{2a}$, $T_{2b}$, and $T_{2c}$) in each correction circuit 20, for example, there is a method of changing the values of the resistors $R_{40a}$, $R_{40b}$, $R_{40c}$, and $R_{40d}$. Accordingly, the voltages $V_{BGRCa}$, $V_{BGRCb}$, and $V_{BGRCc}$ are changed, so that crossing points with the voltage $V_{BE3}$ are changed (refer to FIG. 2D). As a result, the threshold temperatures $T_{2a}$, $T_{2b}$, and $T_{2c}$ are changed. On the other hand, as a method of changing the temperature dependency (the tilt of the graphs in FIGS. 4A, 4B, and 4C) of increase/decrease of the correction current Icomp, there is a method of changing the size of the resistors $R_{6a}$, $R_{6b}$, and $R_{6c}$. The larger the resistors are, the smaller the tilt becomes.

The other configuration, operation and principle of the BGR core circuit 10 and the correction circuit 20a are similar to those in the case of FIG. 9.

In the embodiment, also in the case of the voltage generation circuit 1 of FIG. 11, effects similar to those of the voltage generation circuit 1 of FIG. 10 can be obtained. In addition, different from the BGR core circuit 10 of FIG. 10, the BGR core circuit 10 of FIG. 11 does not use the resistor $R_4$ for voltage division. Therefore, the wiring on the BGR core circuit 10 side can be simplified.

In the embodiment, whether the correction circuit 20 is used or not can be controlled by the control signal (power-down signal) described in the first embodiment. As an example, it can be executed by supplying the power-down signal PD to the gate terminal of the PMOS transistor MP6. That is, the voltage generation circuit 1 in each of the embodiments can selectively turn on/off a desired correction circuit 20 in the plurality of correction circuits 20 by the power-down signal. For example, in the case of ambient environment requiring no consideration of temperature dependency or the case such that the precision of the output voltage $V_{BGR}$ required to the system is not high, all of a part of the plurality of correction circuits 20 can be turned off. On the contrary, in the case of ambient environment requiring consideration of temperature dependency or the case such that the precision of the output voltage $V_{BGR}$ required to the system is extremely high, all of the plurality of correction circuits 20 can be turned on. In other words, in the voltage generation circuit 1 of the embodiment, the graph of the temperature dependency of the output voltage VBGR can be made in a desired curve in advance or afterwards. In such a manner, the power consumed in the correction circuit 20 which is unnecessary can be suppressed, and the power can be saved. This can be also similarly applied to the other following embodiments having the plurality of correction circuits 20.

Third Embodiment

A semiconductor device according to a third embodiment will be described. In the third embodiment, the case where the correction circuit 20 generates the correction current Icomp on the basis of the reference voltage $V_{BGR}$ (or voltage $V_{BGRC}$) and the base-emitter voltage $V_{BE}$ of the bipolar transistor and corrects the low-temperature side of the reference voltage $V_{BGR}$ with the correction current Icomp will be described. In the embodiment, the number of the correction circuit 20 is one. In other words, the embodiment is different from the first embodiment for correcting the high-temperature side of the reference voltage $V_{BGR}$ with respect to the point that the low-temperature side of the reference voltage $V_{BGR}$ is corrected. In the following, the point different from the first embodiment will be mainly described.

The voltage generation circuit of the embodiment is a voltage generation circuit as illustrated in FIG. 1 and performs correction on the low-temperature side as illustrated in FIGS. 5A to 5E (the number of the correction circuit 20 is one).

Figure 12:
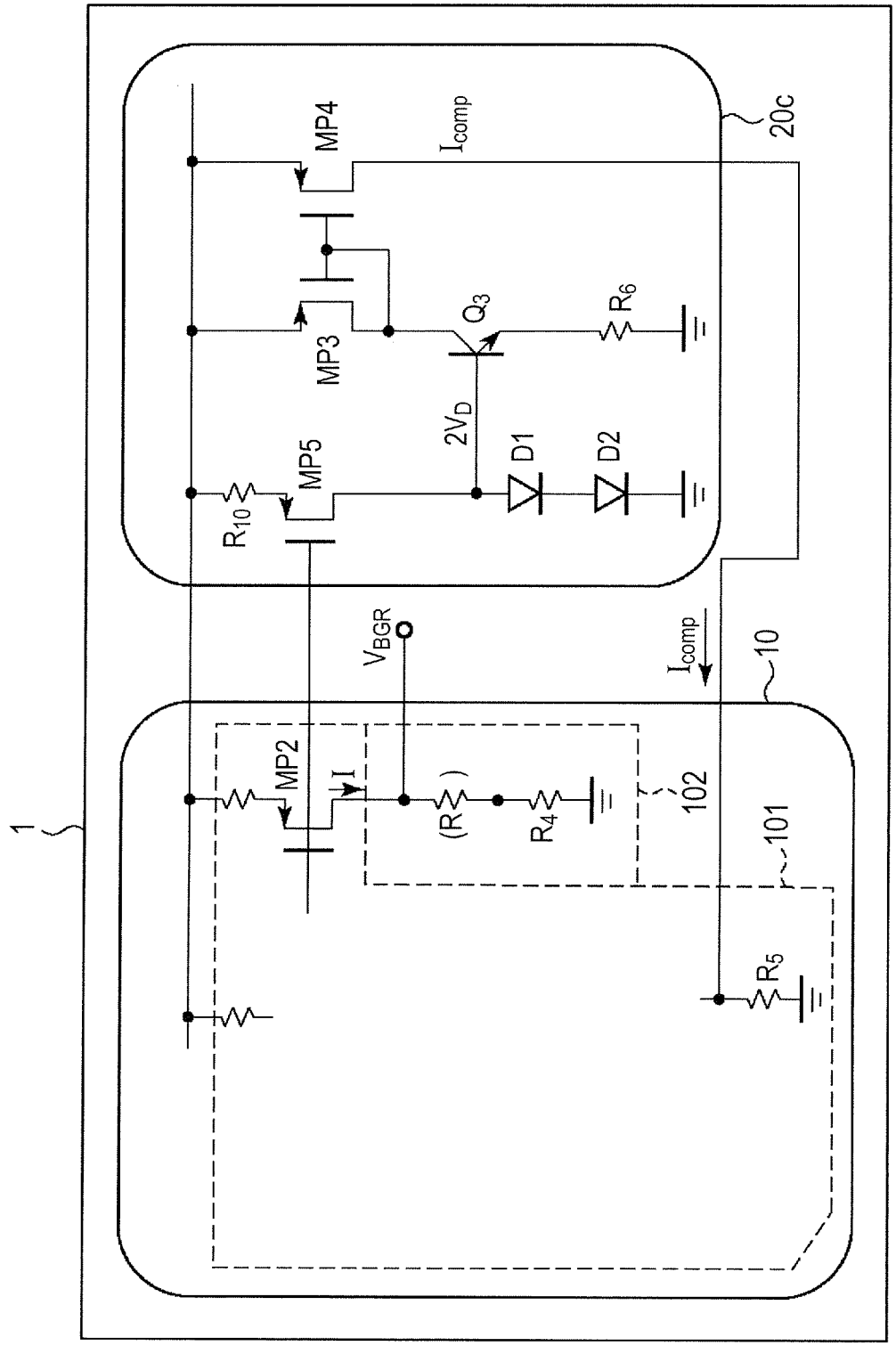
FIG. 12 is a circuit diagram illustrating an example of a concrete circuit configuration of a voltage generation circuit according to a third embodiment.

FIG. 12 is a circuit diagram illustrating an example of a concrete circuit configuration of the voltage generation circuit 1 according to a third embodiment. The voltage generation circuit 1 is different from the voltage generation circuit 1 of FIG. 8 with respect to the point that the resistor $R_{40}$ is not used but diodes D1 and D2 are used in a correction circuit 20c. In the following, the point different from the voltage generation circuit 1 of FIG. 8 will be mainly described.

The correction circuit 20c generates the correction current Icomp by subtracting the base-emitter voltage $V_{BE3}$ of the bipolar transistor $Q_3$ from a voltage $2V_D$ which is twice as high as the forward voltage of the diode generated from the current I, and makes the correction current Icomp fed back to the current generation unit 101.

The correction circuit 20c has, for example, the bipolar transistor $Q_3$, the resistors $R_6$ and $R_{10}$, the diodes D1 and D2, and the P-channel-type MOS transistors MP3, MP4, and MP5. In this case, the P-channel-type MOS transistor MP6 illustrated in FIG. 7 is not illustrated.

The PMOS transistor MP5 has the gate terminal to which the gate terminal of the PMOS transistor MP2 in the BGR core circuit 10 is coupled and has the source terminal to which the power supply node Vcc is coupled via the resistor $R_{10}$. One end of the diodes D1 and D2 is coupled to the drain of the PMOS transistor MP5, and the other end is coupled to the ground node. The connection node between the PMOS transistor MP5 and the diodes D1 and D2 is coupled to the base terminal of the bipolar transistor $Q_3$. The other bipolar transistor $Q_3$, the resistors $R_6$ and $R_{10}$, and the PMOS transistors MP3 and MP4 are similar to those of FIG. 8.

A current mirror circuit is comprised of the PMOS transistor MP5 and the PMOS transistor MP2 in the BGR core circuit 10. Therefore, the current I flowing in the PMOS transistor MP2 flows also in the PMOS transistor MP5. At this time, the voltage at the connection node between the PMOS transistor MP5 and the diode D1 is a voltage $2V_D$ which is twice as large as the forward voltage of the diode. The voltage $2V_D$ is supplied to the base terminal of the bipolar transistor $Q_3$. By the operation, the correction current Icomp is generated in a manner similar to the case of FIG. 8. When the ambient temperature rises, the forward voltage of the diodes D1 and D2 decreases. Accordingly, when the current I is constant, the voltage $2V_D$ decreases, and the base voltage of the bipolar transistor $Q_3$ is decreasing and the correction current Icomp is also decreasing. As a result, at the predetermined temperature $T_2$ (threshold temperature) or higher, the base voltage of the bipolar transistor $Q_3$ becomes extremely low (the threshold voltage or less), no current is passed to the bipolar transistor $Q_3$. Consequently, no current flows also in the current mirror circuit comprised of the PMOS transistors MP3 and MP4. As a result, the correction current Icomp becomes zero. That is, the correction current Icomp decreases as the temperature increases and does not flow at temperature higher than the threshold temperature $T_2$. In other words, the correction current Icomp monotonously increases from the threshold temperature $T_2$ toward the low-temperature side. As described above, the correction circuit 20c is a circuit capable of realizing correction on the low-temperature side as illustrated in FIGS. 5A to 5E.

Although the embodiment relates to the case where the number of the correction circuit 20c is one, by using a plurality of correction circuits having different threshold temperatures as in the second embodiment, higher precision can be also realized. In this case, as a method of making the threshold temperatures $T_2$ in the plurality of correction circuits 20c different from one another, for example, when the diodes D1 and D2 are equal to each other, there is a method of changing the number of the diodes. The larger the number is, the higher the threshold temperature $T_2$ becomes. As a method of changing the temperature dependency (the tilt of the graph in FIG. 5A or the like) of increase/decrease of the correction current Icomp, there is a method of changing the size of the resistor $R_6$. The larger the resistance is, the smaller the tilt becomes. In this case, in a manner similar to the case of FIG. 11 or the like in the plurality of correction circuits 20c, for example, the plurality of diodes and the PMOS transistors MP3, MP4, and MP5 can be also commonly used.

The other configuration, operation and principle of the BGR core circuit 10 are similar to those in the case of FIG. 8.

In the embodiment, changes in the reference voltage $V_{BGR}$ to the temperature can be reduced in a wide range on the low-temperature side as compared with the case of the reference voltage $V_{BGR}$ in FIG. 2B. That is, the precision of the reference voltage $V_{BGR}$ can be increased.

Modification

Next, a modification of a concrete circuit configuration of a voltage generation circuit according to the third embodiment will be described.

Figure 13:
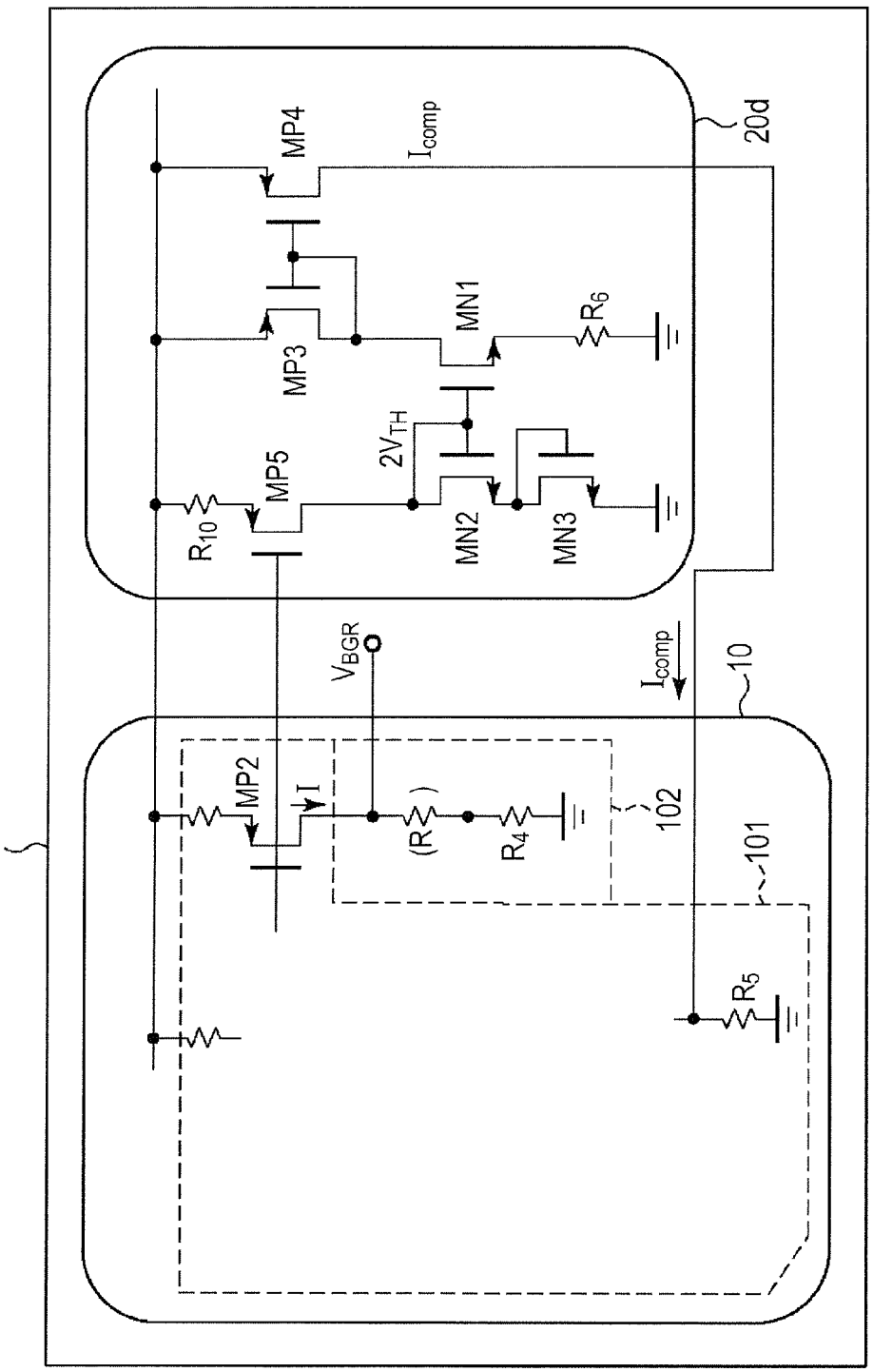
FIG. 13 is a circuit diagram illustrating a modification of the concrete circuit configuration of the voltage generation circuit according to the third embodiment.

FIG. 13 is a circuit diagram illustrating a modification of the concrete circuit configuration of the voltage generation circuit 1 according to the third embodiment. The voltage generation circuit 1 of FIG. 13 is different from the voltage generation circuit 1 of FIG. 12 with respect to the point that a correction circuit 20d does not use the bipolar transistor $Q_3$ but uses an N-channel-type MOS transistor MN1. In the following, the point different from FIG. 12 will be mainly described.

The correction circuit 20d has, for example, N-channel-type MOS transistors MN1, MN2, and MN3, the resistors $R_6$ and $R_{10}$, and the P-channel-type MOS transistors MP3, MP4, and MP5. In this case, the P-channel-type MOS transistor MP6 illustrated in FIG. 7 is not illustrated.

The PMOS transistor MP5 has the gate terminal to which the gate terminal of the PMOS transistor MP2 in the BGR core circuit 10 is coupled and has the source terminal to which the power supply node Vcc is coupled via the resistor $R_{10}$. The drain terminal of the NMOS transistor MN2 is coupled to the gate terminal and the drain terminal of the PMOS transistor MP5. The drain terminal of the NMOS transistor MN3 is coupled to the gate terminal and the source terminal of the NMOS transistor MN2, and the source terminal of the NMOS transistor MN3 is coupled to the ground node. The NMOS transistor NM1 has the gate terminal coupled to the gate terminal of the NMOS transistor MN2, the source terminal coupled to one end of the resistor $R_6$, and the drain terminal coupled to the drain terminal of the PMOS transistor MP3. The NMOS transistors MN2 and MN3 are diode-coupled. That is, they can be regarded as the diodes D1 and D2 in FIG. 12. The others, the resistors $R_6$ and $R_{10}$ and the P-channel-type MOS transistors MP3 and MP4 are the same as those of FIG. 12.

A current mirror circuit is comprised of the PMOS transistor MP5 and the PMOS transistor MP2 in the BGR core circuit 10. Therefore, the current I flowing in the PMOS transistor MP2 flows also in the PMOS transistor MP5. The voltage at the connection node between the PMOS transistor MP5 and the NMOS transistor MN2 can be a voltage $2V_{TH}$ which is twice as large as the threshold voltage of the NMOS transistor. The voltage $2V_{TH}$ is supplied to the gate terminal of the NMOS transistor MN1. Accordingly, the NMOS transistor MN1 is turned on, current flows in the current mirror circuit comprised of the PMOS transistors MP3 and MP4, and the correction current Icomp is generated. However, when the ambient temperature rises, the threshold voltage of the diode-coupled NMOS transistors MN2 and MN3 decreases. Accompanying with it, when the current I is constant, the voltage $2V_{TH}$ decreases, and the gate voltage of the MNOS transistor MN1 is decreasing and the correction current Icomp is also decreasing. As a result, at the predetermined temperature $T_2$ (threshold temperature) or higher, the gate voltage of the NMOS transistor MN1 becomes extremely low (the threshold voltage or less), no current is passed to the NMOS transistor MN1. Consequently, no current flows also in the current mirror circuit comprised of the PMOS transistors MP3 and MP4. As a result, the correction current Icomp becomes zero. That is, the correction current Icomp decreases as the temperature increases and does not flow at temperature higher than the threshold temperature $T_2$. In other words, the correction current Icomp monotonously increases from the threshold temperature $T_2$ toward the low-temperature side. As described above, the correction circuit 20d is a circuit capable of realizing correction on the low-temperature side as illustrated in FIGS. 5A to 5E.

Although the embodiment also relates to the case where the number of the correction circuit 20d is one, by using a plurality of correction circuits having different threshold temperatures as described above, correction with higher precision can be also realized. In this case, by increasing/decreasing diode-coupled NMOS transistors, the threshold temperatures $T_2$ can be changed.

The other configuration, operation and principle of the BGR core circuit 10 are similar to those in the case of FIG. 8.

In the embodiment, also in the case of the voltage generation circuit 1 of FIG. 13, effects similar to those of the case of the voltage generation circuit 1 of FIG. 12 can be obtained.

The second embodiment relates to correction on the high-temperature side, and the third embodiment relates to correction on the low-temperature side. The corrections can be also combined. For example, the correction circuit 20a is used as the correction circuit 20 for high temperature, and the correction circuit 20c is used as the correction circuit 20 for low temperature. In such a manner, the method of correcting the temperature characteristics on both of the high-temperature side and the low-temperature side of the reference voltage $V_{BGR}$ as illustrated in FIGS. 6A to 6D can be realized.

Fourth Embodiment

A semiconductor device according to a fourth embodiment will be described. In the fourth embodiment, the case where the correction circuit 20 generates a correction current Icomp on the basis of current according to the difference voltage $\Delta V_{BE}$ of base-emitter voltages of two bipolar transistors having different emitter areas and current according to the base-emitter voltage $V_{BE}$ of the bipolar transistor and corrects the high-temperature side of the reference voltage $V_{BGR}$ with the correction current Icomp will be described. In the embodiment, the number of the correction circuits 20 is plural. In other words, the fourth embodiment is different from the second embodiment with respect to the point of the kind of the current used to generate the correct current Icomp. In the following, the point different from the second embodiment will be mainly described.

The voltage generation circuit of the fourth embodiment is the voltage generation circuit as illustrated in FIG. 3 and performs correction on the high-temperature side as illustrated in FIGS. 4A to 4E. Obviously, it can be applied also to the case where the number of the correction circuit 20 is one as long as a technical contradiction does not occur.

Figure 14:
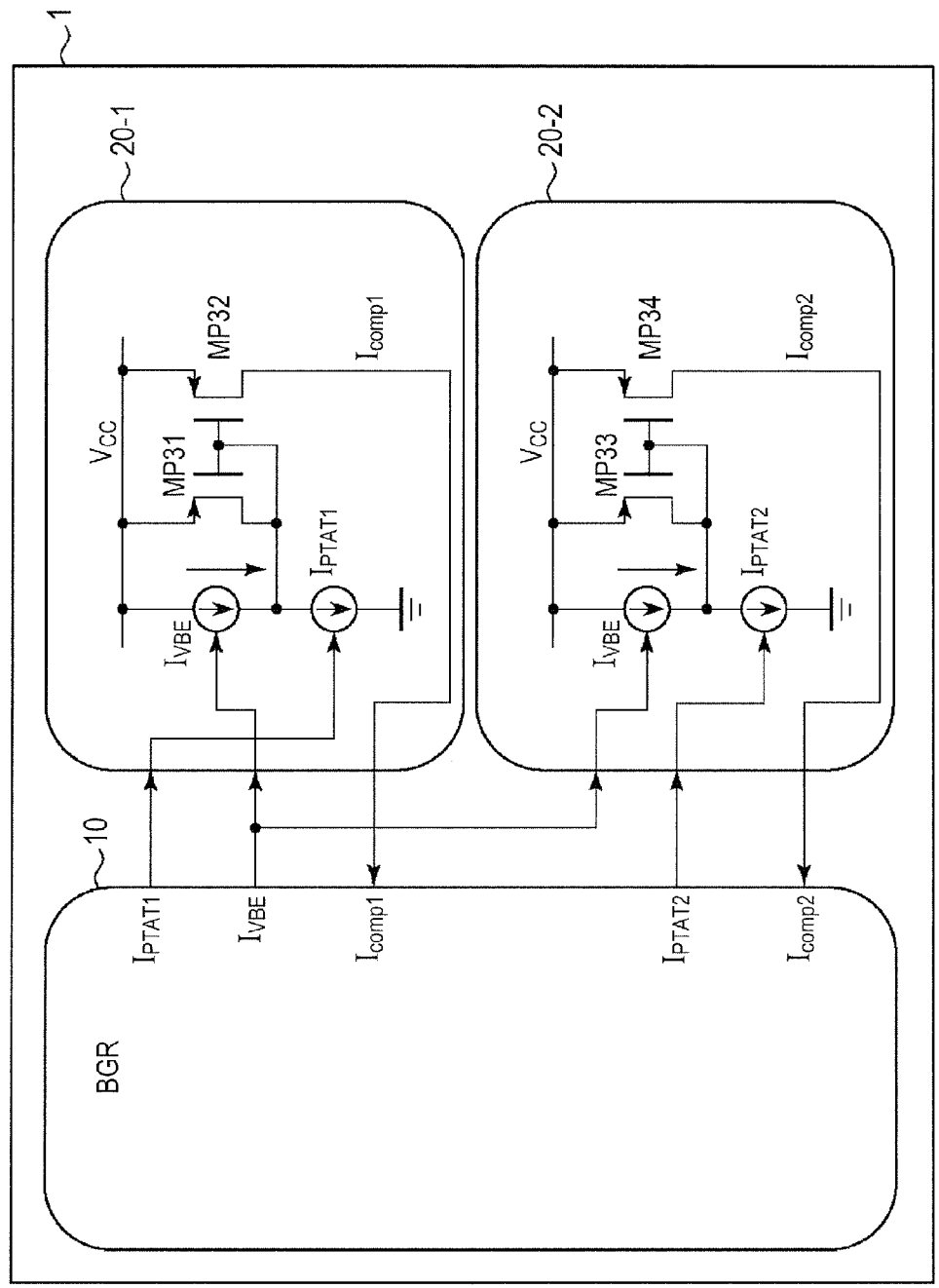
FIG. 14 is a circuit diagram illustrating an example of a concrete circuit configuration of a voltage generation circuit according to a fourth embodiment.

FIG. 14 is a circuit diagram illustrating an example of a concrete circuit configuration of the voltage generation circuit according to the fourth embodiment.

The BGR core circuit 10 generates, by the current generation unit 101, current obtained by adding current according to the difference voltage ($\Delta V_{BE}$) of base-emitter voltages of the two bipolar transistors $Q_1$ and $Q_2$ having different emitter areas, current according to the base-emitter voltage $V_{BE}$ of the bipolar transistor Q, and correction current Icomp generated by the correction circuit 20. The generated current is converted to the reference voltage $V_{BGR}$ and the voltage is output by the voltage output unit 102. Further, the BGR core circuit 10 generates $I_{PTAT1}$ and $I_{PTAT2}$ as currents according to the difference voltage ($\Delta V_{BE}$) of the base-emitter voltages of the two bipolar transistors having different emitter areas, also generates a current $I_{VBE}$ according to the base-emitter voltage $V_{BE}$ of the bipolar transistor, and outputs the generated current to the correction circuit 20. The concrete configuration of the BGR core circuit 10 will be described later.

The correction circuit 20-1 generates a correction current Icomp1 on the basis of the current $I_{PTAT1}$ and the current $I_{VBE}$ and makes the correction current Icomp1 fed back to the current generation unit 101. Similarly, the correction circuit 20-2 generates a correction current Icomp2 on the basis of the current $I_{PTAT2}$ and the current $I_{VBE}$ and makes the correction current Icomp2 fed back to the current generation unit 101.

The correction circuit 20-1 has, for example, a constant current supply $I_{VBE}$, a constant current supply $I_{PTAT1}$, and P-channel-type MOS transistors MP31 and MP32. The P-channel-type MOS transistor MP6 which is illustrated in FIG. 7 is not illustrated in FIG. 14. One end of the constant current supply $I_{VBE}$ is coupled to the power supply node Vcc so as to pass the constant current $I_{VBE}$ from the power supply node Vcc toward the ground node on the basis of the current $I_{VBE}$ from the BGR core circuit 10. One end of the constant current supply $I_{PTAT1}$ is coupled to the other end of the constant current supply $I_{VBE}$ and the other end is coupled to the ground node so as to pass the constant current $I_{PTAT1}$ from the current node Vcc toward the ground node. The PMOS transistor MP31 has the source terminal to which the power supply node Vcc is coupled and has the drain terminal to which the gate terminal and the connection node of the constant current supply $I_{VBE}$ and the constant current $I_{PTAT1}$ are coupled. The PMOS transistor MP32 has the source terminal to which the power supply node Vcc is coupled and has the gate terminal to which the gate terminal of the PMOS transistor MP31 is coupled. The PMOS transistors MP31 and MP32 configure a current mirror circuit. The current mirror circuit outputs the correction current Icomp1 from the drain terminal of the PMOS transistor MP32 in accordance with the difference current ($\Delta I1 = I_{PTAT1} - I_{VBE}$) flowing in the connection node of the constant current supply $I_{VBE}$ and the constant current $I_{PTAT1}$. In the case where $\Delta I1 \geq 0$, that is, $I_{PTAT1} \geq I_{VBE}$, $\Delta I1 = I$ comp1 flows.

The correction circuit 20-2 has, for example, a constant current supply $I_{VBE}$, a constant current supply $I_{PTAT2}$, and P-channel-type MOS transistors MP33 and MP34. The P-channel-type MOS transistor MP6 which is illustrated in FIG. 7 is not illustrated in FIG. 14. One end of the constant current supply $I_{VBE}$ is coupled to the power supply node Vcc so as to pass the constant current $I_{VBE}$ from the power supply node Vcc toward the ground node on the basis of the current $I_{VBE}$ from the BGR core circuit 10. One end of the constant current supply $I_{PTAT2}$ is coupled to the other end of the constant current supply $I_{VBE}$ and the other end is coupled to the ground node so as to pass the constant current $I_{PTAT2}$ from the current node Vcc toward the ground node. The PMOS transistor MP33 has the source terminal to which the power supply node Vcc is coupled and has the drain terminal to which the gate terminal and the connection node of the constant current supply $I_{VBE}$ and the constant current $I_{PTAT2}$ are coupled. The PMOS transistor MP34 has the source terminal to which the power supply node Vcc is coupled and has the gate terminal to which the gate terminal of the PMOS transistor MP33 is coupled. The PMOS transistors MP33 and MP34 configure a current mirror circuit. The current mirror circuit outputs the correction current Icomp2 from the drain terminal of the PMOS transistor MP34 in accordance with the difference current ($\Delta I2 = I_{PTAT2} - I_{VBE}$) flowing in the connection node of the constant current supply $I_{VBE}$ and the constant current $I_{PTAT2}$. In the case where $\Delta I2 \geq 0$, that is, $I_{PTAT2} \geq I_{VBE}$, $\Delta I2 = I$ comp2 flows.

Figure 15A:
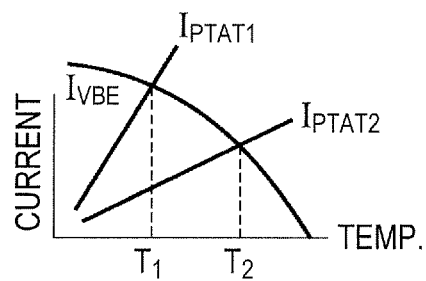
FIG. 15A is a graph illustrating the principle of a method of correcting a temperature characteristic in the voltage generation circuit in the case of FIG. 14.
Figure 15B:
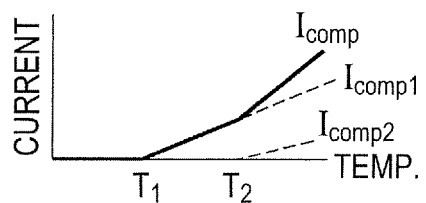
FIG. 15B is a graph illustrating the principle of the method of correcting a temperature characteristic in the voltage generation circuit in the case of FIG. 14.
Figure 15C:
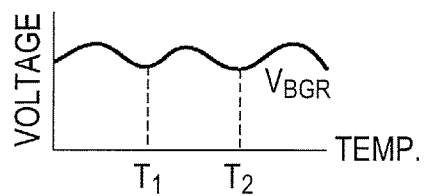
FIG. 15C is a graph illustrating the principle of the method of correcting a temperature characteristic in the voltage generation circuit in the case of FIG. 14.

FIGS. 15A to 15C are graphs illustrating the principle of a method of correcting a temperature characteristic in the voltage generation circuit in the case of FIG. 14. In each of the graphs, the vertical axis indicates current or voltage, and the horizontal axis indicates temperature. The graphs are intended to illustrate the concept and are not always numerically accurate.

As illustrated in FIG. 15A, the currents $I_{PTAT1}$, $I_{PTAT2}$, and $I_{VBE}$ are supplied from the BGR core circuit 10. The currents $I_{PTAT1}$ and $I_{PTAT2}$ are currents according to the difference voltage ($\Delta V_{BE}$) of the base-emitter voltages of the two bipolar transistors having different emitter areas and are proportional to the absolute temperature. The current $I_{VBE}$ is current according to the base-emitter voltage $V_{BE}$ of the bipolar transistor and is non-linear.

As illustrated in FIG. 15B, the correction circuit 20-1 generates, as the correction current Icomp1, the difference current ($\Delta I1 = I_{PTAT1} - I_{VBE}$) on the basis of the constant current $I_{VBE}$ and the constant current $I_{PTAT1}$. In this case, at or higher than the threshold temperature $T_1$ at which $\Delta I1 \geq 0$, that is, $I_{PTAT1} \geq I_{VBE}$ is satisfied, $\Delta I1 = I$ comp1 is generated. Similarly, the correction circuit 20-2 generates, as the correction current Icomp2, the difference current ($\Delta I2 = I_{PTAT2} - I_{VBE}$) on the basis of the constant current $I_{VBE}$ and the constant current $I_{PTAT2}$. In this case, at or higher than the threshold temperature $T_2$ at which $\Delta I2 \geq 0$, that is, $I_{PTAT2} \geq I_{VBE}$ is satisfied, $\Delta I2 = I$ comp2 is generated. As a result, the final correction current Icomp is the sum of Icomp1 and Icomp2. To set the threshold temperatures $T_1$ and $T_2$ as different values, different currents $I_{PTAT1}$ and $I_{PTAT2}$ are used in the correction circuits 20-1 and 20-2.

As illustrated in FIG. 15C, the BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C. That is, the reference voltage $V_{BGR}$ prior to the addition is obtained by converting the current derived by adding the current according to the difference voltage ($\Delta V_{BE}$) of base-emitter voltages of the two bipolar transistors $Q_1$ and $Q_2$ having different emitter areas and the current according to the base-emitter voltage $V_{BE4}$ of the bipolar transistor $Q_4$.

The graph of the final reference voltage $V_{BGR}$ (FIG. 15C) has the shape having valleys in two places around the temperatures $T_1$ and $T_2$ and apexes of a mountain in three places sandwiching the valleys. The relation $T_1 < T_2$ is satisfied. That is, as compared with the reference voltage $V_{BGR}$ in FIGS. 2B and 2C, a change in the reference voltage $V_{BGR}$ of FIG. 15C with respect to temperature can be decreased in a relatively wide range (particularly, on the high temperature side of the mountain apex of the original reference voltage $V_{BGR}$). That is, the precision of the reference voltage $V_{BGR}$ can be further increased.

Next, the BGR core circuit 10 of the embodiment will be described.

Figure 16:
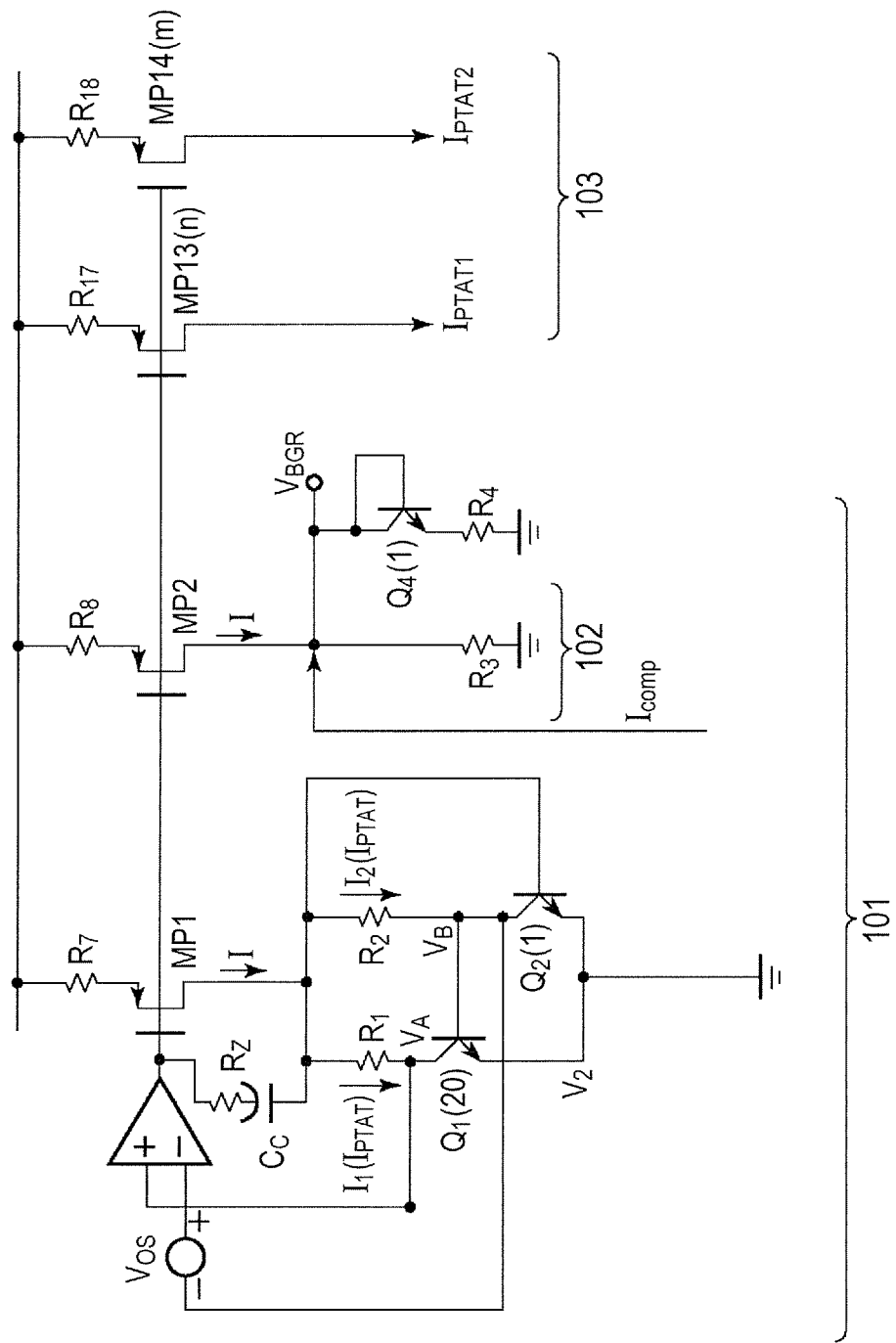
FIG. 16 is a circuit diagram illustrating an example of a concrete circuit configuration of a BGR core Circuit.

FIG. 16 is a circuit diagram illustrating an example of a concrete circuit configuration of the BGR core circuit 10. The BGR core circuit 10 has the current generation unit 101, the output unit 102, and a first current generation unit 103.

The current generation unit 101 has, for example, the NPN-type bipolar transistors $Q_1$, $Q_2$, and $Q_4$, the resistors $R_1$, $R_2$, $R_4$, $R_7$, $R_8$, and $R_z$, the capacitor Cc, the differential amplifier $A_1$, and the P-channel-type MOS transistors MP1 and MP2. The output unit 102 has, for example, the resistor $R_3$. The first current generation unit 103 has, for example, resistors $R_{17}$ and $R_{18}$, and P-channel-type MOS transistors MP13 and MP14.

In the current generation unit 101, the emitter terminals of the bipolar transistors $Q_1$ and $Q_2$ are commonly coupled to the ground node. The base terminal of the bipolar transistor $Q_1$ is coupled to the collector terminal of the bipolar transistor $Q_2$. The emitter area of the bipolar transistor $Q_1$ "n" times as large as that of the bipolar transistor $Q_2$ (n is an integer of two or, larger). That is, it is set so that when the same current is passed to the bipolar transistors $Q_1$ and $Q_2$, the emitter current density of the bipolar transistor $Q_2$ is "n" times as high as that of the transistor $Q_1$. In the example of the diagram, "n" is equal to 20. One end of the resistor $R_1$ is coupled to the base terminal of the bipolar transistor $Q_2$, and the other end is coupled to the collector terminal of the bipolar transistor $Q_1$. One end of the resistor $R_2$ is coupled to one end of the resistor $R_1$, and the other end is coupled to the collector terminal of the bipolar transistor $Q_2$. To the differential amplifier $A_1$, the potential on the collector side of each of the bipolar transistors $Q_1$ and $Q_2$ is supplied. Each of the PMOS transistors MP1 and MP2 has the gate terminal to which the output voltage of the differential amplifier $A_1$ is supplied and has the source terminal to which the power supply node Vcc is coupled via the resistor $R_7$ or $R_8$. The drain terminal of the PMOS transistor MP1 is coupled to the connection nodes of the resistors $R_1$ and $R_2$. In such a manner, a feedback loop is formed. The collector terminal and the base terminal of the bipolar transistor $Q_4$ are coupled to the drain terminal of the PMOS transistor MP2. One end of the resistor $R_4$ is coupled to the emitter terminal of the bipolar transistor $Q_4$ and the other end is coupled to the ground node.

The resistor Rz and the capacitor Cc are coupled in series in this order and coupled to the output side of the differential amplifier $A_1$ and the drain terminal of the PMOS transistor MP1. Those elements are elements for phase compensation to prevent oscillation of the circuit and have no direct relation to generation of current and voltage.

In the output unit 102, one end of the resistor $R_3$ is coupled to the drain terminal of the PMOS transistor MP2 and the other end is coupled to the ground node. The correction current Icomp from the correction circuit 20 is supplied to the connection node between the resistor $R_3$ and the drain terminal of the PMOS transistor MP2. The voltage at the connection node is output as the reference voltage $V_{BGR}$. At the connection node, the following equation 20 is satisfied. When the equation is organized, the equation 21 is obtained.

$$\frac{V_{BGR} - V_{BE}}{R_4} + \frac{V_{BGR}}{R_3} = 2I_{PTAT} + I_{comp} \quad (20)$$

$$V_{BGR} = \frac{R_4 R_3}{R_4 + R_3}\left(\frac{V_{BE}}{R_4} + 2I_{PTAT} + I_{comp}\right) \quad (21)$$

$V_{BE}$ denotes a base-emitter voltage $V_{BE4}$ of the bipolar transistor $Q_4$, $2I_{PTAT}$ denotes current ($I=I_1+I_2$) according to the difference voltage of the base-emitter voltages of the two bipolar transistors $Q_1$ and $Q_2$ having different emitter areas. Icomp denotes correction current from the correction circuit 20. Therefore, three currents are supplied to the connection node. Specifically, the three currents are the current according to the base-emitter voltage $V_{BE4}$ of the bipolar transistor $Q_4$, the current according to the difference voltage of the base-emitter voltages of the two bipolar transistors $Q_1$ and $Q_2$ having different emitter areas, and the correction current Icomp from the correction circuit 20. By adding the three currents (or voltages), as illustrated in FIG. 15C, the precision of the reference voltage $V_{BGR}$ can be made high in the relatively wide range.

In the first current, generation 103, the PMOS transistor MP13 has the gate terminal to which the gate terminal of the PMOS transistor MP2 is coupled and has the source terminal to which the power supply node Vcc is coupled via the resistor $R_{17}$. The PMOS transistor MP14 has the gate terminal to which the gate terminal of the PMOS transistor MP2 is coupled and has the source terminal to which the power supply node Vcc is coupled via the resistor $R_{18}$.

The PMOS transistors MP13 and MP14 configure a current mirror circuit together with the PMOS transistor MP2. To the PMOS transistor MP2, a current I ($=I_1+I_2=2I_{PTAT}$) according to the difference voltage of the base-emitter voltages of the two bipolar transistors $Q_1$ and $Q_2$ having different. emitter areas flows. Therefore, also to the PMOS transistors MP13 and MP14, the current ($\propto I_{PTAT}$) according to the difference voltage of the base-emitter voltages of the two bipolar transistors $Q_1$ and $Q_2$ having different emitter areas can be passed. By making the current mirror ratios of the PMOS transistors MP13 and MP14 different, different currents $I_{PTAT1}$ and $I_{PTAT2}$ can be generated. In the case where one current $I_{PTAT1}$ is sufficient, the PMOS transistor MP14 may be omitted. In the case where the voltage $V_{PTAT}$ is necessary, it is sufficient to convert the current $I_{PTAT}$ to voltage by using a resistor or the like.

Figure 17A:
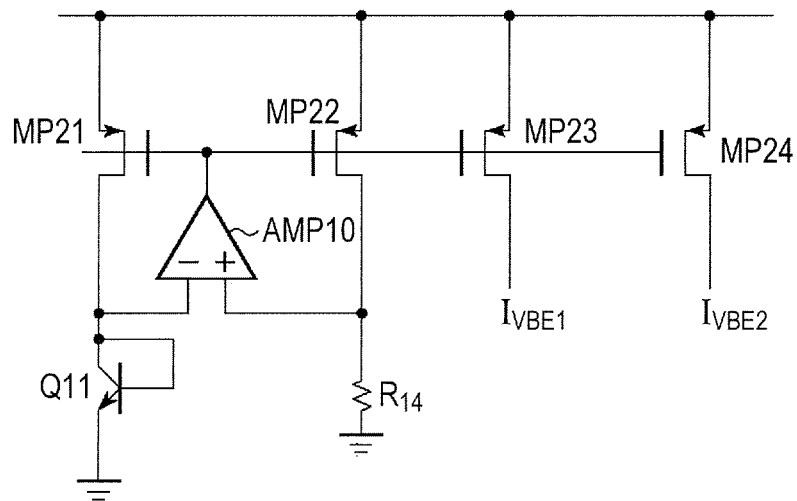
FIG. 17A is a circuit diagram, illustrating an example of a concrete circuit configuration of a second current generation circuit of the BGR core circuit.

FIG. 17A is a circuit diagram illustrating an example of the concrete circuit configuration of a second current generation circuit 104 of the BGR core circuit 10. The second current generation unit 104 has a bipolar transistor Q11, resistor $R_{14}$, P-channel-type MOS transistors MP21, MP22, MP23, and MP24, and a differential amplifier AMP10. The second current generation unit 104 generates current according to a base-emitter voltage $V_{BE11}$ of the bipolar transistor Q11.

The source terminals of the PMOS transistors MP21 and MP22 are coupled to the power supply node, and the gate terminals are commonly coupled. The differential amplifier AMP10 has two input terminals coupled to the drain terminals of the PMOS transistors MP21 and MP22, and has an output terminal coupled to the gate terminals of the PMOS transistors MP21 and MP22. The bipolar transistor Q11 has a collector terminal and a base terminal coupled to the drain terminal of the PMOS transistor MP21 and has an emitter terminal coupled to the ground node. One end of the resistor $R_{14}$ is coupled to the drain terminal of the PMOS transistor MP22, and the other end is coupled to the ground node. The PMOS transistors MP21 and MP22 configure a current mirror circuit. Therefore, current according to the base-emitter voltage $V_{BE11}$ of the bipolar transistor Q11 flowing in the PMOS transistor MP21 also flows in the PMOS transistor MP22.

The PMOS transistor MP23 has the gate terminal to which the gate terminal of the PMOS transistor MP22 is coupled and has the source terminal to which the power supply node is coupled. The PMOS transistor MP24 has the gate terminal to which the gate terminal of the PMOS transistor MP22 is coupled and has the source terminal to which the power supply node is coupled.

The PMOS transistors MP23 and MP24 configure a current mirror circuit together with the PMOS transistor MP22. To the PMOS transistor MP2, a current according to the base-emitter voltage $V_{BE11}$ of the bipolar transistor Q11 flows and current corresponding to the current flows also to the PMOS transistors MP23 and MP24. By making the current mirror ratios of the PMOS transistors MP23 and MP24 different, different currents $I_{VBE1}$ and $I_{VBE2}$ can be generated. In the case where one current $I_{VBE}$ is sufficient, the PMOS transistor MP24 may be omitted. In the case where the voltage $V_{VBE}$ is necessary, it is sufficient to convert the current $I_{VBE}$ to voltage by using a resistor or the like.

Figure 17B:
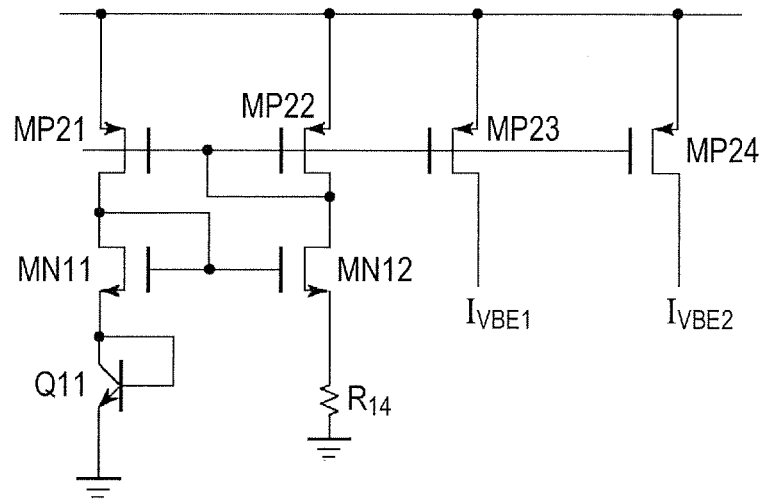
FIG. 17B is a circuit diagram illustrating another example of the concrete circuit configuration of the second current generation circuit of the BGR core circuit.

FIG. 17B is a circuit diagram illustrating another example of the concrete circuit configuration of the second current generation circuit 104 of the BGR core circuit 10. The case of FIG. 17B is different from that of FIG. 17A with respect to the point that no differential amplifier is used. Hereinafter, the different point will be described. The second current generation unit 104 has the bipolar transistor Q11, the resistor $R_{14}$, the P-channel-type MOS transistors MP21, MP22, MP23, and MP24, and N-channel-type MOS transistors MN11 and MN12. The second current generation unit 104 generates current according to the base-emitter voltage $V_{BE11}$ of the bipolar transistor Q11.

The source terminals of the PMOS transistors MP21 and MP22 are coupled to the power supply node, and the gate terminals are commonly coupled. The gate terminal of the PMOS transistor MP22 is coupled to the drain terminal. The drain and gate terminals of the NMOS transistor MN11 are coupled to the drain terminal of the PMOS transistor MP21, and the source terminal is coupled to the collector terminal of the bipolar transistor Q11. The NMOS transistor MN12 has the drain terminal coupled to the drain terminal of the PMOS transistor MP22, the gate terminal coupled to the gate terminal of the NMOS transistor MN11, and the source terminal coupled to one end of the resistor $R_{14}$. In this case as well, the PMOS transistors MP21 and MP22 configure a current mirror circuit. The PMOS transistors MP23 and MP24 configure a current mirror circuit together with the PMOS transistor MP22. Therefore, in this case as well, in a manner similar to FIG. 17A, the currents $I_{VBE1}$ and $I_{VBE2}$ can be generated.

Figure 18:
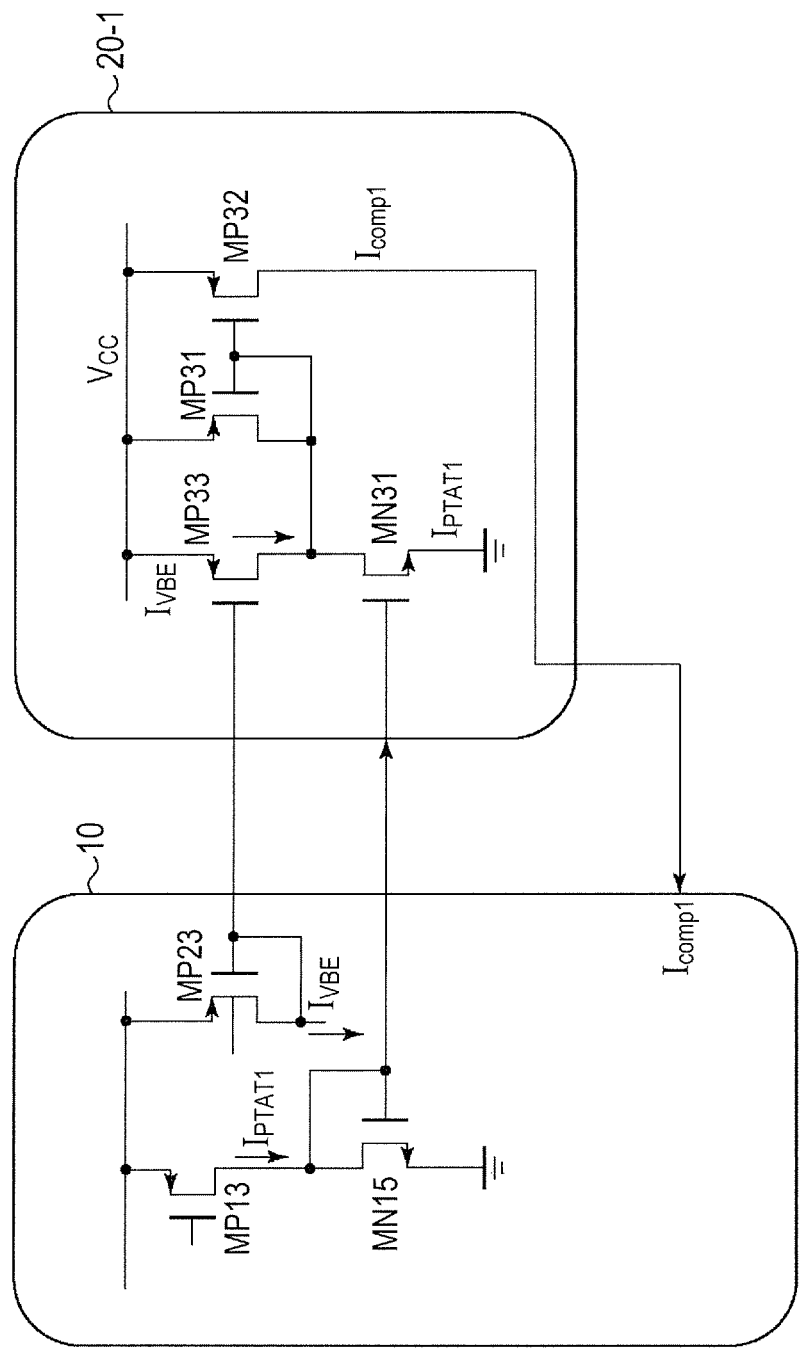
FIG. 18 is a partial circuit diagram illustrating an example of the concrete circuit configuration of the voltage generation circuit according to the fourth embodiment.

FIG. 18 is a partial circuit diagram illustrating an example of the concrete circuit configuration of the voltage generation circuit 1 according to the fourth embodiment. In the example of the diagram, as the concrete circuit configuration of the voltage generation circuit 1 of FIG. 14, as the BGR core circuit 10, a circuit obtained by combining FIGS. 16 and 17A is illustrated. As the BGR core circuit 10, only the PMOS transistors MP13 and MP23 and an NMOS transistor MN15 related to output in the circuit obtained by combining FIGS. 16 and 17 are illustrated. As the correction circuits 20, only the correction circuit 20-1 is illustrated. The resistor $R_{17}$ inserted in the source terminal of the PMOS transistor MP13 is not illustrated.

In the correction circuit 20-1, the constant current supply $I_{VBE}$ is realized as a PMOS transistor MP33. The PMOS transistor MP33 has the source terminal coupled to the power supply node, and the drain terminal coupled to the constant current supply $I_{PTAT1}$. Further, the gate terminal of the PMOS transistor MP33 is coupled to the gate terminal and the drain terminal of the PMOS transistor MP23 in the second current generation unit 104. With a configuration, the PMOS transistors MP33 and MP23 configure a current mirror circuit. As a result, the current $I_{VBE}$ generated in the PMOS transistor MP23 is reflected in the PMOS transistor MP33. That is, it can be regarded that the current $I_{VBE}$ is substantially supplied from the BGR core circuit 10 (in the second current generation unit 104) to the constant current supply $I_{VBE}$ (PMOS transistor MP33).

In the correction circuit 20-1, the constant current supply $I_{PTAT1}$ is realized as an NMOS transistor MN31. The NMOS transistor MN31 has the source terminal coupled to the ground node, and the drain terminal coupled to the constant current supply $I_{VBE}$. Further, the gate terminal of the NMOS transistor MN31 is coupled to the gate terminal and the drain terminal of the NMOS transistor MN15 in the first current generation unit 103. The NMOS transistor MP15 has a source terminal coupled to the ground node and has a gate terminal and a drain terminal coupled to the drain of the PMOS transistor MP13. The current $I_{PTAT1}$ flowing in the PMOS transistor MP13 similarly flows in the NMOS transistor MN15. The NMOS transistors MN31 and MN15 configure a current mirror circuit. As a result, the current $I_{PTAT1}$ which is generated in the PMOS transistor MP13 and flows also in the NMOS transistor MN15 is reflected in the NMOS transistor MN31. That is, it can be regarded that the current $I_{PTAT1}$ is substantially supplied from the BGR core circuit 10 (in the first current generation unit 103) to the constant current supply $I_{PTAT1}$ (NMOS transistor MN31).

In such a manner, the voltage generation circuit 1 illustrated in FIG. 14 is realized.

The circuit configurations illustrated in FIGS. 16 to 18 are illustrative and other circuit configurations having similar functions may be used.

Modification

Next, a modification of the concrete circuit configuration of the voltage generation circuit according to the fourth embodiment will be described.

Figure 19:
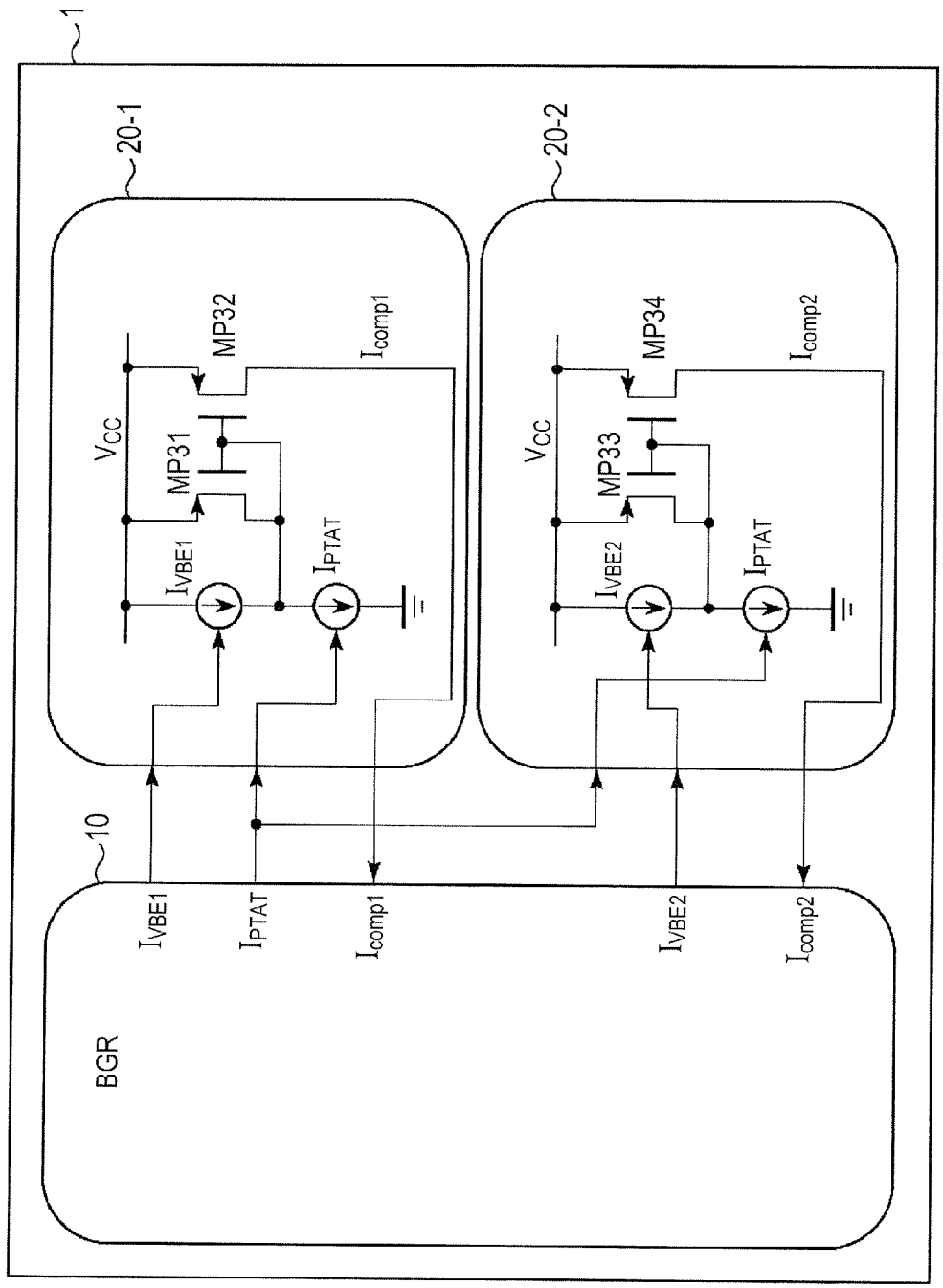
FIG. 19 is a circuit diagram illustrating a modification of the concrete circuit configuration of the voltage generation circuit according to the fourth embodiment.

FIG. 19 is a circuit diagram illustrating a modification of the concrete circuit configuration of the voltage generation circuit 1 according to the fourth embodiment. In the voltage generation circuit 1 of FIG. 14, in the correction circuits 20-1 and 20-2, the same current is used as the current $I_{VBE}$ and different currents are used as the current $I_{PTAT}$. In the voltage generation circuit 1 of FIG. 19, however, in the correction circuits 20-1 and 20-2, different currents are used as the current $I_{VBE}$ and the same current is used as the current $I_{PTAT}$. Hereinafter, the point different from the case of FIG. 14 will be mainly described.

The BGR core circuit 10 generates $I_{PTAT}$ as a current according to the difference voltage ($\Delta V_{BE}$) of the base-emitter voltages of the two bipolar transistors having different emitter areas, also generates currents $I_{VBE1}$ and $I_{VBE2}$ according to the base-emitter voltage $V_{BE}$ of the bipolar transistor, and outputs the generated currents to the correction circuit 20. The other functions and configuration of the BGR core circuit 10 are similar to those of the case of FIG. 14. The concrete configuration of the BGR core circuit 10 is as illustrated in FIGS. 16 to 18.

The correction circuit 20-1 generates a correction, current Icomp1 on the basis of the current $I_{PTAT}$ and the current $I_{VBE1}$ and makes the correction current Icomp1 fed back to the current generation unit 101. Similarly, the correction circuit 20-2 generates a correction current Icomp2 on the basis of the current $I_{PTAT}$ and the current $I_{VBE2}$ and makes the correction current Icomp2 fed back to the current generation unit 101.

The correction circuits 20-1 and 20-2 use, opposite to the case of FIG. 14, the constant currents $I_{VBE1}$ and $I_{VBE2}$ which are different from each other, and the same constant current supply $I_{PTAT}$. The others are similar to those of the case of FIG. 14. As a result, in the correction circuit 20-1, the current mirror circuit comprised of the PMOS transistors MP31 and MP32 outputs the correction current Icomp1 from the drain terminal of the PMOS transistor MP32 in accordance with the difference current ($\Delta I1 = I_{PTAT} - I_{VBE1}$) flowing in the connection node of the constant current supply $I_{VBE1}$ and the constant current supply $I_{PTAT}$. In the case where $\Delta I1 \geq 0$, that is, $I_{PTAT} \geq I_{VBE1}$, $\Delta I1 = I\,comp1$ flows. On the other hand, in the correction circuit 20-2, the current mirror circuit comprised of the PMOS transistors MP33 and MP34 outputs the correction current Icomp2 from the drain terminal of the PMOS transistor MP34 in accordance with the difference current ($\Delta I2 = I_{PTAT} - I_{VBE2}$) flowing in the connection node of the constant current supply $I_{VBE2}$ and the constant current supply $I_{PTAT}$. In the case where $\Delta I2 \geq 0$, that is, $I_{PTAT} \geq I_{VBE2}$, $\Delta I2 = I\,comp2$ flows.

Figure 20A:
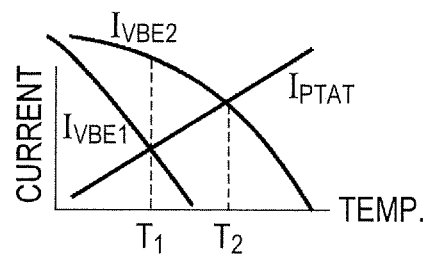
FIG. 20A is a graph illustrating the principle of a method of correcting a nonlinear temperature characteristic in the voltage generation circuit in the case of FIG. 19.
Figure 20B:
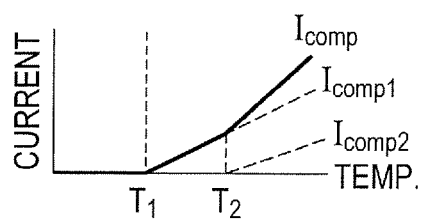
FIG. 20B is a graph illustrating the principle of the method of correcting the nonlinear temperature characteristic in the voltage generation circuit in the case of FIG. 19.
Figure 20C:
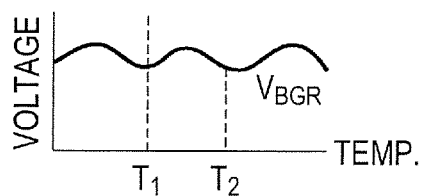
FIG. 20C is a graph illustrating the principle of the method of correcting the nonlinear temperature characteristic in the voltage generation circuit in the case of FIG. 19.

FIGS. 20A to 20C are graphs illustrating the principle of, a method of correcting a nonlinear temperature characteristic in the voltage generation circuit in the case of FIG. 19. In each of the graphs, the vertical axis indicates current or voltage, and the horizontal axis indicates temperature. The graphs are intended to illustrate the concept and are not always numerically accurate.

As illustrated in FIG. 20A, the currents $I_{PTAT}$, $I_{VBE1}$, and $I_{VBE2}$ are supplied from the BGR core circuit 10. The current $I_{PTAT}$ is a current according to the difference voltage ($\Delta V_{BE}$) of the base-emitter voltages of the two bipolar transistors having different emitter areas and is proportional to the absolute temperature. The currents $I_{VBE1}$ and $I_{VBE2}$ are currents according to the base-emitter voltage $V_{BE}$ of the bipolar transistor and are non-linear.

As illustrated in FIG. 20B, the correction circuit 20-1 generates, as the correction current Icomp1, the difference current ($\Delta I1 = I_{PTAT} - I_{VBE1}$) on the basis of the constant current $I_{VBE1}$ and the constant current $I_{PTAT}$. In this case, at or higher than the threshold temperature $T_1$ at which $\Delta I1 \geq 0$, that is, $I_{PTAT} \geq I_{VBE1}$ is satisfied, $\Delta I1 = I\,comp1$ is generated. Similarly, the correction circuit 20-2 generates, as the correction current Icomp2, the difference current ($\Delta I2 = I_{PTAT} - I_{VBE2}$) on the basis of the constant current $I_{VBE2}$ and the constant current $I_{PTAT}$. In this case, at or higher than the threshold temperature $T_2$ at which $\Delta I2 = 0$, that is, $I_{PTAT} \geq I_{VBE2}$ is satisfied, $\Delta I2 = I\,comp2$ is generated. As a result, the final correction current Icomp is the sum of Icomp1 and Icomp2. To set the threshold temperatures $T_1$ and $T_2$ as different values, different currents $I_{VBE1}$ and $I_{VBE2}$ are used in the correction circuits 20-1 and 20-2.

As illustrated in FIG. 20C, the BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C. That is, the reference voltage $V_{BGR}$ prior to the addition is obtained by converting the current derived by adding the current according to the difference voltage ($\Delta V_{BE}$) of base-emitter voltages of the two bipolar transistors $Q_1$ and $Q_2$ having different emitter areas and the current according to the base-emitter voltage $V_{BE4}$ of the bipolar transistor $Q_4$.

The graph of the final reference voltage $V_{BGR}$ (FIG. 20) has the shape having valleys in two places around the temperatures $T_1$ and $T_2$ and apexes of a mountain in three places sandwiching the valleys. The relation $T_1 < T_2$ is satisfied. That is, as compared with the reference voltage $V_{BGR}$ in FIGS. 2B and 2C, a change in the reference voltage $V_{BGR}$ of FIG. 20C with respect to temperature can be decreased in a relatively wide range (particularly, on the high temperature side of the mountain apex of the original reference voltage $V_{BGR}$). That is, the precision of the reference voltage $V_{BGR}$ can be further increased.

Fifth Embodiment

A semiconductor device according to a fifth embodiment will be described. In the fifth embodiment, the case where the correction circuit 20 generates a correction current Icomp on the basis of current according to the difference voltage $\Delta V_{BE}$ of base-emitter voltages of two bipolar transistors having different emitter areas and predetermined constant current and corrects the high-temperature side of the reference voltage $V_{BGR}$ with the correction current Icomp will be described. In the embodiment, the number of the correction circuits 20 is plural. In other words, the fifth embodiment is different from the fourth embodiment with respect to the point of the kind of the current used to generate the correct current Icomp. In the following, the point different from the fourth embodiment will be mainly described.

The voltage generation circuit of the fifth embodiment is the voltage generation circuit as illustrated in FIG. 3 and performs correction on the high-temperature side as illustrated in FIGS. 4A to 4E. Obviously, it can be applied also to the case where the number of the correction circuit 20 is one as long as a technical contradiction does not occur.

FIG. 21 is a circuit diagram illustrating a modification of the concrete circuit configuration of the voltage generation circuit 1 according to the fifth embodiment.

The BGR core circuit 10 generates, by the current generation unit 101, current obtained by adding current according to the difference voltage ($\Delta V_{BE}$) of base-emitter voltages of the two bipolar transistors $Q_1$ and $Q_2$ having different emitter areas, current according to the base-emitter voltage $V_{BE4}$ of the bipolar transistor $Q_4$, and correction current Icomp generated by the correction circuit 20. The generated current is converted to the reference voltage $V_{BGR}$ and the voltage is output by the voltage output unit 102. Further, the BGR core circuit 10 generates $I_{PTAT}$ as a current according to the difference voltage ($\Delta V_{BE}$) of the base-emitter voltages of the two bipolar transistors having different emitter areas, and outputs the generated current to the correction circuit 20. The concrete configuration of the BGR core circuit 10 is illustrated in FIGS. 16 to 18.

The correction circuit 20-1 generates a correction current Icomp1 on the basis of the current $I_{PTAT}$ and a resistor $R_{31}$ and makes the correction current Icomp1 fed back to the current generation unit 101. Similarly, the correction circuit 20-2 generates a correction current Icomp2 on the basis of the current $I_{PTAT}$ and a resistor $R_{32}$ and makes the correction current Icomp2 fed back to the current generation unit 101.

The correction circuit 20-1 has, for example, the resistor $R_{31}$, the constant current supply $I_{PTAT}$, and the P-channel-type MOS transistor MP31. The P-channel-type MOS transistor MP6 which is illustrated in FIG. 7 is not illustrated in FIG. 21. The resistor $R_{31}$ whose one end is coupled to the power supply node Vcc and whose other end is coupled to the constant current supply $I_{PTAT}$ passes the current according to the voltage applied. One end of the constant current supply $I_{PTAT}$ is coupled to the other end of the resistor $R_{31}$ and the other end is coupled to the ground node so as to pass the constant current $I_{PTAT}$ from the current node Vcc toward the ground node on the basis of the current $I_{PTAT}$ from the BGR core circuit 10. The PMOS transistor MP31 has the source terminal to which the power supply node Vcc is coupled and has the gate terminal to which the connection node of the resistor $R_{31}$ and the constant current $I_{PTAT}$ is coupled. The gate voltage of the PMOS transistor MP31 is controlled by the voltage according to the resistor $R_{31}$ and the constant current supply $I_{PTAT}$ and the PMOS transistor MP31 outputs the correction current Icomp1 from the drain terminal. In the case where $I_{PTAT} \cdot R_{31} \geq$ absolute value of threshold voltage of PMOS transistor MP31, I comp1 flows.

The correction circuit 20-2 has, for example, the resistor $R_{32}$, the constant current supply $I_{PTAT}$, and the P-channel-type MOS transistor MP32. The P-channel-type MOS transistor MP6 which is illustrated in FIG. 7 is not illustrated in FIG. 21. The resistor $R_{32}$ whose one end is coupled to the power supply node Vcc and whose other end is coupled to the constant current supply $I_{PTAT}$ passes the current according to the voltage applied. One end of the constant current supply $I_{PTAT}$ is coupled to the other end of the resistor $R_{32}$ and the other end is coupled to the ground node so as to pass the constant current $I_{PTAT}$ from the current node Vcc toward the ground node on the basis of the current $I_{PTAT}$ from the BGR core circuit 10. The PMOS transistor MP32 has the source terminal to which the power supply node Vcc is coupled and has the gate terminal to which the connection node of the resistor $R_{32}$ and the constant current $I_{PTAT}$ is coupled. The gate voltage of the PMOS transistor MP32 is controlled by the voltage according to the resistor $R_{32}$ and the constant current supply $I_{PTAT}$, and the PMOS transistor MP32 outputs the correction current Icomp2 from the drain terminal. In the case where $I_{PTAT} \cdot R_{32} \geq$ absolute value of threshold voltage of PMOS transistor MP32, I comp2 flows.

In the correction circuit 20-1, at or higher than the threshold temperature $T_1$ at which the relation $I_{PTAT} \cdot R_{31} \geq$ absolute value of threshold voltage of PMOS transistor MP31 is satisfied, Icomp1 is generated. Similarly, in the correction circuit 20-2, at or higher than the threshold temperature $T_2$ at which the relation $I_{PTAT} \cdot R_{32} \geq$ absolute value of threshold voltage of PMOS transistor MP32 is satisfied, Icomp2 is generated. As a result, the final correction current Icomp is the sum of Icomp1 and Icomp2. The final correction current Icomp is similar to that in the cases of FIGS. 15B and 20B. To set the threshold temperatures $T_1$ and $T_2$ as different values, different $R_{31}$ and $R_{32}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

The graph of the final reference voltage $V_{BGR}$ is similar to that in the cases of FIGS. 15C and 20C. Specifically, the graph has a shape having valleys in two places around the temperatures $T_1$ and $T_2$ and apexes of a mountain in three places, sandwiching the valleys. That is, in a manner similar to the cases of FIGS. 15C and 20C, as compared with the reference voltage $V_{BGR}$ in FIGS. 2B and 2C, a change in the reference voltage $V_{BGR}$ with respect to temperature can be decreased in a relatively wide range (particularly, on the high temperature side of the mountain apex of the original reference voltage $V_{BGR}$). That is, the precision of the reference voltage $V_{BGR}$ can be further increased. As compared with the case of the fourth embodiment, the circuit configuration can be simplified.

Modification

Next, a modification of the concrete circuit configuration of the voltage generation circuit according to the fifth embodiment will be described.

Figure 22:
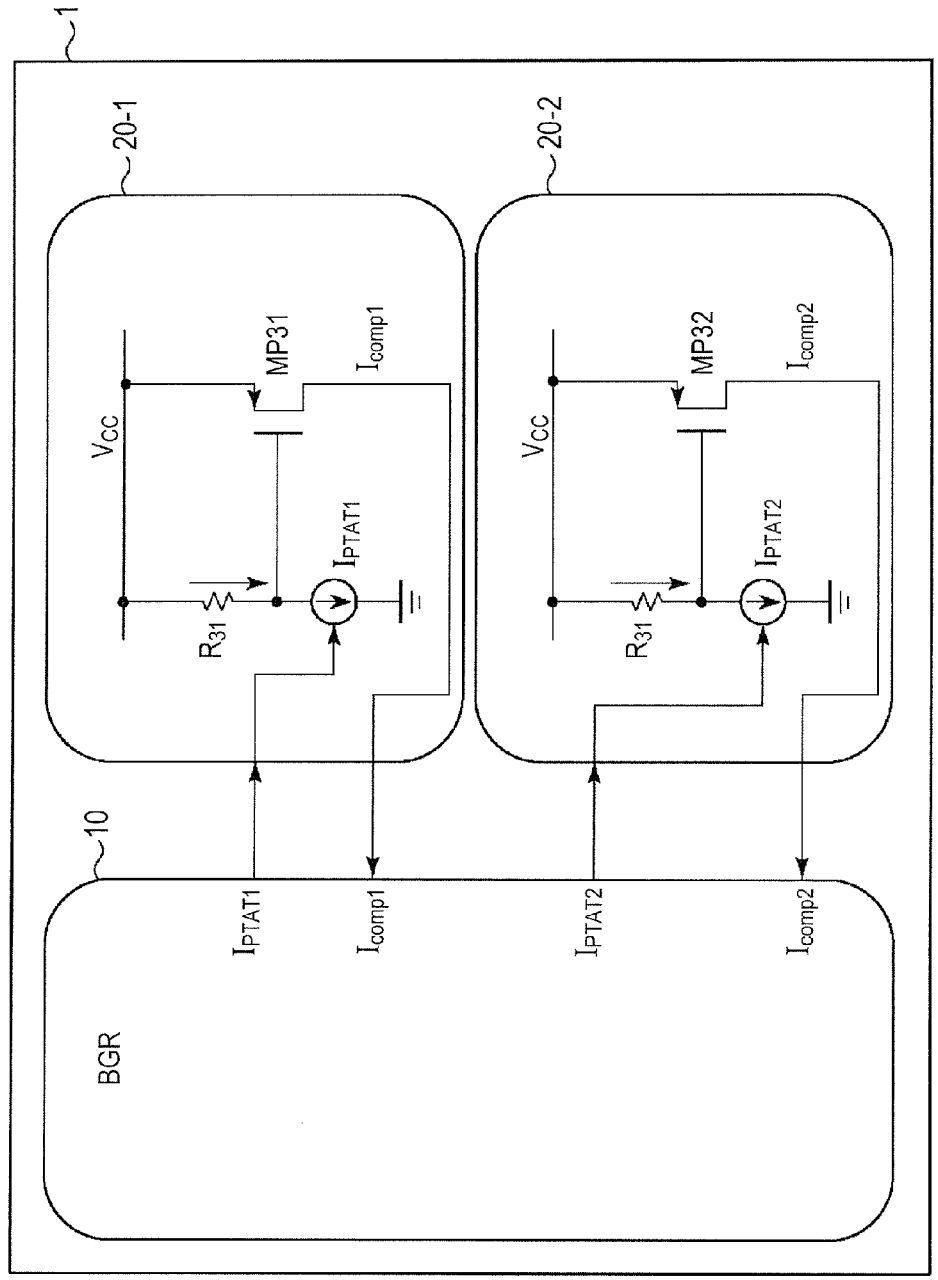
FIG. 22 is a circuit diagram illustrating a modification of the concrete circuit configuration of the voltage generation circuit according to the fifth embodiment.

FIG. 22 is a circuit diagram illustrating a modification of the concrete circuit configuration of the voltage generation circuit 1 according to the fifth embodiment. In the voltage generation circuit 1 of FIG. 21, in the correction circuits 20-1 and 20-2, the same current is used as the current $I_{PTAT}$ and different resistors are used as the resistor $R_3$. In the voltage generation circuit 1 of FIG. 22, however, in the correction circuits 20-1 and 20-2, different currents are used as the current $I_{PTAT}$ and the same resistors are used as the resistor $R_3$. Hereinafter, the point different from the case of FIG. 21 will be mainly described.

The BGR core circuit 10 generates $I_{PTAT1}$ and $I_{PTAT2}$ as currents according to the difference voltage ($\Delta V_{BE}$) of the base-emitter voltages of the two bipolar transistors having different emitter areas, and outputs the generated currents to the correction circuit 20. The other functions and configuration of the BGR core circuit 10 are similar to those of the case of FIG. 21. The concrete configuration of the BGR core circuit 10 is as illustrated in FIGS. 16 to 18.

The correction circuit 20-1 generates a correction current Icomp1 on the basis of the current $I_{PTAT1}$ and the resistor R and makes the correction current Icomp1 fed back to the current generation unit 101. Similarly, the correction circuit 20-2 generates a correction current Icomp2 on the basis of the current $I_{PTAT2}$ and the resistor R and makes the correction current Icomp2 fed back to the current generation unit 101.

The correction circuits 20-1 and 20-2 use, opposite to the case of FIG. 21, the constant current supplies $I_{PTAT1}$ and $I_{PTAT2}$ which are different from each other, and the same resistors $R_{31}$. The others are similar to those of the case of FIG. 21. As a result, in the correction circuit 20-1, the gate voltage of the PMOS transistor MP31 is controlled by the voltage according to the resistor $R_{31}$ and the constant current supply $I_{PTAT1}$, and the correction current Icomp1 is output from the drain terminal. In the case where $I_{PTAT1} \cdot R_{31} \geq$ the absolute value of threshold voltage of the PMOS transistor MP31, I comp1 flows. In the correction circuit 20-2, the gate voltage of the PMOS transistor MP32 is controlled by the voltage according to the resistor $R_{31}$ and the constant current supply $I_{PTAT2}$, and the correction current Icomp2 is output from the drain terminal. In the case where $I_{PTAT2} \cdot R_{31} \geq$ the absolute value of threshold voltage of the PMOS transistor MP32, I comp2 flows.

In the correction circuit 20-1, Icomp is generated at or higher than the threshold temperature $T_1$ at which $I_{PTAT1} \cdot R_{31} \geq$ the absolute value of the threshold voltage of the PMOS transistor MP31 is satisfied. In the correction circuit 20-2, Icomp2 is generated at or higher than the threshold temperature $T_2$ at which $I_{PTAT2} \cdot R_{31} \geq$ the absolute value of the threshold voltage of the PMOS transistor MP32 is satisfied. As a result, the final correction current Icomp is the sum of Icomp1 and Icomp2. The final correction current Icomp is similar to that in the cases of FIGS. 15B and 20B. To set the threshold temperatures $T_1$ and $T_2$ as different values, the different currents $I_{PTAT1}$ and $I_{PTAT2}$ are used in the correction circuits 20-1 and 20-2.

In a manner similar to the case of FIG. 21, the BGR core circuit 10 adds the final correction current Icomp and the current corresponding to the reference voltage $V_{BGR}$ to generate the final reference voltage $V_{BGR}$. The graph of the final reference voltage $V_{BGR}$ is similar to that in the cases of FIGS. 15C and 20C.

In the embodiment, also in the case of the voltage generation circuit 1 of FIG. 22, effects similar to those in the case of FIG. 21 can be obtained.

Sixth Embodiment

A semiconductor device according to a sixth embodiment will be described. In the sixth embodiment, the case where the correction circuit 20 generates a correction current Icomp on the basis of current according to the difference voltage $\Delta V_{BE}$ of base-emitter voltages of two bipolar transistors having different emitter areas and current according to the base-emitter voltage $V_{BE}$ of a bipolar transistor predetermined constant current and corrects the low-temperature side of the reference voltage $V_{BGR}$ with the correction current Icomp will be described. In the embodiment, the number of the correction circuits 20 is plural. In other words, the sixth embodiment is different from the fourth embodiment with respect to the point that the low-temperature side is corrected. In the following, the point different from the fourth embodiment will be mainly described.

The voltage generation circuit of the sixth embodiment is the voltage generation circuit as illustrated in FIG. 3 and performs correction on the low-temperature side as illustrated in FIGS. 5A to 5E. Obviously, it can be applied also to the case where the number of the correction circuit 20 is one as long as a technical contradiction does not occur.

Figure 23:
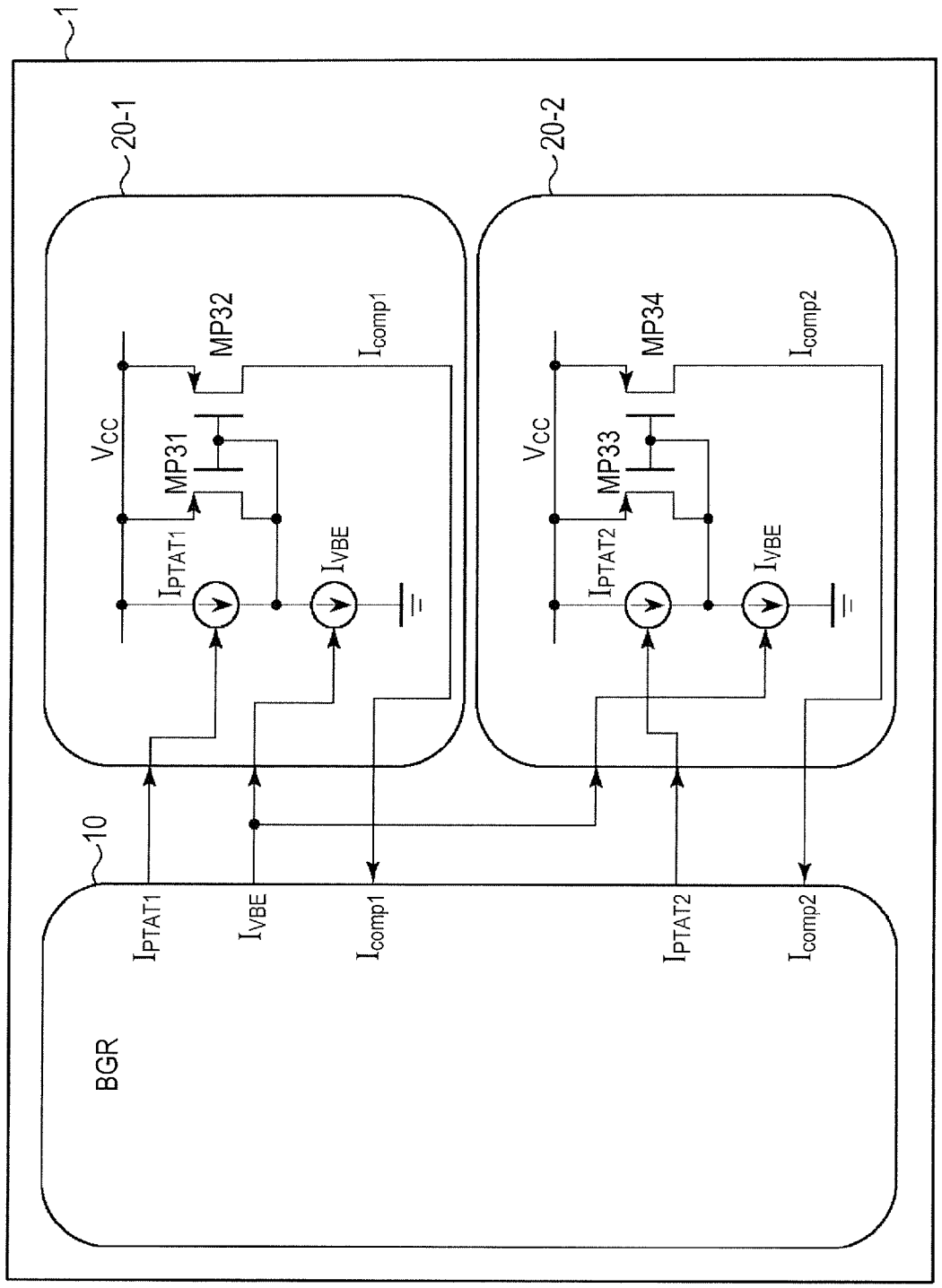
FIG. 23 is a circuit diagram illustrating an example of a concrete circuit configuration of a voltage generation circuit according to a sixth embodiment.

FIG. 23 is a circuit diagram illustrating an example of the concrete circuit configuration of the voltage generation circuit 1 according to the sixth embodiment.

The BGR core circuit 10 is similar to that in the case of FIG. 14. As the BGR core circuit 10, for example, the circuits in FIGS. 16 to 18 can be used.

The correction circuit 20-1 generates a correction current Icomp1 on the basis of the currents $I_{PTAT1}$ and $I_{VBE}$ and makes the correction current Icomp1 fed back to the current generation unit 101. Similarly, the correction circuit 20-2 generates a correction current Icomp2 on the basis of the currents $I_{PTAT2}$ and $I_{VBE}$ and makes the correction current Icomp2 fed back to the current generation unit 101.

The correction circuit 20-1 has, for example, the constant current supply $I_{PTAT1}$ the constant current supply $I_{VBE}$, and the P-channel-type MOS transistors MP31 and MP32. The P-channel-type MOS transistor MP6 which is illustrated in FIG. 7 is not illustrated in FIG. 23. One end of the constant current supply $I_{PTAT1}$ is coupled to the power supply node Vcc so as to pass the constant current $I_{PTAT1}$ from the power supply node Vcc toward the ground node on the basis of the current $I_{PTAT1}$ from the BGR core circuit 10. One end of the constant current supply $I_{VBE}$ is coupled to the other end of the constant current supply $I_{PTAT1}$ and the other end is coupled to the ground node so as to pass the constant current $I_{VBE}$ from the power supply node Vcc toward the ground node on the basis of the current $I_{VBE}$ from the BGR core circuit 10. The PMOS transistor MP31 has the source terminal to which the power supply node Vcc is coupled and has the drain terminal to which the gate terminal and the connection node of the constant current supply $I_{PTAT1}$ and the constant current supply $I_{VBE}$ are coupled. The PMOS transistor MP32 has the source terminal to which the power supply node Vcc is coupled and has the gate terminal to which the gate terminal of the PMOS transistor MP31 is coupled. The PMOS transistors MP31 and MP32 configure a current mirror circuit. The current mirror circuit outputs the correction current Icomp1 from the drain terminal of the PMOS transistor MP32 in accordance with the difference current ($\Delta I1 = I_{VBE} - I_{PTAT1}$) flowing in the connection node between the constant current supply $I_{PTAT1}$ and the constant current supply $I_{VBE}$. In the case where $\Delta I1 \geq 0$, that is, $I_{VBE} \geq I_{PTAT1}$, $\Delta I1 = $Icomp1 flows.

The correction circuit 20-2 has, for example, the constant current supply $I_{PTAT2}$ the constant current supply $I_{VBE}$, and the P-channel-type MOS transistors MP33 and MP34. The P-channel-type MOS transistor MP6 which is illustrated in FIG. 7 is not illustrated in FIG. 23. One end of the constant current supply $I_{PTAT2}$ is coupled to the power supply node Vcc so as to pass the constant current $I_{PTAT2}$ from the power supply node Vcc toward the ground node on the basis of the current $I_{PTAT2}$ from the BGR core circuit 10. One end of the constant current supply $I_{VBE}$ is coupled to the other end of the constant current supply $I_{PTAT2}$ and the other end is coupled to the ground node so as to pass the constant current $I_{VBE}$ from the power supply node Vcc toward the ground node on the basis of the current $I_{VBE}$ from the BGR core circuit 10. The PMOS transistor MP33 has the source terminal to which the power supply node Vcc is coupled and has the drain terminal to which the gate terminal and the connection node of the constant current supply $I_{PTAT2}$ and the constant current supply $I_{VBE}$ are coupled. The PMOS transistor MP34 has the source terminal to which the power supply node Vcc is coupled and has the gate terminal to which the gate terminal of the PMOS transistor MP33 is coupled. The PMOS transistors MP33 and MP34 configure a current mirror circuit. The current mirror circuit outputs the correction current Icomp2 from the drain terminal of the PMOS transistor MP34 in accordance with the difference current ($\Delta I2 = I_{VBE} - I_{PTAT2}$) flowing in the connection node between the constant current supply $I_{PTAT2}$ and the constant current supply $I_{VBE}$. In the case where $\Delta I2 \geq 0$, that is, $I_{VBE} \geq I_{PTAT2}$, $\Delta I2 = $Icomp2 flows.

The principle of a method of correcting a nonlinear temperature characteristic in the voltage generation circuit 1 in the case of FIG. 23 will be described. The relations of the currents $I_{PTAT1}$, $I_{PTAT2}$, and $I_{VBE2}$ supplied to the correction circuits 20-1 and 20-2 are as illustrated in FIG. 15A. The positional relation of the voltage generation circuit 1 in the case of FIG. 23 with the constant current supplies $I_{PTAT2}/I_{PTAT1}$ and the constant current supply $I_{VBE}$ is opposite to that of the voltage generation circuit 1 in the case of FIG. 14. Consequently, as described above, in the correction circuit 20-1, in a temperature range lower than the threshold temperature $T_1$ at which $\Delta I1 \geq 0$, that is, $I_{VBE} \geq I_{PTAT1}$, $\Delta I1 = $Icomp1 flows. At this time, Icomp1 monotonously increases from the threshold temperature. $T_1$ toward the low-temperature side. Similarly, in the correction circuit 20-2, in a temperature range lower than the threshold temperature $T_2$ at which $\Delta I2 \geq 0$, that is, $I_{VBE} \geq I_{PTAT2}$, $\Delta I2 = $Icomp2 flows. At this time, Icomp2 monotonously increases from the threshold temperature $T_2$ toward the low-temperature side. As a result, the final correction current Icomp becomes the sum of Icomp1 and Icomp2. To set the threshold temperatures $T_1$ and $T_2$ as different values, the different currents $I_{PTAT1}$ and $I_{PTAT2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

The graph of the final reference voltage $V_{BGR}$ has a shape having valleys in two places around the temperatures $T_1$ and $T_2$ and apexes of a mountain in three places sandwiching the valleys. The relation $T_1 < T_2$ is satisfied. That is, as compared with the reference voltage $V_{BGR}$ in FIGS. 2B and 2C, a change in the reference voltage $V_{BGR}$ with respect to temperature can be decreased in a relatively wide range (particularly, on the low-temperature side of the mountain apex of the original reference voltage $V_{BGR}$). That is, the precision of the reference voltage $V_{BGR}$ can be further increased.

Modification

Next, a modification of the concrete circuit configuration of the voltage generation circuit according to the sixth embodiment will be described.

Figure 24:
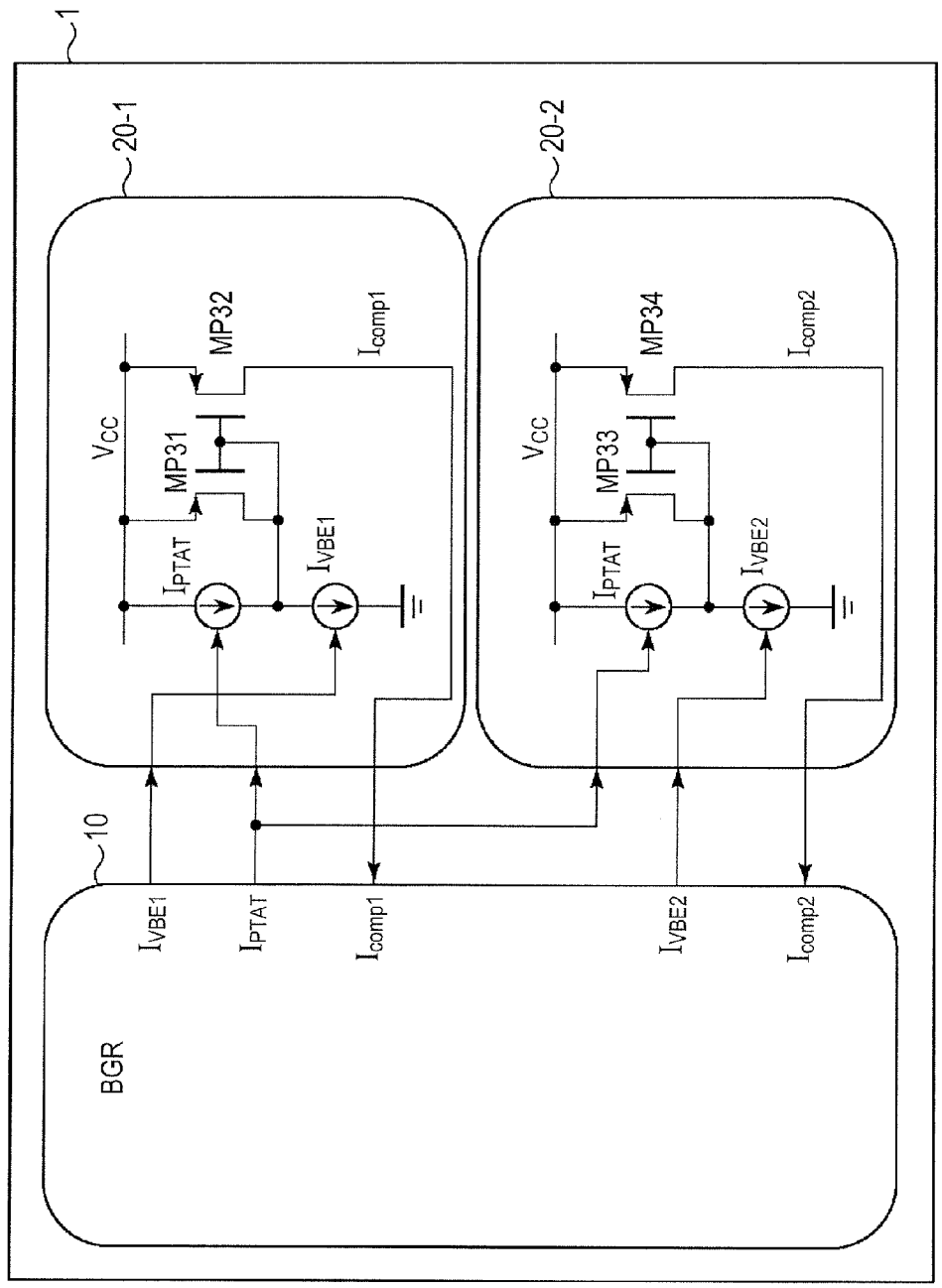
FIG. 24 is a circuit diagram illustrating a modification of the concrete circuit configuration of the voltage generation circuit according to the sixth embodiment.

FIG. 24 is a circuit diagram illustrating a modification of the concrete circuit configuration of the voltage generation circuit 1 according to the sixth embodiment. In the voltage generation circuit 1 of FIG. 23, in the correction circuits 20-1 and 20-2, the same current is used as the current $I_{VBE}$ and different currents are used as the current $I_{PTAT}$. In the voltage generation circuit 1 of FIG. 24, however, in the correction circuits 20-1 and 20-2, different currents are used as the current $I_{VBE}$ and the same current is used as the current $I_{PTAT}$. Hereinafter, the point different from the case of FIG. 23 will be mainly described.

The BGR core circuit 10 is similar to that in the case of FIG. 19. As the BGR core circuit 10, for example, the circuits of FIGS. 16 to 18 can be used.

The correction circuit 20-1 generates the correction current Icompi on the basis of the current $I_{PTAT}$ and the current $I_{VBE1}$ and makes the correction current Icomp1 fed back to the current generation unit 101. Similarly, the correction circuit 20-2 generates a correction current Icomp2 on the basis of the current $I_{PTAT}$ and the current $I_{VBE2}$ and makes the correction current Icomp2 fed back to the current generation unit 101.

The correction circuits 20-1 and 20-2 use, opposite to the case of FIG. 23, the constant current supplies $I_{VBE1}$ and $I_{VBE2}$ which are different from each other, and the same constant current supply $I_{PTAT}$. The others are similar to those of the case of FIG. 23. As a result, in the correction circuit 20-1, a current mirror circuit comprised of the PMOS transistors MP31 and MP32 outputs the correction current Icompi from the drain terminal of the PMOS transistor MP32 in accordance with the difference current ($\Delta I1 = I_{VBE1} - I_{PTAT}$) flowing in the connection node between the constant current supplies $I_{PTAT}$ and $I_{VBE1}$. In the case where $\Delta I1 \geq 0$, that is, $I_{VBE1} - I_{PTAT}$ $\Delta I1 = $ Icomp1 flows. On the other hand, in the correction circuit 20-2, a current mirror circuit comprised of the PMOS transistors MP33 and MP34 outputs the correction current Icomp2 from the drain terminal of the PMOS transistor MP34 in accordance with the difference current ($\Delta I2 = I_{VBE2} - I_{PTAT}$) flowing in the connection node between the constant current supplies $I_{PTAT}$ and $T_{VBE2}$. In the case where $\Delta I2 \geq 0$, that is, $I_{VBE2} \geq I_{PTAT}$, $\Delta I2 = $ Icomp2 flows.

Next, the principle of a method of correcting a nonlinear temperature characteristic in the voltage generation circuit 1 in the case of FIG. 24 will be described. The relations of the currents $I_{PTAT}$, $I_{VBE1}$, and $I_{VBE2}$ supplied to the correction circuits 20-1 and 20-2 are as illustrated in FIG. 20A. The positional relation of the voltage generation circuit 1 in the case of FIG. 24 with the constant current supplies $I_{PTAT}$ and $I_{VBE1}/I_{VBE2}$ is opposite to that of the voltage generation circuit 1 in the case of FIG. 19. Consequently, as described above, in the correction circuit 20-1, in a temperature range lower than the threshold temperature $T_1$ at which $\Delta I1 \geq 0$, that is, $I_{VBE1} \geq I_{PTAT}$, $\Delta I1 = $ Icomp1 flows. At this time, Icomp1 monotonously increases from the threshold temperature $T_1$ toward the low-temperature side. Similarly, in the correction circuit 20-2, in a temperature range lower than the threshold temperature $T_2$ at which $\Delta I2 \geq 0$, that is, $I_{VBE2} \geq I_{PTAT}$, $\Delta I2 = $ Icomp2 flows. At this time, Icomp2 monotonously increases from the threshold temperature $T_2$ toward the low-temperature side. As a result, the final correction current Icomp becomes the sum of Icomp1 and Icomp2. To set the threshold temperatures $T_1$ and $T_2$ as different values, the different currents $I_{VBE1}$ and $I_{VBE2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

Also in the voltage generation circuit 1 of FIG. 24 in the sixth embodiment, effects similar to those of the voltage generation circuit 1 of FIG. 23 can be obtained.

Seventh Embodiment

A semiconductor device according to a seventh embodiment will be described. In the seventh embodiment, the case where the correction circuit 20 generates a correction current Icomp on the basis of current according to the difference voltage $\Delta V_{BE}$ of base-emitter voltages of two bipolar transistors having different emitter areas and resistance and corrects the low-temperature side of the reference voltage $V_{BGR}$ with the correction current Icomp will be described. In the embodiment, the number of the correction circuits 20 is plural. In other words, the seventh embodiment is different from the fifth embodiment with respect to the point that the low-temperature side is corrected. In the following, the point different from the fifth embodiment will be mainly described.

The voltage generation circuit of the seventh embodiment is the voltage generation circuit as illustrated in FIG. 3 and performs correction on the low-temperature side as illustrated in FIGS. 5A to 5E. Obviously, it can be applied also to the case where the number of the correction circuit 20 is one as long as a technical contradiction does not occur.

Figure 25:
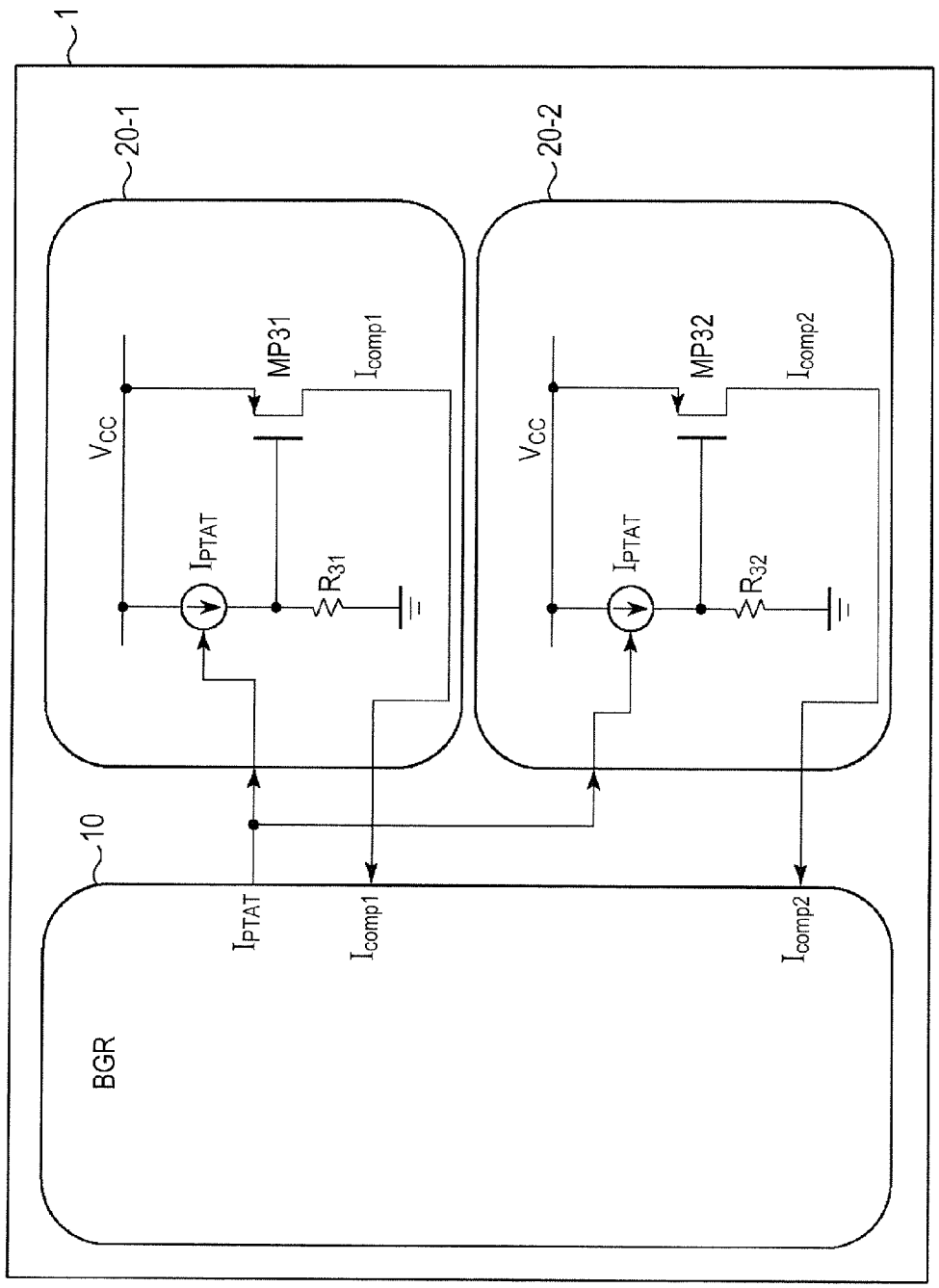
FIG. 25 is a circuit diagram illustrating an example of a concrete circuit configuration of a voltage generation circuit according to a seventh embodiment.

FIG. 25 is a circuit diagram illustrating an example of the concrete circuit configuration of the voltage, generation circuit 1 according to the seventh embodiment.

The BGR core circuit 10 is similar to that in the case of FIG. 21. As the BGR core circuit 10, for example, the circuits in FIGS. 16 to 18 can be used.

The correction circuit 20-1 generates a correction current Icomp1 on the basis of the resistance R and the current $I_{PTAT}$ and makes the correction current Icomp1 fed back to the current generation unit 101. Similarly, the correction circuit 20-2 generates a correction current Icomp2 on the basis of the current $I_{PTAT}$ and the resistance R and makes the correction current Icomp2 fed back to the current generation unit 101.

The correction circuit 20-1 has, for example, the constant current supply $I_{PTAT}$, the resistor $R_{31}$, and the P-channel-type MOS transistor MP31. The P-channel-type MOS transistor MP6 which is illustrated in FIG. 7 is not illustrated in FIG. 25. One end of the constant current supply $I_{PTAT}$ is coupled to the power supply node Vcc so as to pass the constant current $I_{PTAT}$ from the power supply node Vcc toward the ground node on the basis of the current $I_{PTAT}$ from the BGR core circuit 10, and the other end is coupled to the resistor $R_{31}$. One end of the resistor $R_{31}$ is coupled to the other end of the constant current supply $I_{PTAT}$ and the other end is coupled to the ground node so as to pass a current according to a voltage applied. The PMOS transistor MP31 has the source terminal to which the power supply node Vcc is coupled and has the gate terminal to which the connection node of the constant current supply $I_{PTAT}$ and the resistor $R_{31}$ is coupled. The gate voltage of the PMOS transistor MP31 is controlled by a voltage according to the constant current supply $I_{PTAT}$ and the resistor $R_{31}$ and the PMOS transistor MP31 outputs the correction current Icomp1 from the drain terminal. In the case where "absolute value of threshold voltage of the PMOS transistor MP31" $\geq$ Vcc$-I_{PTAT} \cdot R_{31}$, Icomp1 flows.

The correction circuit 20-2 has, for example, the constant current supply $I_{PTAT}$, the resistor $R_{32}$, and the P-channel-type MOS transistor MP32. The P-channel-type MOS transistor MP6 which is illustrated in FIG. 7 is not illustrated in FIG. 25. One end of the constant current supply $I_{PTAT}$ is coupled to the power supply node Vcc so as to pass the constant current $I_{PTAT}$ from the power supply node Vcc toward the ground node on the basis of the current $I_{PTAT}$ from the BGR core circuit 10, and the other end is coupled to one end of the resistor $R_{32}$. One end of the resistor $R_{32}$ is coupled to the constant current supply $I_{PTAT}$ and the other end is coupled to the ground node so as to pass a current according to a voltage applied. The PMOS transistor MP32 has the source terminal to which the power supply node Vcc is coupled and has the gate terminal to which the connection node of the constant current supply $I_{PTAT}$ and the resistor $R_{32}$ is coupled. The gate voltage of the PMOS transistor MP32 is controlled by a voltage according to the constant current supply $I_{PTAT}$ and the resistor $R_{32}$ and the PMOS transistor MP32 outputs the correction current Icomp2 from the drain terminal. In the case where "absolute value of threshold voltage of the PMOS transistor MP32"≥Vcc−$I_{PTAT}$·$R_{32}$, Icomp2 flows.

In the correction circuit 20-1, at or lower than the threshold temperature $T_1$ at which "absolute value of threshold Voltage of the PMOS transistor MP31)≥Vcc−$I_{PTAT}$·$R_{31}$, Icomp1 is generated. At this time, Icomp1 monotonously increases from the threshold temperature $T_1$ toward the low-temperature side. Similarly, in the correction circuit 20-2, at or lower than the threshold temperature $T_2$ at which "absolute value of threshold voltage of the PMOS transistor MP32)≥Vcc−$I_{PTAT}$·$R_{32}$, Icomp2 is generated. At this time, Icomp2 monotonously increases from the threshold temperature $T_2$ toward the low-temperature side. As a result, the final correction current Icomp becomes the sum of Icomp1 and Icomp2. To set the threshold temperatures $T_1$ and $T_2$ as different values, the different resistors $R_{31}$ and $R_{32}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

The graph of the final reference voltage $V_{BGR}$ has a shape having valleys in two places around the temperatures $T_1$ and $T_2$ and apexes of a mountain in three places sandwiching the valleys. The relation $T_1<T_2$ is satisfied. That is, as compared with the reference voltage $V_{BGR}$ in FIGS. 2B and 2C, a change in the reference voltage $V_{BGR}$ with respect to temperature can be decreased in a relatively wide range (particularly, on the low-temperature side of the mountain apex of the original reference voltage $V_{BGR}$). That is, the precision of the reference voltage $V_{BGR}$ can be further increased.

Modification

Next, a modification of the concrete circuit configuration of the voltage generation circuit according to the seventh embodiment will be described.

Figure 26:
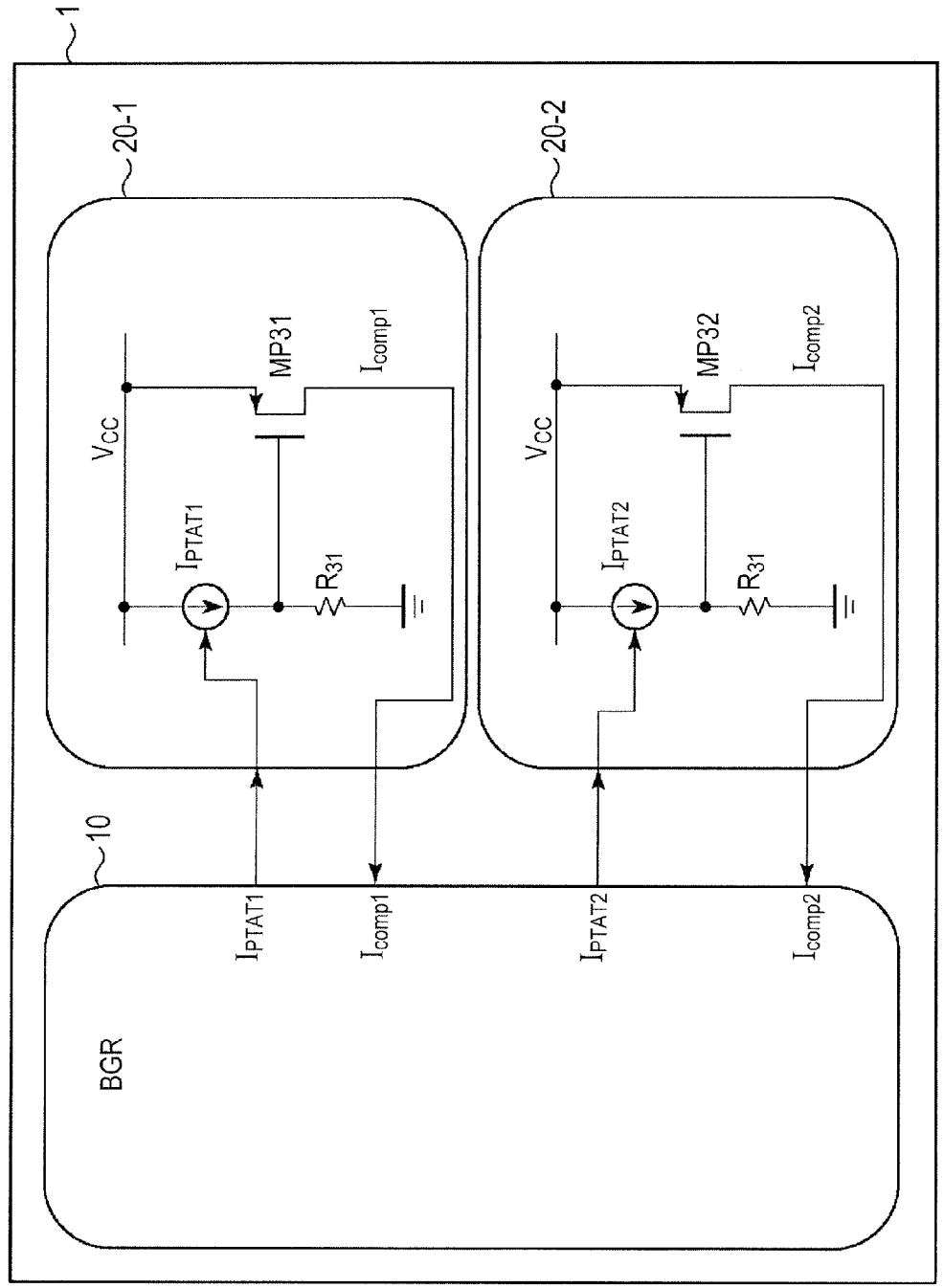
FIG. 26 is a circuit diagram illustrating a modification of the concrete circuit configuration of the voltage generation circuit according to the seventh embodiment.

FIG. 26 is a circuit diagram illustrating a modification of the concrete circuit configuration of the voltage generation circuit 1 according to the seventh embodiment. In the voltage generation circuit 1 of FIG. 25, in the correction circuits 20-1 and 20-2, the same current is used as the current $I_{PTAT}$ and different resistors are used as the resistor $R_3$. In the voltage generation circuit 1 of FIG. 26, however, in the correction circuits 20-1 and 20-2, different currents are used as the current $I_{PTAT}$ and the same resistors are used as the resistor $R_3$. Hereinafter, the point different from the case of FIG. 24 will be mainly described.

The BGR core circuit 10 is similar to that in the case of FIG. 22. As the BGR core circuit 10, for example, the circuits of FIGS. 16 to 18 can be used.

The correction circuit 20-1 generates the correction current Icomp1 on the basis of the resistance R and the current $I_{PTAT1}$ and makes the correction current Icomp1 fed back to the current generation unit 101. Similarly, the correction circuit 20-2 generates a correction current Icomp2 on the basis of the resistance R and the current $I_{PTAT2}$ and makes the correction current Icomp2 fed back to the current generation unit 101.

The correction circuits 20-1 and 20-2 use, opposite to the case of FIG. 25, the constant current supplies $I_{PTAT1}$ and $I_{PTAT2}$ which are different from each other, and the same resistors $R_{31}$. The others are similar to those of the case of FIG. 25. As a result, in the correction circuit 20-1, the gate voltage of the PMOS transistor MP31 is controlled by a voltage according to the constant current supply $I_{PTAT1}$ and the resistor $R_{31}$ and the PMOS transistor MP31 outputs the correction current Icomp1 from the drain terminal. In the case where "absolute value of threshold voltage of the PMOS transistor MP31"≥Vcc−$I_{PTAT1}$·$R_{31}$ Icomp1 flows. In the correction circuit 20-2, the gate voltage of the PMOS transistor MP32 is controlled by a voltage according to the constant current supply $I_{PTAT2}$ and the resistor $R_{31}$ and the PMOS transistor MP32 outputs the correction current Icomp2 from the drain terminal. In the case where "absolute value of threshold voltage of the PMOS transistor MP32"≥Vcc−$I_{PTAT2}$·$R_{31}$, Icomp2 flows.

In the correction circuit 20-1, at or lower than the threshold temperature $T_1$ at which "absolute value of threshold voltage of the PMOS transistor MP31)≥Vcc−$I_{PTAT1}$·$R_{31}$, Icomp1 is generated. At this time, Icomp1 monotonously increases from the threshold temperature $T_1$ toward the low-temperature side. Similarly, in the correction circuit 20-2, at or lower than the threshold temperature $T_2$ at which "absolute value of threshold voltage of the PMOS transistor MP32)≥Vcc−$I_{PTAT2}$·R31, Icomp2 is generated. At this time, Icomp2 monotonously increases from the threshold temperature $T_2$ toward the low-temperature side. As a result, the final correction current Icomp becomes the sum of Icomp1 and Icomp2. To set the threshold temperatures $T_1$ and $T_2$ as different values, the different constant current supplies $I_{PTAT1}$ and $I_{PTAT2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

In the embodiment, also in the voltage generation circuit 1 of FIG. 26, effects similar to those of the voltage generation circuit of FIG. 25 can be obtained.

Eighth Embodiment

A semiconductor device according to an eighth embodiment will be described. In the eighth embodiment, the case where the correction circuit 20 generates a correction current Icomp on the basis of current according to the difference voltage $\Delta V_{BE}$ of base-emitter voltages of two bipolar transistors having different emitter areas and the base-emitter voltage $V_{BE}$ of the bipolar transistor and corrects the high-temperature side and the low-temperature side of the reference voltage $V_{BGR}$ with the correction current Icomp will be described. In the embodiment, the number of the correction circuits 20 is plural. In other words, the eighth embodiment is different from the fourth and sixth embodiments with respect to the point that correction is performed on both of the high-temperature and low-temperature sides. In the following, the point different from the fourth embodiment will be mainly described.

The voltage generation circuit of the eighth embodiment is the voltage generation circuit as illustrated in FIG. 3 and performs correction on both of the high-temperature and low-temperature sides as illustrated in FIGS. 6A to 6E. Obviously, it can be applied also to the case where the number of the correction circuit 20 is one as long as a technical contradiction does not occur.

Figure 27:
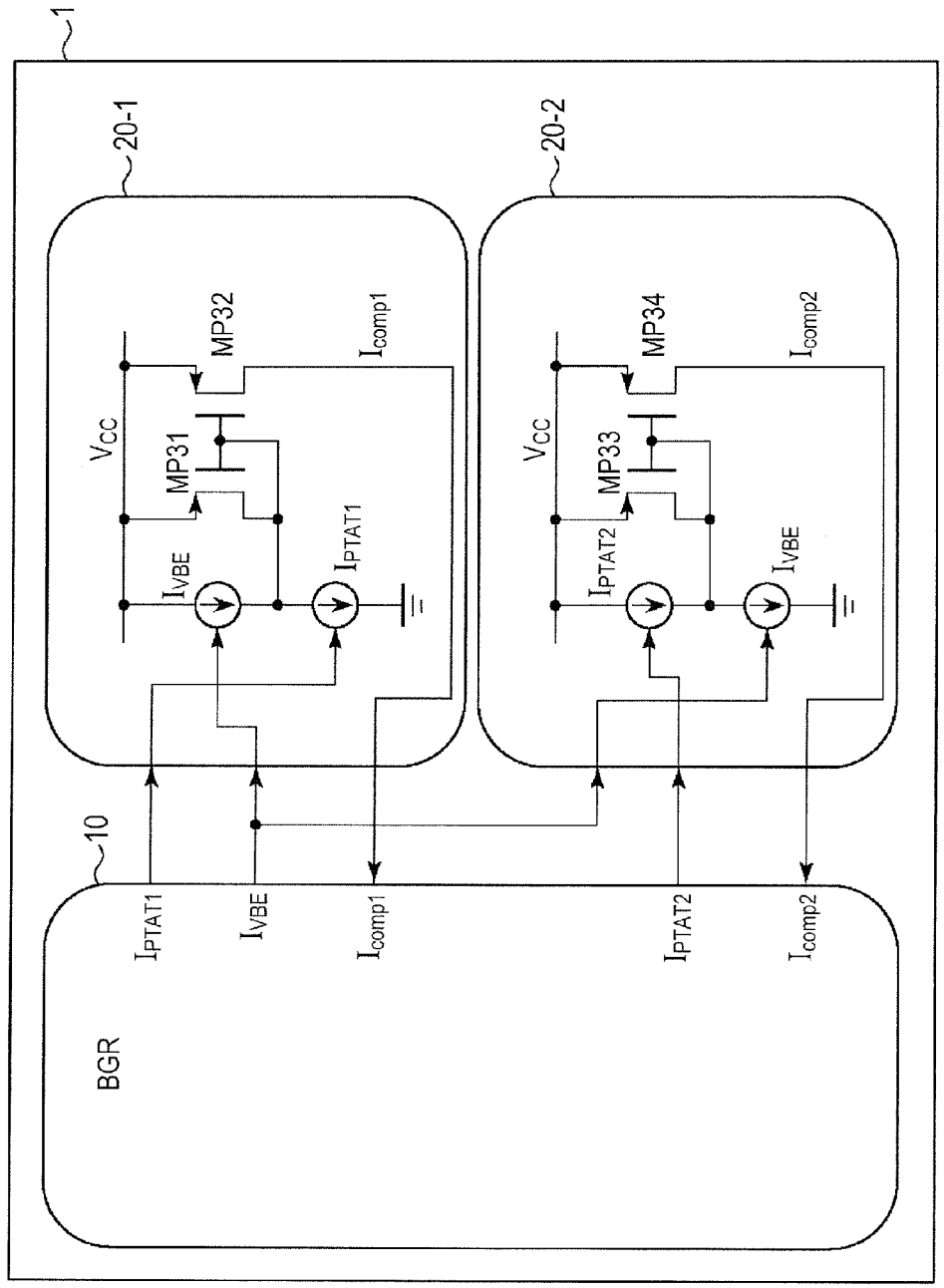
FIG. 27 is a circuit diagram illustrating an example of a concrete circuit configuration of a voltage generation circuit according to an eighth embodiment.

FIG. 27 is a circuit diagram illustrating an example of the concrete circuit configuration of the voltage generation circuit 1 according to the eighth embodiment.

The BGR core circuit 10 is similar to that in the case of FIG. 14. As the BGR core circuit 10, for example, the circuits in FIGS. 16 to 18 can be used.

The correction circuit 20-1 generates a correction current Icomp1 on the basis of the current $I_{VBE}$ and the current $I_{PTAT1}$ and makes the correction current Icomp1 fed back to the current generation unit 101. Similarly, the correction circuit 20-2 generates a correction current Icomp2 on the basis of the current $I_{PTAT2}$ and the current $I_{VBE}$ and makes the correction current Icomp2 fed back to the current generation unit 101.

The correction circuit 20-1 is similar to that in the case of FIG. 14. A current mirror circuit comprised of the PMOS transistors MP31 and MP32 outputs the correction current Icomp1 from the drain terminal of the PMOS transistor MP32 in accordance with the difference current ($\Delta I1 = I_{PTAT1} - I_{VBE}$) flowing in the connection node between the constant current supplies $I_{VBE}$ and $I_{PTAT1}$. In the case where $\Delta I1 \geq 0$, that is, $I_{PTAT1} \geq I_{VBE}$, $\Delta I1 = Icomp1$ flows. On the other hand, the correction circuit 20-2 is similar to that in the case of FIG. 23. A current mirror circuit comprised of the PMOS transistors MP33 and MP34 outputs the correction current Icomp2 from the drain terminal of the PMOS transistor MP34 in accordance with the difference current ($\Delta I2 = I_{VBE} \geq I_{PTAT2}$) flowing in the connection node between the constant current supplies $I_{PTAT2}$ and $I_{VBE}$. In the case where $\Delta I2 \geq 0$, that is, $I_{VBE} \geq I_{PTAT2}$, $\Delta I2 = Icomp2$ flows.

Next, the principle of a method of correcting a nonlinear temperature characteristic in the voltage generation circuit 1 in the case of FIG. 27 will be described. The relations of the currents $I_{PTAT1}$, $I_{PTAT2}$, and $I_{VBE}$ supplied to the correction circuits 20-1 and 20-2 are as illustrated in FIG. 15A. For convenience of explanation, it is assumed that the current $I_{PTAT2}$ and the threshold temperature $T_2$ illustrated in FIG. 15A correspond to the current $I_{PTAT1}$ and the threshold temperature $T_1$ illustrated in FIG. 27, and the current $I_{PTAT1}$ and the threshold temperature $T_1$ illustrated in FIG. 15A correspond to the current $I_{PTAT2}$ and the threshold temperature $T_2$ illustrated in FIG. 27 (the suffixes "1" and "2" are replaced).

In FIG. 27, in the correction circuit 20-1, in a temperature range higher than the threshold temperature $T_1$ at which $I_{PTAT1} \geq I_{VBE}$ is satisfied, $\Delta I1 = Icomp1$ flows. At this time, Icomp1 monotonously increases from the threshold temperature $T_1$ toward the high-temperature side. On the other hand, in FIG. 27, in the correction circuit 20-2, in a temperature range lower than the threshold temperature $T_2$ at which $I_{VBE} \geq I_{PTAT2}$ is satisfied, $\Delta I2 = Icomp2$ flows. At this time, Icomp2 monotonously increases from the threshold temperature $T_2$ toward the low-temperature side. As a result, the final correction current Icomp becomes the sum of Icompi on the high-temperature side and Icomp2 on the low-temperature side. That is, Icomp2 flows in the temperature range lower than the threshold temperature $T_2$, no correction current flows in the temperature range of the threshold temperatures $T_2$ and $T_1$, and Icomp1 flows in the temperature range higher than the threshold temperature $T_1$. To set the threshold temperatures $T_2$ and $T_1$ to be different values, the different currents $I_{PTAT1}$ and $I_{PTAT2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

The graph of the final reference voltage $V_{BGR}$ has a shape having valleys in two places around the temperatures $T_1$ and $T_2$ and apexes of a mountain in three places sandwiching the valleys. The relation $T_2 < T_1$ is satisfied. That is, as compared with the reference voltage $V_{BGR}$ in FIGS. 2B and 2C, a change in the reference voltage $V_{BGR}$ with respect to temperature can be decreased in a relatively wide range (particularly, on both of the high-temperature side and the low-temperature side of the mountain apex of the original reference voltage $V_{BGR}$). That is, the precision of the reference voltage $V_{BGR}$ can be further increased.

Modification

Next, a modification of the concrete circuit configuration of the voltage generation circuit according to the eighth embodiment will be described.

Figure 28:
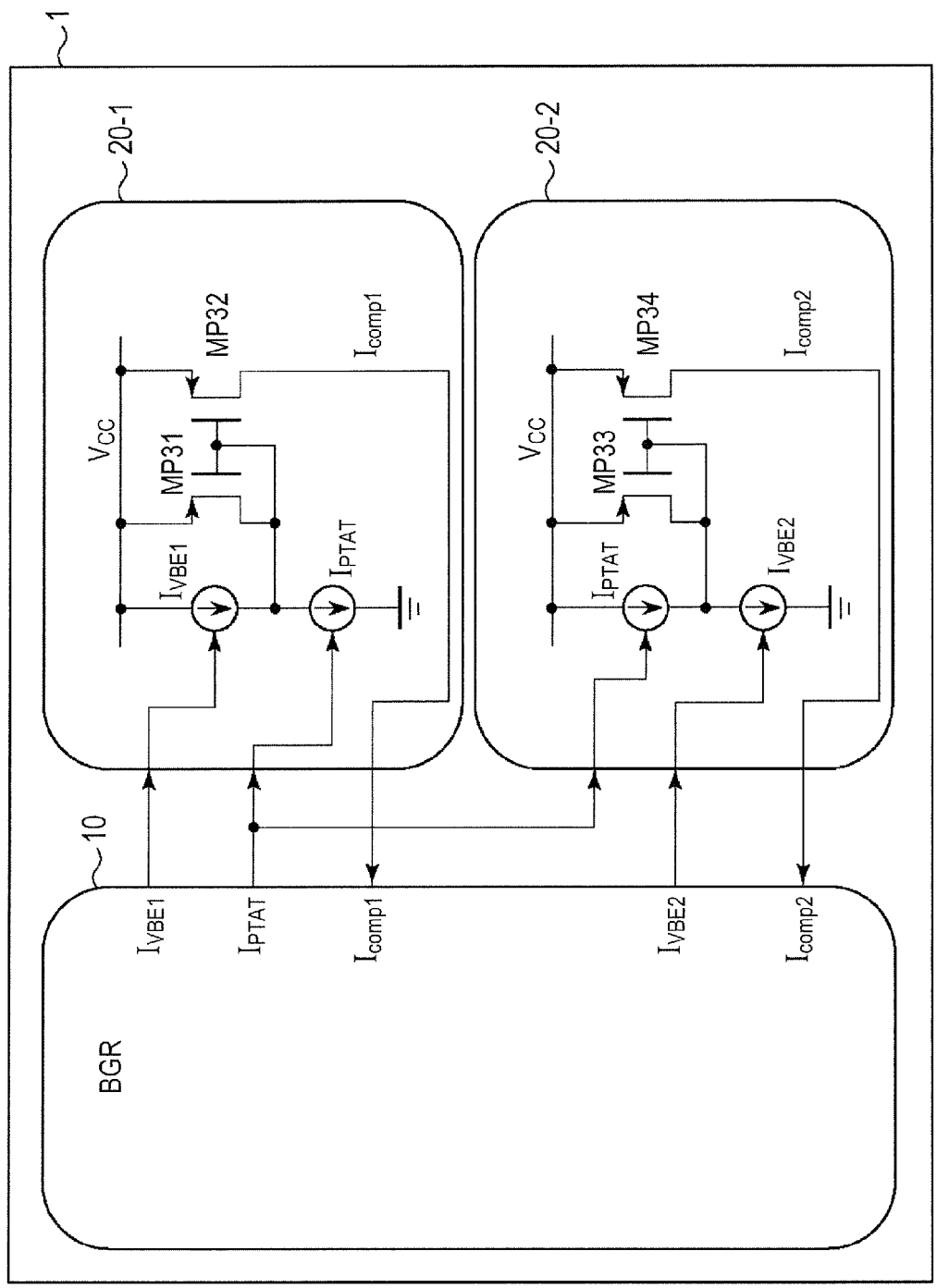
FIG. 28 is a circuit diagram illustrating a modification of the concrete circuit configuration of the voltage generation circuit according to the eighth embodiment.

FIG. 28 is a circuit diagram illustrating another example of the concrete circuit configuration of the voltage generation circuit 1 according to the eighth embodiment. In the voltage generation circuit 1 of FIG. 27, in the correction circuits 20-1 and 20-2, the same current is used as the current $I_{VBE}$ and different resistors are used as the current $I_{PTAT}$. In the voltage generation circuit 1 of FIG. 28, however, in the correction circuits 20-1 and 20-2, different currents are used as the current $I_{VBE}$ and the same current is used as the current $I_{PTAT}$. Hereinafter, the point different from the case of FIG. 27 will be mainly described.

The BGR core circuit 10 is similar to that in the case of FIG. 19. As the BGR core circuit 10, for example, the circuits of FIGS. 16 to 18 can be used.

The correction circuit 20-1 generates the correction current Icomp1 on the basis of the current $I_{VBE1}$ and the current $I_{PTAT}$ and makes the correction current Icomp1 fed back to the current generation unit 101. Similarly, the correction circuit 20-2 generates a correction current Icomp2 on the basis, of the current $I_{PTAT}$ and the current $I_{VBE2}$ and makes the correction current Icomp2 fed back to the current generation unit 101.

The correction circuits 20-1 and 20-2 use, opposite to the case of FIG. 27, the constant current supplies $I_{VBE1}$ and $I_{VBE2}$ which are different from each other, and the same current supply $I_{PTAT}$. The others are similar to those of the case of FIG. 27. That is, the correction circuits 20-1 and 20-2 are similar to those in FIGS. 19 and 24, respectively. As a result, in the correction circuit 20-1, a current mirror circuit comprised of the PMOS transistors MP31 and MP32 outputs the correction current Icomp1 from the drain terminal of the PMOS transistor MP32 in accordance with the difference current ($\Delta I1 = I_{PTAT} - I_{VBE1}$) flowing in the connection node between the constant current supplies $I_{VBE1}$ and $I_{PTAT}$. In the case where $\Delta I1 \geq 0$, that is, $I_{PTAT} \geq I_{VBE1}$, $\Delta I1 = Icomp1$ flows. On the other hand, in the correction circuit 20-2, a current mirror circuit comprised of the PMOS transistors MP33 and MP34 outputs the correction current Icomp2 from the drain terminal of the PMOS transistor MP34 in accordance with the difference current ($\Delta I2 = I_{VBE2} - I_{PTAT}$) flowing in the connection node between the constant current supplies $I_{PTAT}$ and $I_{VBE2}$. In the case where $\Delta I2 \geq 0$, that is, $I_{VBE2} \geq I_{PTAT}$, $\Delta I2 = Icomp2$ flows.

Next, the principle of a method of correcting a nonlinear temperature characteristic in the voltage generation circuit 1 in the case of FIG. 28 will be described. The relations of the currents $I_{PTAT}$, $I_{VBE1}$, and $I_{VBE2}$ supplied to the correction circuits 20-1 and 20-2 are as illustrated in FIG. 20A. For convenience of explanation, it is assumed that the current $I_{VBE2}$ and the threshold temperature $T_2$ illustrated in FIG. 20A correspond to the current $I_{VBE1}$ and the threshold temperature $T_1$ illustrated in FIG. 28, and the current $I_{VBE1}$ and the threshold temperature $T_1$ illustrated in FIG. 20A correspond to the current $I_{VBE2}$ and the threshold temperature $T_2$ illustrated in FIG. 28 (the suffixes "1" and "2" are replaced).

In FIG. 28, in the correction circuit 20-1, in a temperature range higher than the threshold temperature $T_1$ at which $I_{PTAT} \geq I_{VBE1}$ is satisfied, $\Delta I1 = \text{Icomp1}$ flows. At this time, Icomp1 monotonously increases from the threshold temperature $T_1$ toward the high-temperature side. On the other hand, in FIG. 28, in the correction circuit 20-2, in a temperature range lower than the threshold temperature $T_2$ at which $I_{VBE2} \geq I_{PTAT}$ is satisfied, $\Delta I2 = \text{Icomp2}$ flows. At this time, Icomp2 monotonously increases from the threshold temperature $T_2$ toward the low-temperature side. As a result, the final correction current Icomp becomes the sum of Icomp1 on the high-temperature side and Icomp2 on the low-temperature side. That is, Icomp2 flows in the temperature range lower than the threshold temperature $T_2$, no correction current flows in the temperature range of the threshold temperatures $T_2$ and $T_1$, and Icomp1 flows in the temperature range higher than the threshold temperature $T_1$. To set the threshold temperatures $T_2$ and $T_1$ to be different values, the different currents $I_{VBE1}$ and $I_{VBE2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

In the embodiment, also in the voltage generation circuit 1 of FIG. 28, effects similar to those of the voltage generation circuit 1 of FIG. 27 can be obtained.

Ninth Embodiment

A semiconductor device according to a ninth embodiment will be described. In the ninth embodiment, the case where the correction circuit 20 generates a correction current Icomp on the basis of current according to the difference voltage $\Delta V_{BE}$ of base-emitter voltages of two bipolar transistors having different emitter areas and resistance and corrects the high-temperature side and the low-temperature side of the reference voltage $V_{BGR}$ with the correction current Icomp will be described. In the embodiment, the number of the correction circuits 20 is plural. In other words, the ninth embodiment is different from the eighth embodiment with respect to the kinds of currents for generating the correction current Icomp. In the following, the point different from the eighth embodiment will be mainly described.

The voltage generation circuit of the ninth embodiment is the voltage generation circuit as illustrated in FIG. 3 and performs correction on both of the high-temperature and low-temperature sides as illustrated in FIGS. 6A to 6E. Obviously, it can be applied also to the case where the number of the correction circuit 20 is one as long as a technical contradiction does not occur.

Figure 29:
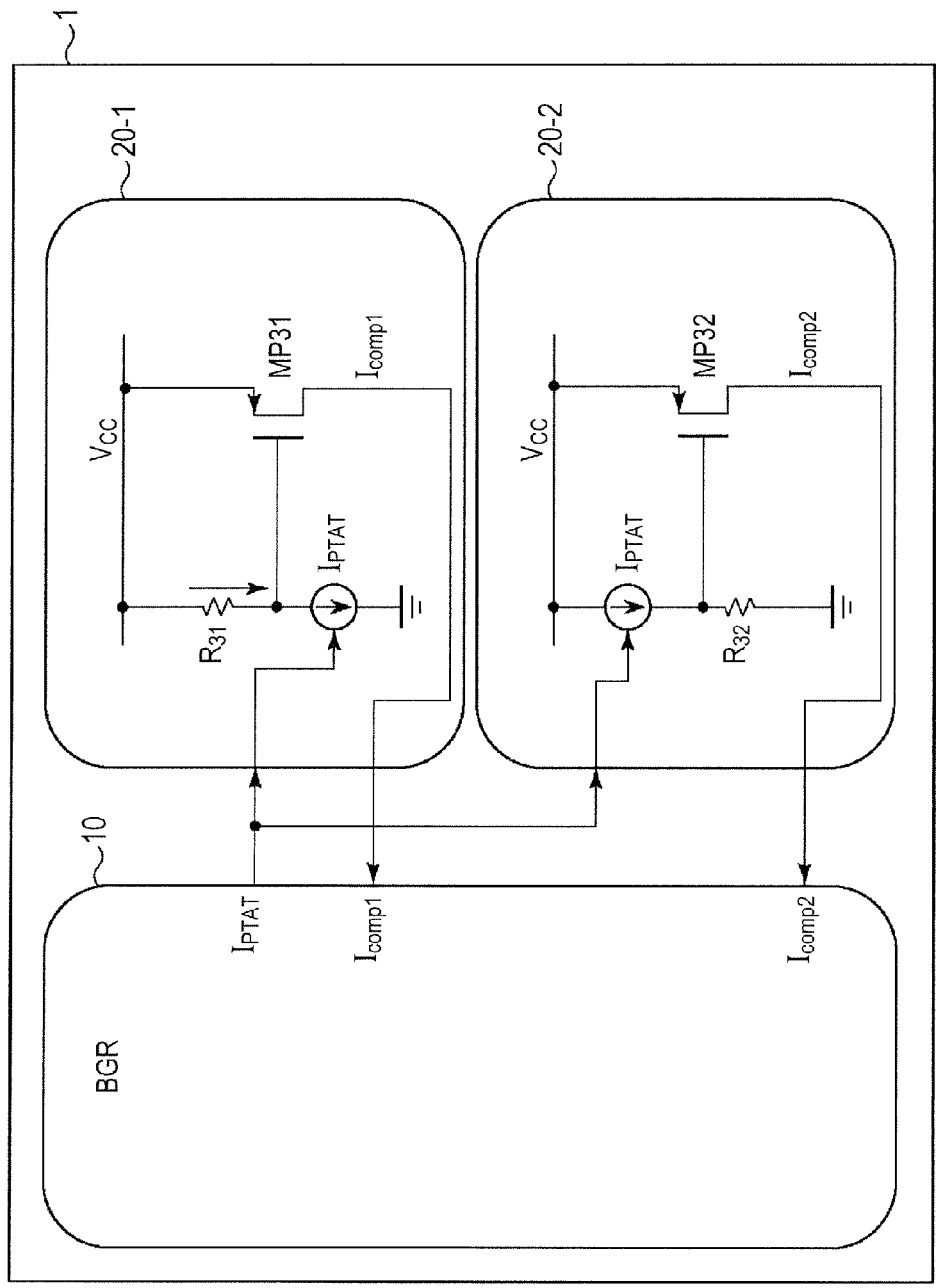
FIG. 29 is a circuit diagram illustrating an example of a concrete circuit configuration of a voltage generation circuit according to a ninth embodiment.

FIG. 29 is a circuit diagram illustrating another example of the concrete circuit configuration of the voltage generation circuit 1.

The BGR core circuit 10 is similar to that in the case of FIG. 21. As the BGR core circuit 10, for example, the circuits in FIGS. 16 to 18 can be used.

The correction circuit 20-1 generates a correction current Icomp1 on the basis of the resistance R and the current $I_{PTAT}$ and makes the correction current Icomp1 fed back to the current generation unit 101. Similarly, the correction circuit 20-2 generates a correction current Icomp2 on the basis of the current $I_{PTAT}$ and the resistance R and makes the correction current Icomp2 fed back to the current generation unit 101.

The correction circuit 20-1 is similar to that in the case of FIG. 21. The gate voltage of the PMOS transistor MP31 is controlled by the voltage according to the constant current supply $I_{PTAT}$ and the resistor $R_{31}$ and the PMOS transistor MP31 outputs the correction current Icomp1 from the drain terminal. In the case where $I_{PTAT} \cdot R_{31} \geq$ "absolute value of threshold voltage of PMOS transistor MP31", Icomp1 flows. On the other hand, the correction circuit 20-2 is similar to that in the case of FIG. 25. The gate voltage of the PMOS transistor MP32 is controlled by the voltage according to the constant current supply $I_{PTAT}$ and the resistor $R_{32}$ and the PMOS transistor MP32 outputs the correction current Icomp2 from the drain terminal. In the case where "absolute value of threshold voltage of PMOS transistor MP32" $\geq$ Vcc$-I_{PTAT} \cdot R_{32}$ Icomp2 flows.

Next, the principle of the method of correcting the non-linear temperature characteristic in the voltage generation circuit 1 in the case of FIG. 29 will be described. In FIG. 29, in the correction circuit 20-1, in a temperature range higher than the threshold temperature $T_1$ at which $I_{PTAT} \cdot R_{31} \geq$ "absolute value of threshold voltage of the PMOS transistor MP31" is satisfied, Icomp1 is generated. At this time, Icomp1 monotonously increases from the threshold temperature $T_1$ toward the high-temperature side. On the other hand, in FIG. 29, in the correction circuit 20-2, in a temperature range lower than the threshold temperature $T_2$ at which "absolute value of threshold voltage of the PMOS transistor MP32 $\geq$ Vcc$-I_{PTAT} \cdot R_{32}$ is satisfied, Icomp2 is generated. At this time, Icomp2 monotonously increases from the threshold temperature $T_2$ toward the low-temperature side. As a result, the final correction current Icomp becomes the sum of Icomp1 on the high-temperature side and Icomp2 on the low-temperature side. That is, Icomp2 flows in the temperature range lower than the threshold temperature $T_2$, no correction current flows in the temperature range of the threshold temperatures $T_2$ and $T_1$, and Icomp1 flows in the temperature range higher than the threshold temperature $T_1$. To set the threshold temperatures $T_2$ and $T_1$ to be different values, the different resistors $R_{31}$ and $R_{32}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

The graph of the final reference voltage $V_{BGR}$ has a shape having valleys in two places around the temperatures $T_1$ and $T_2$ and apexes of a mountain in three places sandwiching the valleys. The relation $T_2 < T_1$ is satisfied. That is, as compared with the reference voltage $V_{BGR}$ in FIGS. 2B and 2C, a change in the reference voltage $V_{BGR}$ with respect to temperature can be decreased in a relatively wide range (particularly, on both of the high-temperature side and the low-temperature side of the mountain apex of the original reference voltage $V_{BGR}$). That is, the precision of the reference voltage $V_{BGR}$ can be further increased.

Modification

Next, a modification of the concrete circuit configuration of the voltage generation circuit according to the ninth embodiment will be described.

Figure 30:
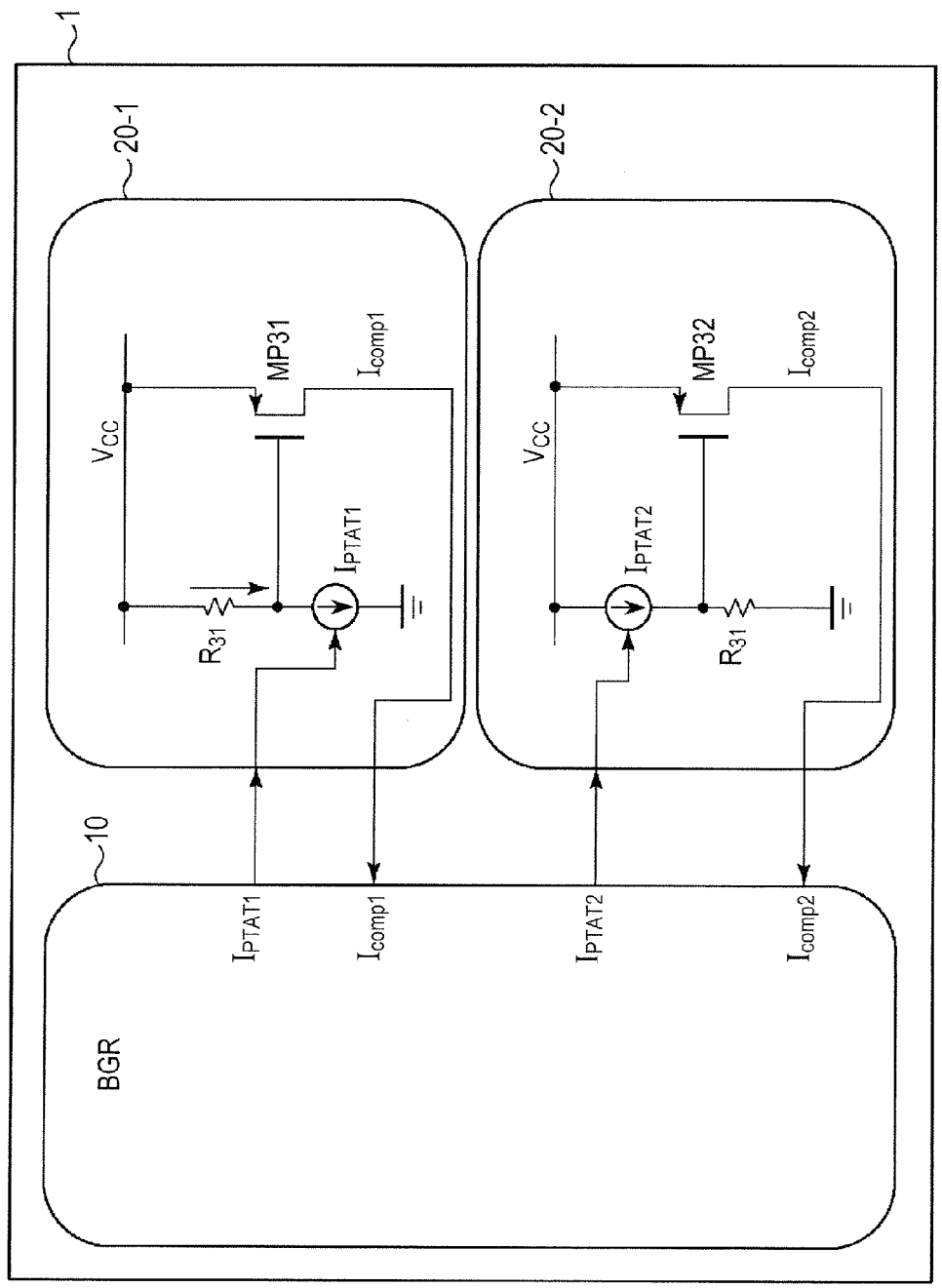
FIG. 30 is a circuit diagram illustrating a modification of the concrete circuit configuration of the voltage generation circuit according to the ninth embodiment.

FIG. 30 is a circuit diagram illustrating another example of the concrete circuit configuration of the voltage generation circuit 1 according to the ninth embodiment. In the voltage generation circuit 1 of FIG. 29, in the correction circuits 20-1 and 20-2, the same current is used as the current $I_{PTAT}$ and different resistors are used as the resistor $R_3$. In the voltage generation circuit 1 of FIG. 30, however, in the correction circuits 20-1 and 20-2, different currents are used as the current $I_{PTAT}$ and the same resistor is used as the resistor $R_3$. Hereinafter, the point different from the case of FIG. 29 will be mainly described.

The BGR core circuit 10 is similar to that in the case of FIG. 22. As the BGR core circuit 10, for example, the circuits of FIGS. 16 to 18 can be used.

The correction circuit 20-1 generates the correction current Icomp1 on the basis of the resistance R and the current $I_{PTAT1}$ and makes the correction current Icomp1 fed back to the current generation unit 101. Similarly, the correction circuit 20-2 generates a correction current Icomp2 on the basis of the current $I_{PTAT2}$ and the resistance R and makes the correction current Icomp2 fed back to the current generation unit 101.

The correction circuits 20-1 and 20-2 use, opposite to the case of FIG. 29, the constant current supplies $I_{PTAT1}$ and $I_{PTAT2}$ which are different from each other, and the same resistor $R_{31}$. The others are similar to those of the case of FIG. 29. That is, the correction circuits 20-1 and 20-2 are similar to those in FIGS. 22 and 26, respectively. As a result, in the correction circuit 20-1, the gate voltage of the PMOS transistor MP31 is controlled by the voltage according to the resistor $R_{31}$ and the constant current supply $I_{PTAT1}$ and the PMOS transistor MP31 outputs the correction current Icomp1 from the drain terminal. In the case where $I_{PTAT1} \cdot R_{31} \geq$ "absolute value of threshold voltage of PMOS transistor MP31", Icomp1 flows. On the other hand, in the correction circuit 20-2, the gate voltage of the PMOS transistor MP32 is controlled by the voltage according to the constant current supply $I_{PTAT2}$ and the resistor $R_{31}$ and the PMOS transistor MP32 outputs the correction current Icomp2 from the drain terminal. In the case where "absolute value of threshold voltage of PMOS transistor MP32"$\geq$ Vcc$-I_{PTAT2} \cdot R_{31}$, Icomp2 flows.

Next, the principle of the method of correcting the nonlinear temperature characteristic in the voltage generation circuit 1 in the case of FIG. 30 will be described. In FIG. 30, in the correction circuit 20-1, in a temperature range higher than the threshold temperature $T_1$ at which $I_{PTAT} \cdot R_{31} \geq$ "absolute value of threshold voltage of the PMOS transistor MP31" is satisfied, Icomp1 is generated. At this time, Icomp1 monotonously increases from the threshold temperature $T_1$ toward the high-temperature side. On the other hand, in the correction circuit 20-2, in a temperature range lower than the threshold temperature $T_2$ at which "absolute value of threshold voltage of the PMOS transistor MP32$\geq$Vcc$-I_{PTAT2} \cdot R31$ is satisfied, Icomp2 is generated. At this time, Icomp2 monotonously increases from the threshold temperature $T_2$ toward the low-temperature side. As a result, the final correction current Icomp becomes the sum of Icomp1 on the high-temperature side and Icomp2 on the low-temperature side. That is, Icomp2 flows in the temperature range lower than the threshold temperature $T_2$, no correction current flows in the temperature range of the threshold temperatures $T_2$ and $T_1$, and Icomp1 flows in the temperature range higher than the threshold temperature $T_1$. To set the threshold temperatures $T_2$ and $T_1$ to be different values, the different constant current supplies $I_{PTAT1}$ and $I_{PTAT2}$ are used in the correction circuits 20-1 and 20-2.

The BGR core circuit 10 adds the final correction current Icomp and the current corresponding to the reference voltage $V_{BGR}$ to generate the final reference voltage $V_{BGR}$. The reference voltage $V_{BGR}$ before the correction current Icomp is added is the reference voltage $V_{BGR}$ in the state of FIGS. 2B and 2C.

In the embodiment, also in the voltage generation circuit 1 of FIG. 30, effects similar to those of the voltage generation circuit 1 of FIG. 29 can be obtained.

$I_{PTAT}$ Generation Circuit

Figure 31:
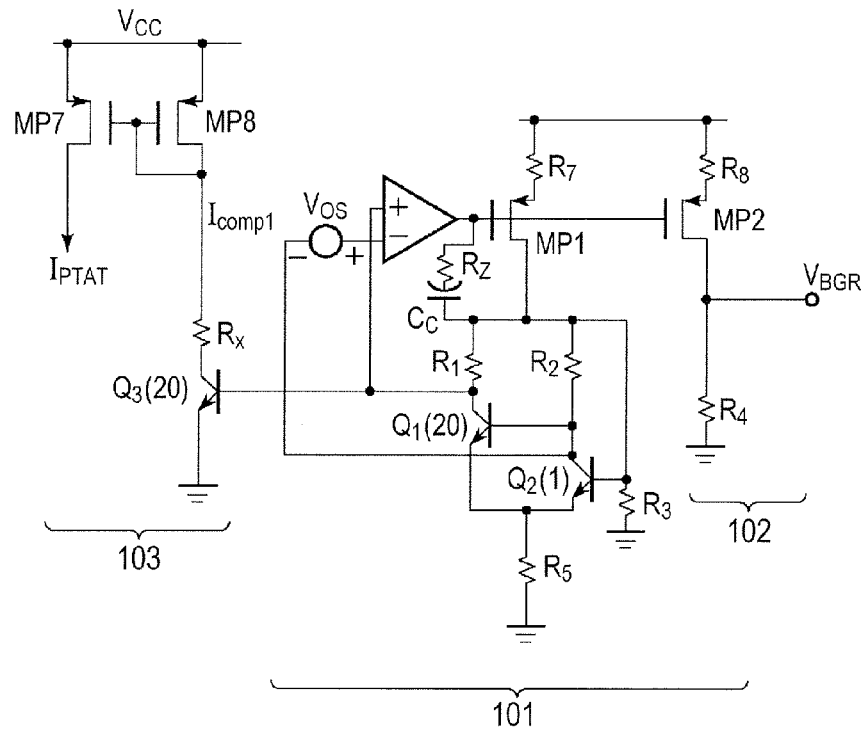
FIG. 31 is a circuit diagram illustrating another example of a concrete circuit configuration of a BGR, core circuit.

In each of the foregoing embodiments, as the circuit for generating the current $I_{PTAT}$ applied to each of the current generation circuits 1, the first current generation unit 103 in the BGR core circuit 10 illustrated in FIG. 16 is used. However, the circuit for generating the current $I_{PTAT}$ is not limited to the example. As another example, a BGR core circuit 10 to be described may be used. FIG. 31 is a circuit diagram illustrating another example of the concrete circuit configuration of the BGR core circuit 10. The BGR core circuit 10 has the current generation unit 101, the output unit 102, and the first current generation unit 103.

In the current generation unit 101 and the output unit 102, the voltage $V_{BGRC}$ to be output and the correction current Icomp to be fed back are not illustrated. However, the current generation unit 101 and the output unit 102 are the same as those in the case of FIG. 7.

The first current generation unit 103 has, for example, the NPN-type bipolar transistor $Q_3$, a resistor Rx, and P-channel-type MOS transistors MP7 and MP8. The emitter terminal of the bipolar transistor $Q_3$ is coupled to the ground node, and the base terminal is coupled to the collector terminal of the bipolar transistor $Q_1$. The emitter area of the bipolar transistor $Q_3$ is the same as that of the bipolar transistor $Q_1$. One end of the resistor Rx is coupled to the collector terminal of the bipolar transistor $Q_3$. The source terminal of the PMOS transistor MP8 is coupled to the power supply node, and the gate terminal and the drain terminal are coupled to the other end of the resistor Rx. The source terminal of the PMOS transistor MP7 is coupled to the power supply node, and the gate terminal is coupled to the gate terminal of the PMOS transistor MP7. The PMOS transistors MP7 and MP8 configure a current mirror circuit.

In a path of the PMOS transistor MP8, the resistor Rx, and the bipolar transistor $Q_3$, the current $I_{PTAT}$ corresponding to the current $I_1$ ($I_{PTAT}$) passing through the path of the resistor $R_1$ and the bipolar transistor $Q_1$ flows. As a result, the current $I_{PTAT}$ is generated in the PMOS transistor MP7 as a component of the current mirror circuit configured together with the PMOS transistor MP8 and is output from the drain terminal.

BGR Core Circuit

The BGR core circuit 10 (particularly, the current generation unit 101 and the output unit 102) applied to the voltage generation circuit 1 in each of the foregoing embodiments is not limited to the foregoing embodiments. another example, the following BGR core circuit 10 may be employed.

(a-1) BGR Core Circuit (No. 1)

Figure 32:
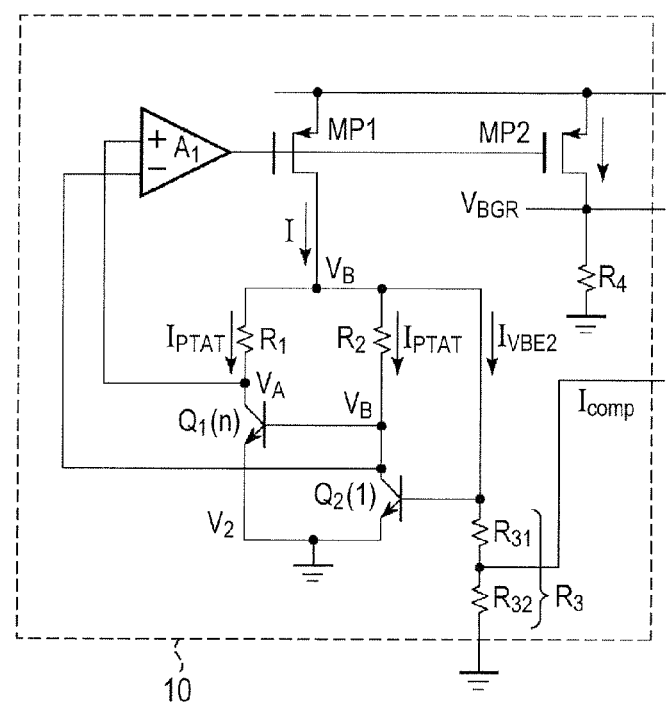
FIG. 32 is a circuit diagram illustrating another example of a concrete circuit configuration of the BGR core circuit.

FIG. 32 is a circuit diagram illustrating another example of the concrete circuit configuration of the BGR core circuit 10. In the diagram, the same reference numerals are designated to components similar to those of the BGR core circuit 10 of FIG. 7 and their detailed description will not be repeated.

The BGR core circuit 10 illustrated in FIG. 32 is different from the BGR core circuit 10 of FIG. 7 with respect to the points that the resistor $R_5$ is not provided and the correction current Icomp is fed back to the resistor $R_3$. Hereinafter, the different points will be mainly described. Although the voltage $V_{BGRC}$ to be output, the resistors $R_7$, $R_8$, and Rz, and the capacitor Cc are not illustrated, they are similar to those in the case of FIG. 7.

In the BGR core circuit 10, the correction current Icomp is fed back to the resistor $R_3$. Although not limited, in the example of the diagram, the resistor $R_3$ is divided into resistors $R_{31}$ and $R_{32}$, and the correction current is fed back to the connection node between the resistors $R_{31}$ and $R_{32}$.

In this case, the output voltage $V_{BGR}$ by the BGR core circuit 10 is expressed by the following equation 22.

$$V_{BGR} = R_4 I = R_4 \left\{ 2\frac{V_T \ln(n)}{R_{12}} + \frac{V_{BE2} + I_{comp} R_{32}}{R_{31} + R_{32}} \right\} = \quad (22)$$

$$\frac{R_4 V_{BE2}}{R_{31} + R_{32}} + 2\frac{R_4 V_T \ln(n)}{R_{12}} + \frac{R_4 I_{comp} R_{32}}{R_{31} + R_{32}}$$

In the equation 22, the first term relates to the base-emitter voltage $V_{BE}$, the second term relates to the difference voltage $V_{PTAT}$ of the base-emitter voltages of two bipolar transistors having different emitter areas, and the third term relates to the correction current Icomp.

(a-2) BGR Core Circuit (No. 2)

Figure 33:
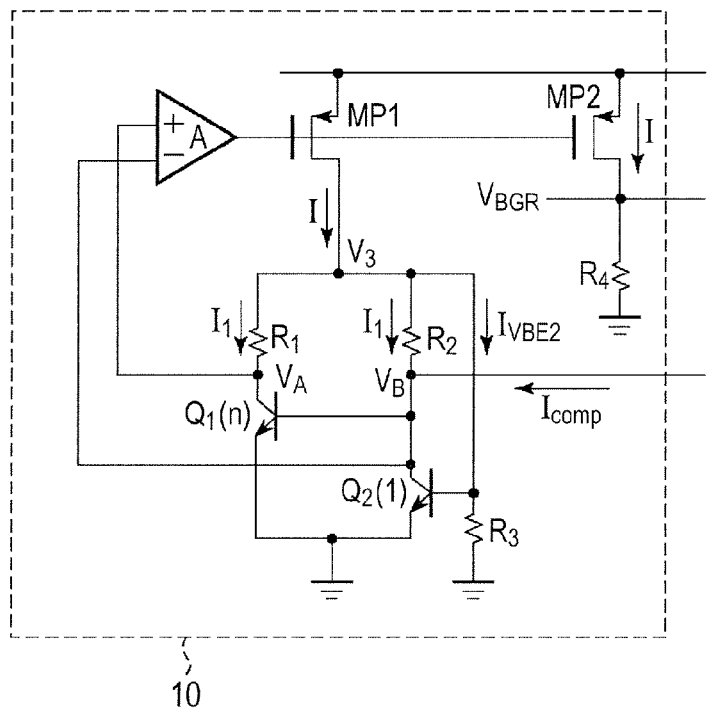
FIG. 33 is a circuit diagram illustrating another example of the concrete circuit configuration of the BGR core circuit.

FIG. 33 is a circuit diagram illustrating another example of the concrete circuit configuration of the BGR core circuit 10. In the diagram, the same reference numerals are designated to components similar to those of the BGR core circuit 10 of FIG. 7 and their detailed description will not be repeated.

The BGR core circuit 10 illustrated in FIG. 33 is different from the BGR core circuit 10 of FIG. 7 with respect to the points that the resistor $R_3$ is not provided and the correction current Icomp is fed back to the resistor $R_2$ and the collector terminal of the bipolar transistor $Q_2$. Hereinafter, the different points will be mainly described. Although the voltage $V_{BGRC}$ to be output, the resistors $R_7$, $R_8$, and Rz, and the capacitor Cc are not illustrated, they are similar to those in the case of FIG. 7.

In the BGR core circuit 10, the correction current Icomp is fed back to the connection node between the resistor $R_2$ and the collector terminal of the bipolar transistor $Q_2$.

The output voltage $V_{BGR}$ of the reference voltage generation circuit 4 is expressed as follows. Although not limited, for simplicity, the mirror ratio of the correction current Icomp is 1:1.

In this case, the output voltage $V_{BGR}$ by the BGR core circuit 10 is expressed by the following equation 23.

$$V_{BGR} \sim R_4 \left\{ \frac{V_{BE2}}{R_3} + \frac{\ln(n) V_T}{R_{12}} \left(2 + \frac{2 I_{comp} R_{12}}{\ln(n)^2 V_T}\right) \right\} = \quad (23)$$

$$\frac{R_4}{R_3} V_{BE2} + \frac{2 R_4}{R_{12}} \ln(n) V_T + \frac{R_4}{R_{12}} \frac{2 I_{comp} R_{12}}{\ln(n)}$$

In the equation 23, the first term relates to the base-emitter voltage $V_{BE}$, the second term relates to the difference voltage $V_{PTAT}$ of the base-emitter voltages of two bipolar transistors having different emitter areas, and the third term relates to the correction current Icomp., (a-3) BGR Core Circuit (No. 3)

Figure 34:
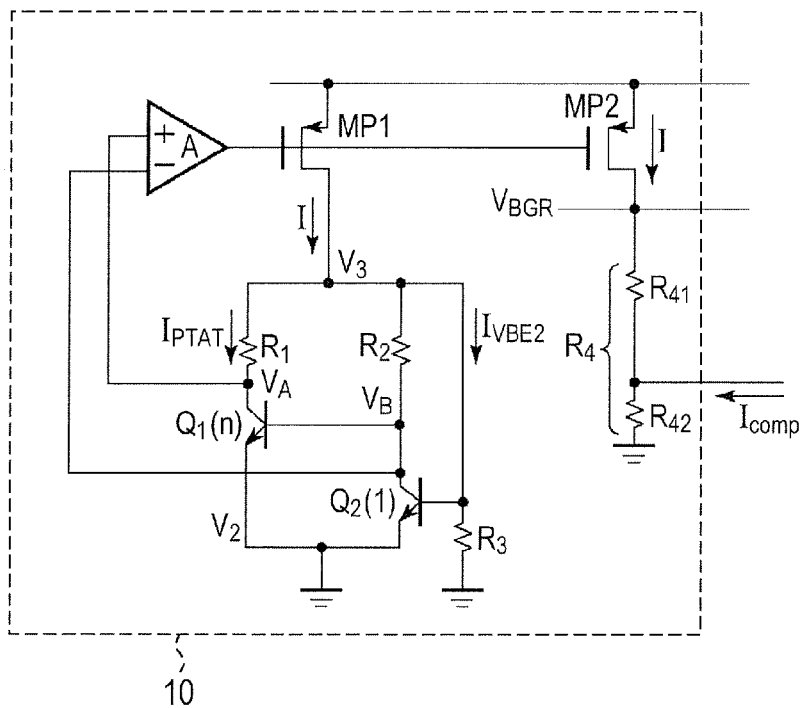
FIG. 34 is a circuit diagram illustrating another example of the concrete circuit configuration of the BGR core circuit.

FIG. 34 is a circuit diagram illustrating another example of the concrete circuit configuration of the BGR core circuit 10. In the diagram, the same reference numerals are designated to components similar to those of the BGR core circuit 10 of FIG. 7 and their detailed description will not be repeated.

The BGR core circuit 10 illustrated in FIG. 34 is different from the BGR core circuit 10 of FIG. 7 with respect to the points that the resistor $R_5$ is not provided and the correction current Icomp is fed back to the resistor $R_4$. Hereinafter, the different points will be mainly described. Although the voltage $V_{BGRC}$ to be output, the resistors $R_7$, $R_8$, and Rz, and the Capacitor Cc are not illustrated, they are similar to those in the case of FIG. 7.

In the BGR core circuit 10, the correction current Icomp is fed back to the resistor $R_4$. Although not limited, in the example of the diagram, the resistor $R_4$ is divided into resistors $R_{41}$ and $R_{42}$, and the correction current Icomp is fed back to the connection node between the resistors $R_{41}$ and $R_{42}$.

In this case, the output voltage $V_{BGR}$ by the BGR core circuit 10 is expressed by the following equation 24.

$$V_{BGR} = (R_{41} + R_{42}) I + R_{42} I_{comp} = \quad (24)$$

$$(R_{41} + R_{42}) \left\{ 2\frac{V_T \ln(n)}{R_{12}} + \frac{V_{BE2}}{R_3} \right\} + R_{42} I_{comp} =$$

$$(R_{41} + R_{42}) \frac{V_{BE2}}{R_3} + (R_{41} + R_{42}) \left\{ 2\frac{V_T \ln(n)}{R_{12}} \right\} + R_{42} I_{comp}$$

In the equation 24, the first term relates to the base-emitter voltage $V_{BE}$, the second term relates to the difference voltage $V_{PTAT}$ of the base-emitter voltages of two bipolar transistors having different emitter areas, and the third term relates to the correction current Icomp.

Differential Amplifier

Concrete examples of the differential amplifier $A_1$ of the BGR core circuit 10 applied to the voltage generation circuit 1 in the foregoing embodiments will be described.

(b-1) Differential Amplifier $A_1$ (No. 1)

Figure 35A:
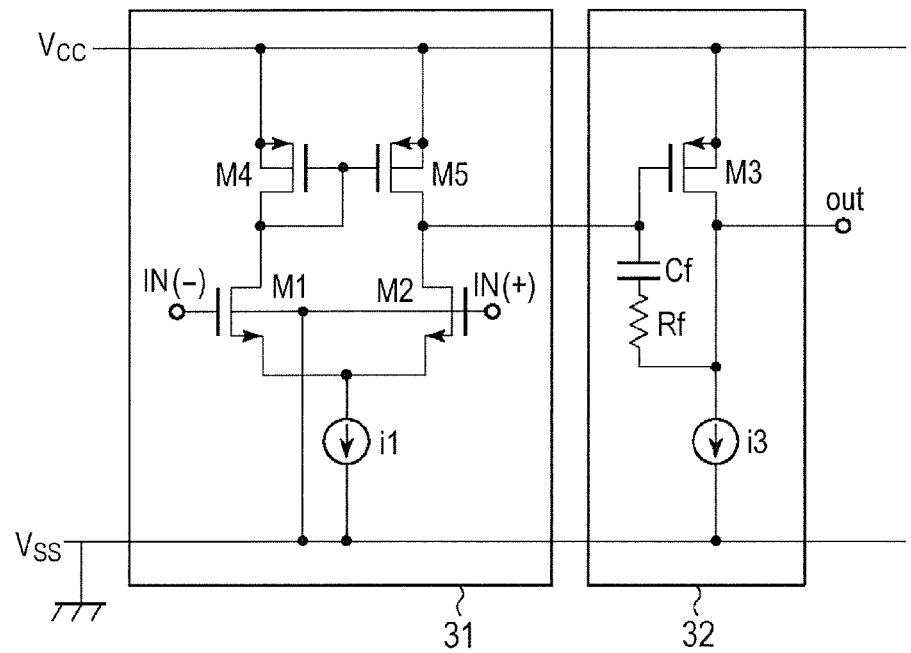
FIG. 35A is a circuit diagram illustrating an example of a differential amplifier in the voltage generation circuit.

FIG. 35A is a circuit diagram illustrating an example of the differential amplifier $A_1$ in the voltage generation circuit 1.

FIG. 35A illustrates an example of the differential amplifier $A_1$ using an N-channel-type MOS transistor as an input stage. The amplifier is comprised of a first stage 31 and an output stage 32. The first stage 31 has N-channel-type MOS transistors M1 and M2, a current supply i1, and P-channel-type MOS transistors M4 and M5. The NMOS transistors M1 and M2 configure a differential input stage. The current supply i1 is provided between the source terminals and the ground node. The PMOS transistors M4 and M5 are provided between the drain terminals of the NMOS transistors M1 and M2 and the power supply voltage Vcc, and an active load is comprised of a current mirror circuit. The output stage 32 is an inversion amplifying circuit having a P-channel-type MOS transistor M3. The PMOS transistor M3 receives an output signal of the first stage 31 by its gate terminal, and has the source terminal coupled to the node of the power supply voltage Vcc. The inversion amplifying circuit uses, as a load, a current supply i3 provided between its drain terminal and the ground terminal. Between the gate terminal and the drain terminal of the PMOS transistor M3, a capacitor Cf and a resistor Rf as a phase compensation circuit are provided.

(b-2) Amplifier $A_1$ (No. 2)

Figure 35B:
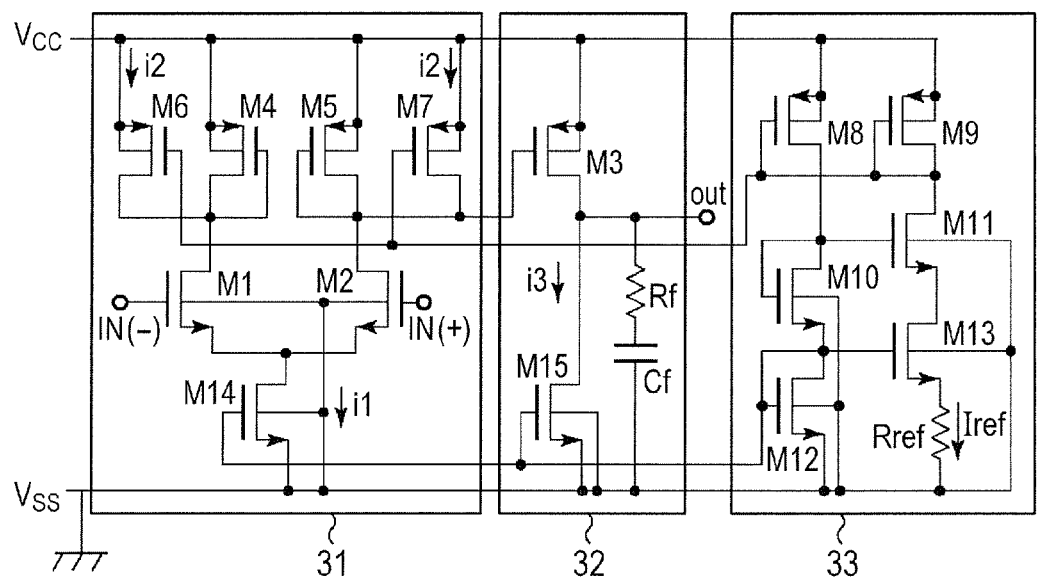
FIG. 35B is a circuit diagram illustrating an example of the differential amplifier in the voltage generation circuit.

FIG. 35B is a circuit diagram illustrating an example of the differential amplifier $A_1$ in the voltage generation circuit 1.

FIG. 35B illustrates another example of the differential amplifier $A_1$ using an N-channel-type MOS transistor as an input stage. The amplifier is comprised of the first stage 31, the output stage 32, and a current supply 33. In the case of configuring the voltage generation circuit 10, power consumption has to be decreased. As a negative effect, the gain of the amplifier becomes high beyond necessity, and it may become difficult to perform phase compensation. The amplifier illustrated in the diagram has a circuit configuration intended to reduce the power consumption and is comprised of a first-stage amplifying unit by an N-channel-type MOS transistor, an output unit comprised of a source-grounded inversion amplifying circuit made by a P-channel-type MOS transistor, and a current supply for driving the units. To stably supply minute electric current, the current supply converts the difference voltage between the gate-source voltages of N-channel-type MOS transistors M12 and M13 to current by a resistor Rref and generates resultant current Iref. The current Iref determines bias currents i1 and i3 in the first-stage unit and the output stage in a current mirror form in the MOS transistors M14 and M15. In the case of setting the current value of the current it to be small, to prevent a situation that the gain of the amplifier in the first stage becomes high and it becomes difficult to perform phase compensation, current supplies M6 and M7 for passing constant current i2 to the MOS transistors M4 and M5 configuring the current mirror as a factor for determining the gain are coupled in parallel. The constant current Iref flows in the MOS transistors M13 and M11, and to a diode-coupled MOS transistor M9. By a current mirror form made by the MOS transistors M6 to M9, the constant current i2 can be generated. As a result, the phase compensation is facilitated. That is, in addition to mirror compensation conventionally used, pole-zero compensation in which designing is easy (a series coupling of Rf and Cf is coupled to the output stage) can be performed.

Other Configuration 1 of Voltage Generation Circuit

In the foregoing embodiments, a circuit configuration excluding a start-up circuit is illustrated to facilitate understanding of the operation principle of the voltage generation circuit 1. The voltage generation circuit 1 may further has a start-up circuit.

Figure 36:
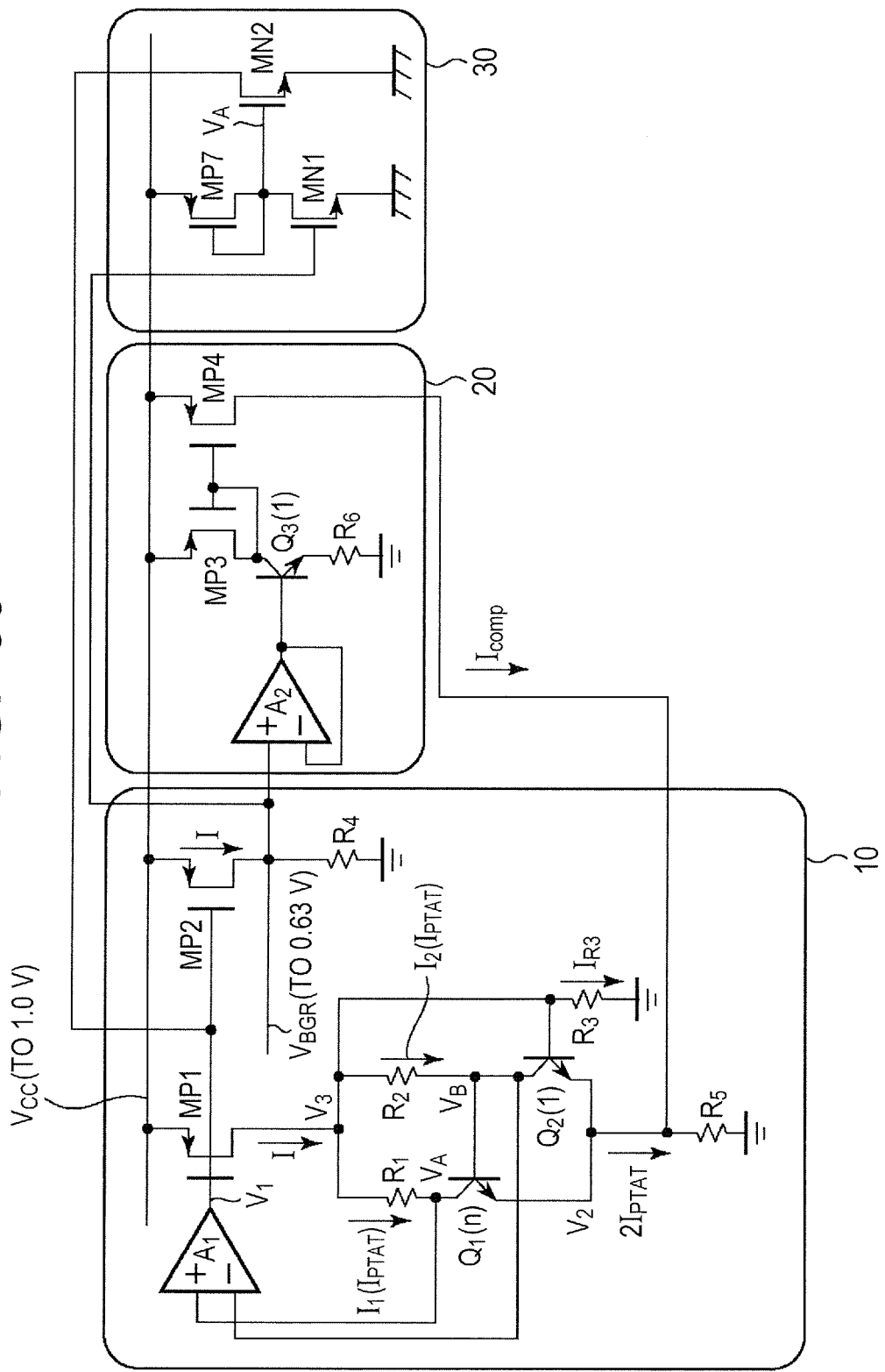
FIG. 36 is a circuit diagram illustrating an example of the voltage generation circuit having a startup circuit.

FIG. 36 is a circuit diagram illustrating an example of the voltage generation circuit 1 having a startup circuit.

The voltage generation circuit 1 has the reference voltage generation circuit (BGR core circuit) 10, the correction circuit 20, and a start-up circuit 30. In some cases, the output voltage $V_{BGR}$ of the voltage generation circuit 1 is stabilized at 0V at the time of start when power supply voltage is applied. As a countermeasure, the voltage generation circuit 1 is provided with the start-up circuit 30, and start-up is performed by forcedly passing current.

The start-up circuit 30 has, for example, a PMOS transistor MP7 and NMOS transistors MN1 and MN2. The source terminal of the PMOS transistor MP7 is coupled to the power supply node Vcc. The source terminal of the NMOS transistor MN1 is coupled to the ground node, the drain terminal is coupled to the drain terminal of the PMOS transistor MP7, and the gate terminal is coupled to the drain terminal of the PMOS transistor MP2 (the output terminal of $V_{BGR}$). The source terminal of the NMOS transistor MN2 is coupled to the ground node, the drain terminal is coupled to the drain terminal of the PMOS transistor MP2, and the gate terminal is coupled to the drain terminal of the NMOS transistor MN1.

Hereinafter, the operation of the start-up circuit 30 will be described. For example, when a gate potential V1 of the PMOS transistor MP1 is Vcc, the PMOS transistor MP1 is off, and no current flows. Since the PMOS transistor MP2 is off at this time, the output voltage $V_{BGR}$ becomes the ground potential, and the NMOS transistor MN1 is off. Potential V4 of the node to which the drain terminal of the NMOS transistor MN1 is coupled becomes $Vcc-|V_{THP}|$ when the threshold voltage of the PMOS transistor MP7 is expressed as $V_{THP}$, the NMOS transistor MN2 is turned on. The gate potential V1 of the PMOS transistor MP1 decreases, from Vcc, and the BGR core circuit 10 can operate with normal bias.

By the start-up circuit 30, the output voltage $V_{BGR}$ can be generated without an error at the time of power on, cancella-tion of a sleep mode, and the like. In the case such that a disturbance occurs in normal operation, recovery is made promptly, and the output voltage $V_{BGR}$ is stably generated. Further, in the circuit configuration of the start-up circuit 30, by properly selecting the sizes of the PMOS transistor MP7 and the NMOS transistors MN1 and MN2, the gate potential V4 at the NMOS transistor MN2 can be set to the threshold voltage $V_{THN}$ of the NMOS transistor MN2 or less. Accordingly, the current in the NMOS transistor MN2 becomes ignorable, and no influence is exerted on the operation of the BGR core circuit 10. The start-up circuit 30 is an example. A start-up circuit having another circuit configuration may be provided for the voltage generation circuit 1.

Another Configuration 2 of Voltage Generation Circuit

Figure 37:
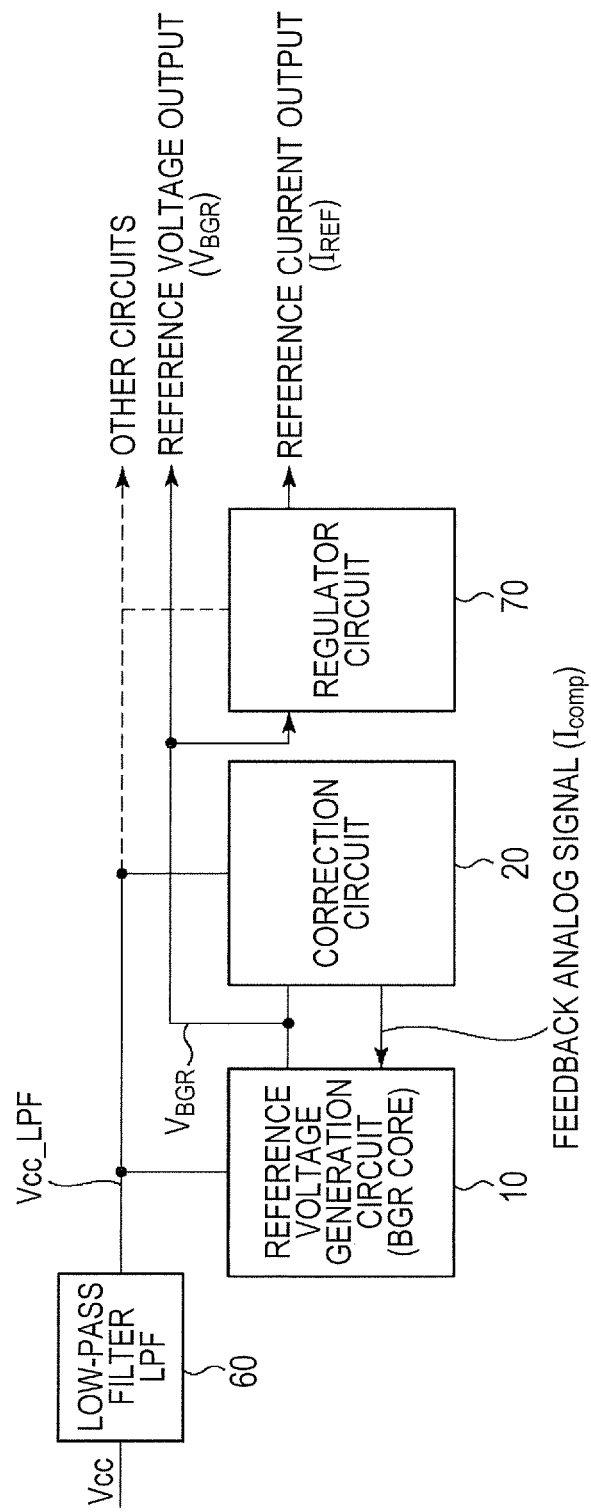
FIG. 37 is a block diagram illustrating an example of the circuit configuration of the voltage generation circuit in which a low-pass filter is inserted in a power supply line.

FIG. 37 is a block diagram illustrating an example of the circuit configuration of the voltage generation circuit in which a low-pass filter (LPF) is inserted in a power supply Vcc line.

The BGR core circuit 10 and the correction circuit 20 in the foregoing embodiments have small circuit scale and low power consumption. Consequently, a low-pass filter 60 can be inserted in the power supply Vcc line to supply output voltage Vcc_LPF of the low-pass filter 60 to the BGR core circuit 10, the correction circuit 20, the regulator circuit 70, and the like. With the configuration, PSRR (Power Supply Rejection Ratio) can be lowered, and resistance to fluctuations in the power supply voltage can be increased. The low-pass filter 60 is realized by, for example, a resistive element and a capacitive element but may have another circuit configuration as long as a low-pass characteristic is obtained.

System to which Voltage Generation Circuit is Applied

A system to which the voltage generation circuit 1 of each of the foregoing embodiments is applied will now be described.

(c-1) AD Converter

Figure 38A:
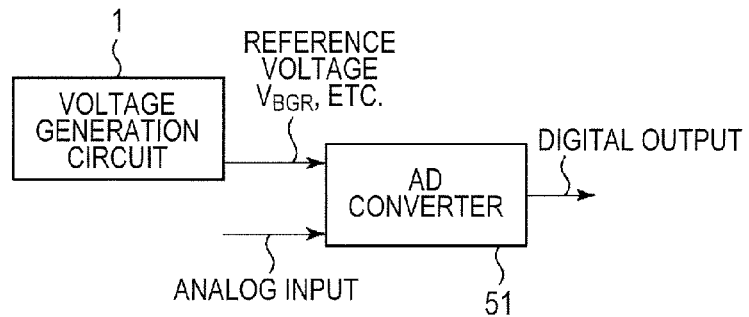
FIG. 38A is a diagram illustrating an example of a system to which the voltage generation circuit is applied.

FIG. 38A illustrates an example of applying the voltage generation circuit 1 to an AD converter 51. The AD converter 51 converts an analog input signal to a digital signal on the basis of the voltage $V_{BGR}$ generated by the voltage generation circuit 1 or a voltage generated on the basis of the voltage $V_{BGR}$ and outputs the digital signal.

(c-2) DA Converter

Figure 38B:
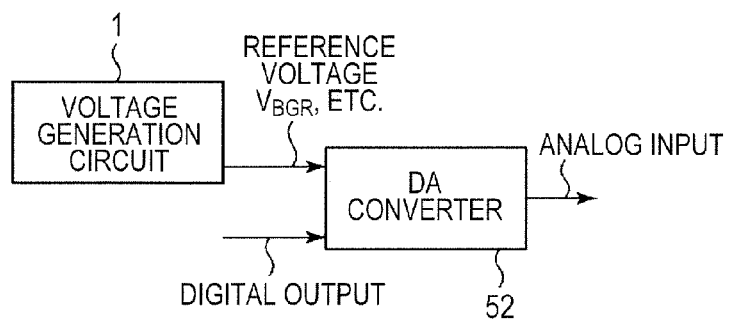
FIG. 38B is a diagram illustrating an example of the system to which the voltage generation circuit is applied.

FIG. 38B illustrates an example of applying the voltage generation circuit 1 to a DA converter 52. The DA converter 52 converts a digital input signal to an analog signal on the basis of the voltage $V_{BGR}$ generated by the voltage generation circuit 1 or a voltage generated on the basis of the voltage $V_{BGR}$ and outputs the analog signal.

(c-3) Reference Current Supply

Figure 38C:
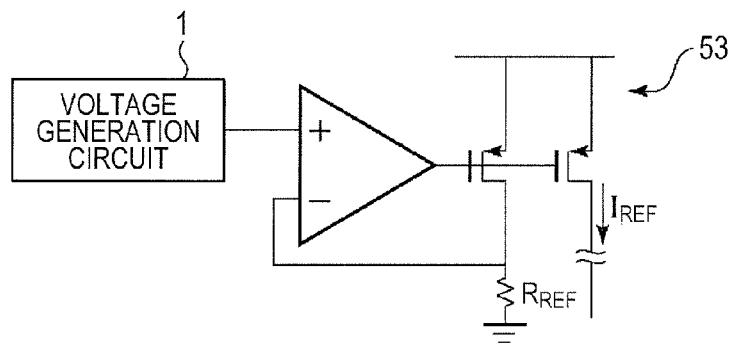
FIG. 38C is a diagram illustrating an example of the system to which the voltage generation circuit is applied.

FIG. 38C illustrates an example of applying the voltage generation circuit 1 to a reference current supply 53. On the basis of the voltage $V_{BGR}$ generated by the voltage generation Circuit 1 or a voltage generated on the basis of the voltage $V_{BGR}$, the reference current supply 53 generates and outputs a reference current $I_{REF}$.

(c-4) Temperature Sensor

Figure 38D:
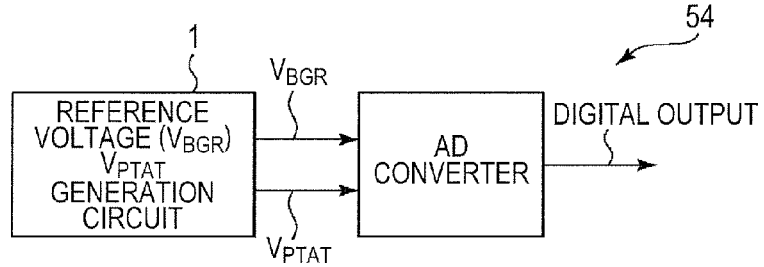
FIG. 38D is a diagram illustrating an example of the system to which the voltage generation circuit is applied.

FIG. 38D illustrates an example of applying the voltage generation circuit 1 (which can output $V_{PTAT}$) to a temperature sensor 54. The temperature sensor 54 measures temperature on the basis of voltage $V_{PTAT}$ proportional to temperature and the voltage $V_{BGR}$ having low temperature dependency and outputs the measurement result.

(c-5) Semiconductor Integrated Circuit Device (No. 1)

Figure 39:
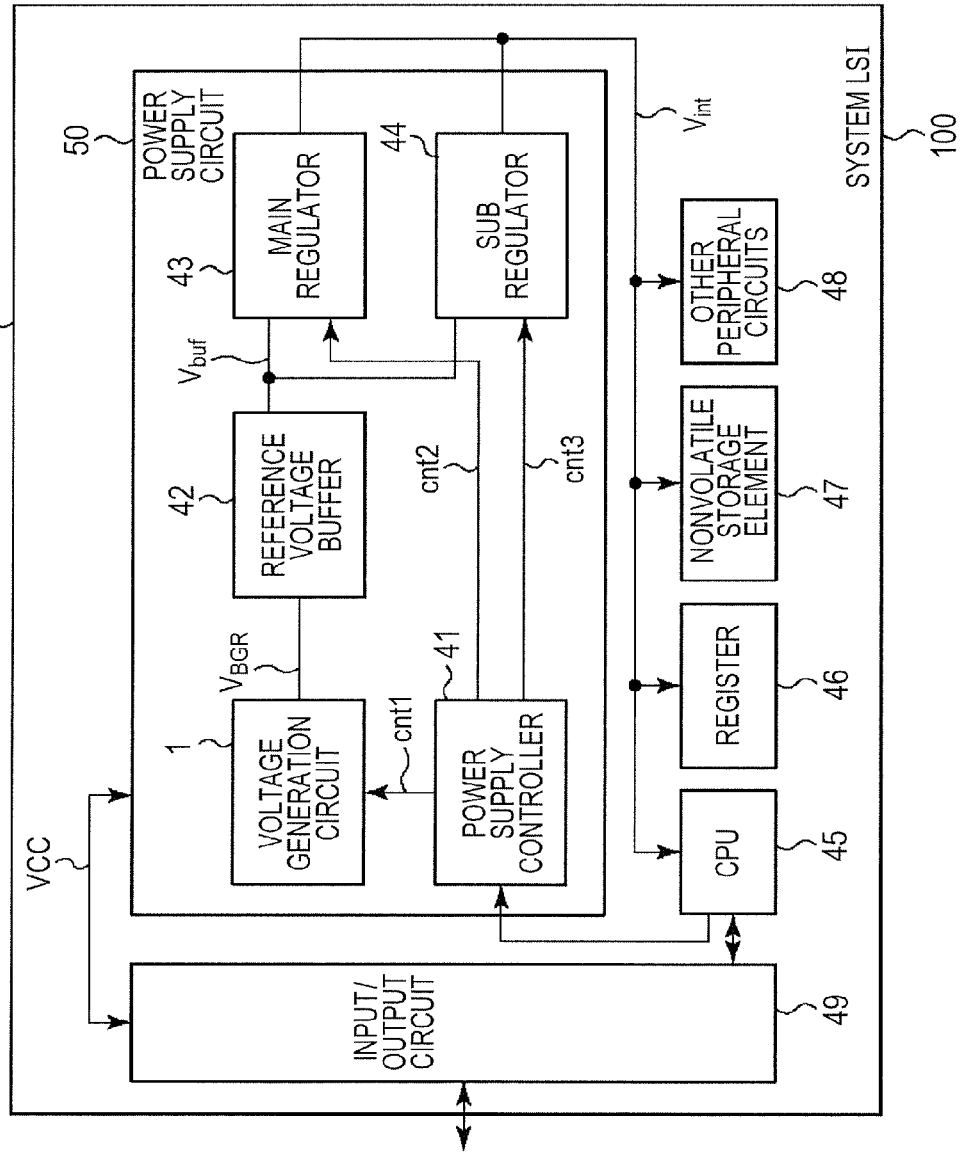
FIG. 39 is a diagram illustrating an example of a system to which the voltage generation circuit is applied.

FIG. 39 is a block diagram illustrating an example of a semiconductor integrated circuit device to which the voltage generation circuit 1 is applied. Although not limited, a semiconductor integrated circuit device 100 is, for example, a system LSI having therein a power supply circuit.

The semiconductor integrated circuit device 100 includes, for example, a power supply circuit 50, A CPU (Central Processing Unit) 45, a register 46, a nonvolatile storage element 47, other peripheral circuits 48, and an input/output circuit 49. The power supply circuit 50 includes, for example, a power supply controller 41, the voltage generation circuit 1, a reference voltage buffer 42, a main regulator 43 as a main power supply, and a sub regulator 44 as a standby power supply. Those circuits operate when the power supply voltage Vcc supplied from an external terminal is received. The power supply controller 41 outputs. control signals cnt1, cnt2, and cnt3 on the basis of a control signal supplied via the input/output circuit 49 or the CPU 45. On the basis of the control signal cnt1, the voltage generation circuit 1 outputs the reference voltage $V_{BGR}$. The reference voltage buffer 42 outputs a reference voltage Vbuf on the basis of the reference voltage $V_{BGR}$. Either the main regulator 43 or the sub regulator 44 outputs an internal voltage Vint on the basis of the control signals cnt2 and cnt3 and the reference voltage Vbug. The CPU 45, the register 45, the nonvolatile storage element 47, and the other peripheral circuits 48 configuring the system LSI operate when the internal voltage Vint is supplied as operation voltage.

For example, in the case where the semiconductor integrated circuit device (system LSI) 100 is driven on a battery, low power supply voltage and low power consumption is required. However, when the power supply voltage becomes low, the circuits become unable to assure sufficient margin. Consequently, demand for higher-precision characteristic is expected. When the voltage generation circuit 1 of the embodiment is applied to the system LSI, low-power-supply-voltage operation and low output voltage are possible and effective. For higher precision, it is preferable to configure the voltage generation circuit 1 in a CMOS process. Particularly, small influence of an offset of the differential amplifier $A_1$ (equivalent to mismatch of current) is convenient when the device is mounted on an SOC (system on a chip) memory or a microprocessor. Further, a chopper may be employed to reduce a mismatch of the differential amplifier A1 or DEM (Dynamic Element Matching) may be employed to improve matching of MOS transistors.

(c-6) Semiconductor Integrated Circuit Device (No. 2)

Figure 40:
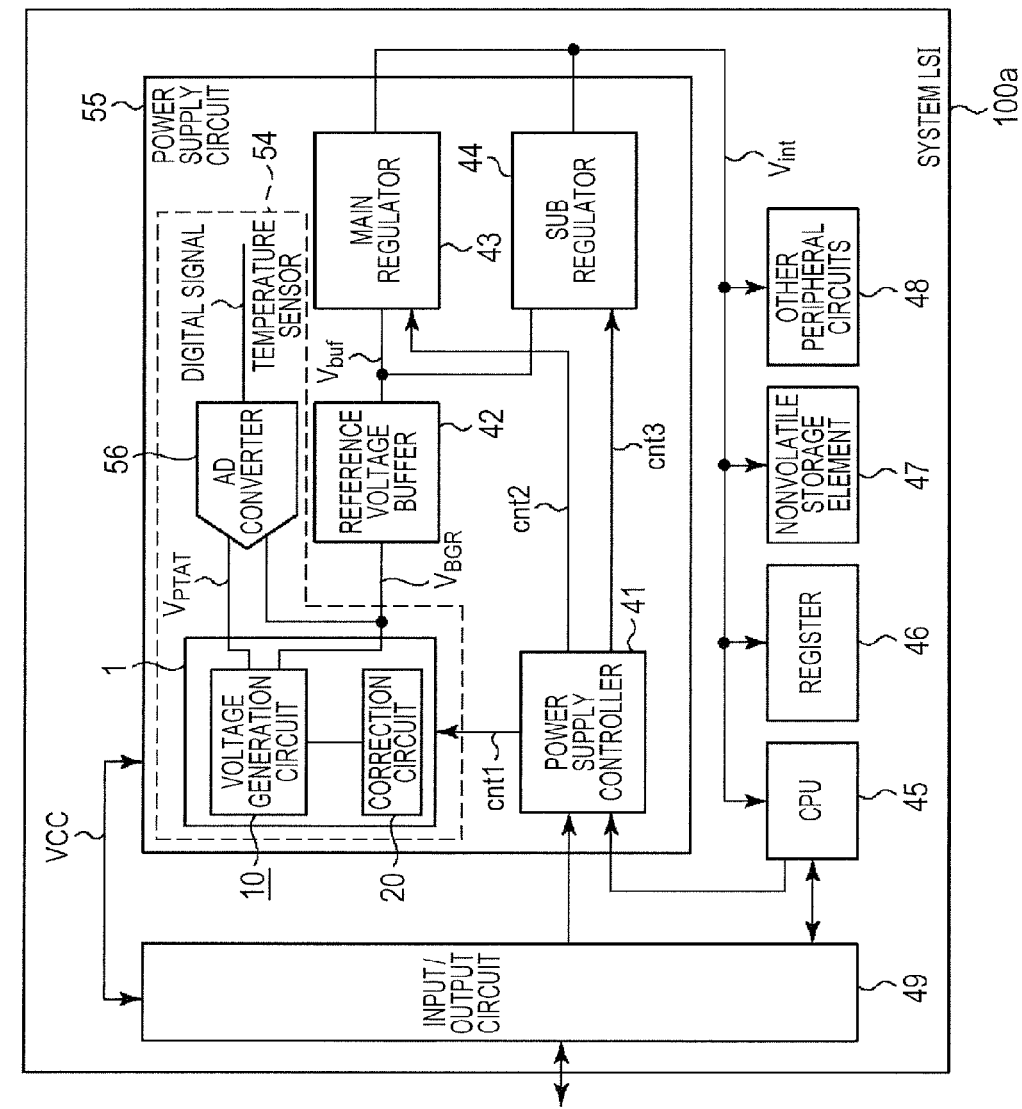
FIG. 40 is a diagram illustrating an example of a system to which the voltage generation circuit is applied.

FIG. 40 is a block diagram illustrating another example of a semiconductor integrated circuit device to which the voltage generation circuit 1 is applied. Although not limited, a semiconductor integrated circuit device 100*a* is, for example, a system LSI having therein a power supply circuit.

The semiconductor integrated circuit device 100*a* has a configuration obtained by adding a temperature sensor 54 to the semiconductor integrated circuit device (system LSI) 100 of FIG. 39. The temperature sensor 54 has the voltage generation circuit 1 and an AD converter 56. The voltage generation circuit 1 is used together with the main regulator 43, the sub regulator 44, and the like. The voltage generation circuit 1 has, for example, the BGR core circuit 10 (which can output $V_{PTAT}$) and the correction circuit 20.

In the system to which the voltage generation circuit of the embodiments is applied, low voltage output and low-power-supply-voltage operation become possible in the voltage generation circuit, and the precision of the output voltage $V_{BGR}$ is improved in a wide temperature range. Consequently, low power consumption and high reliability can be assured.

Chip Layout

Figure 41:
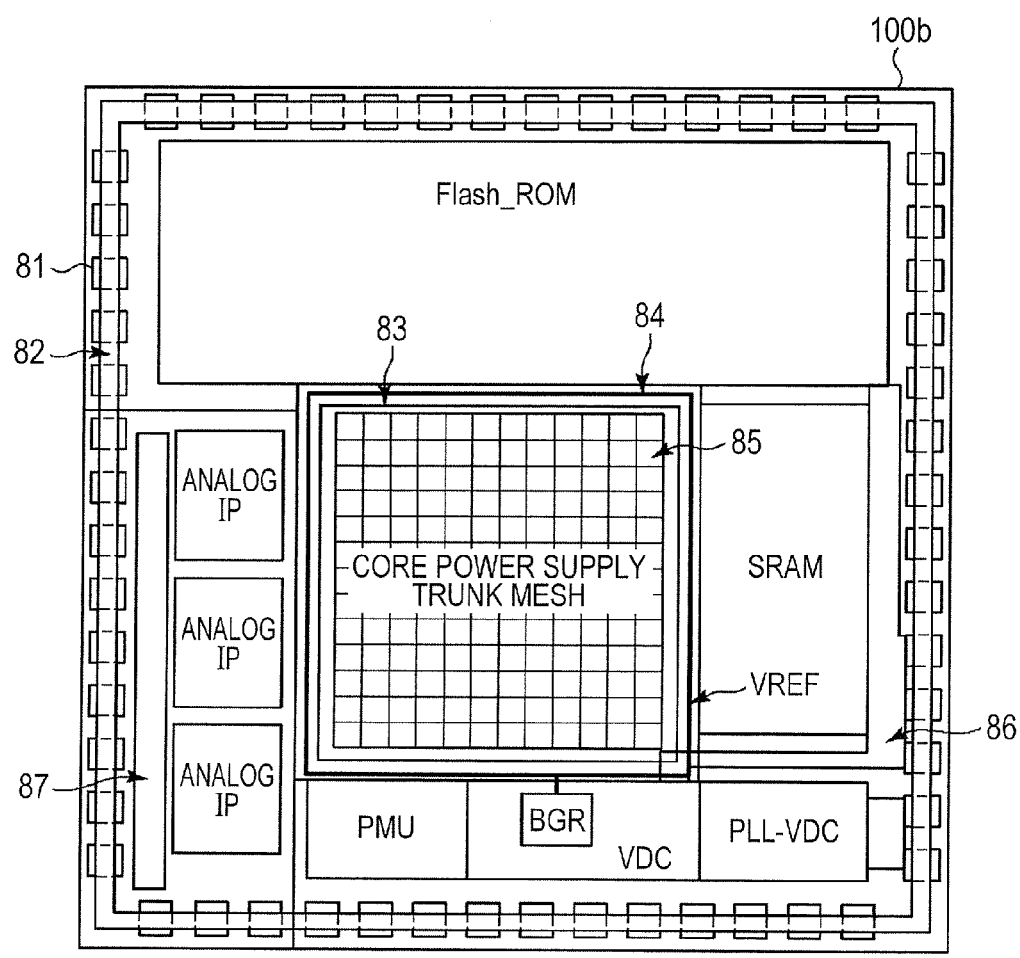
FIG. 41 is a block diagram illustrating an example of layout of a chip of a semiconductor integrated circuit device to which the voltage generation circuit is applied.

FIG. 41 is a block diagram illustrating an example of layout of a chip of a semiconductor integrated circuit device to which the voltage generation circuit 1 is applied. Although not limited, a semiconductor integrated circuit device 100*b* is, for example, a system LSI having therein a power supply circuit.

The semiconductor integrated circuit device 100*b* has, so as to surround a core part as a center, a flash ROM, a plurality of analog IPs, a PMU (power management unit), a DVC (power supply circuit), a PLL-VDC (a power supply circuit dedicated to PLL), an SRAM, and a BGR (voltage generation circuit 1). As a configuration related to wiring for supplying power to those elements, the device 100*b* has a plurality of terminals 81, I/O ring circular power supply trunk 82, a core circular power supply trunk 83, a main_VDC line region 84, a core power supply trunk mesh 85, a terminal-power supply trunk 86, and an analog power supply trunk 87. The plurality of terminals 81 are provided at predetermined intervals along the periphery of the semiconductor integrated circuit device 100*b*. The I/O ring circular power supply trunk 82 is a power supply trunk which is circularly provided along the periphery of the semiconductor integrated circuit device 100*b*. The main_VDC line region 84 is a region having lines for supplying the VDC (power) to the core part. The core power supply trunk mesh 85 in the main_VDC line region 84 is a mesh-shaped power supply trunk provided in the core part. The core circular power supply trunk 83 in the main_VDC line region 84 is a power supply trunk provided so as to surround the core power supply trunk mesh 85. The terminal-power supply trunk 86 is a power supply trunk coupling the terminals 81 and the VDC (power supply). The analog power supply trunk 87 is a power supply trunk coupling the analog IPs and the VDC (power supply).

Figure 42:
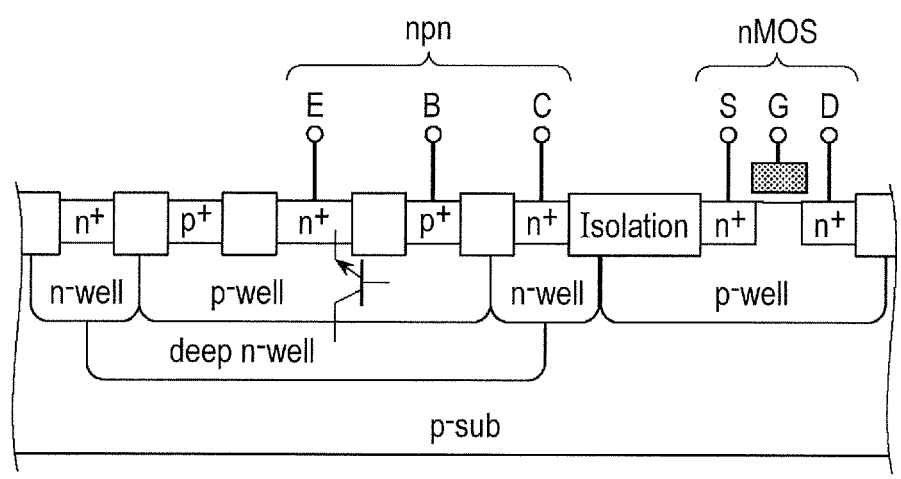
FIG. 42 is a cross section illustrating a part in the case of manufacturing the voltage generation circuit on a semiconductor substrate.

FIG. 42 is a cross section illustrating a part in the case of manufacturing the voltage generation circuit 1 on a semiconductor substrate.

In the example, a deep n-well is provided in a deep position in a P-type semiconductor substrate. On the deep n-well (in a position shallower than the deep n-well), an n-well is provided along the periphery of the deep n-well, and a p-well is provided on the inside of the n-well. The n-well and the p-well are provided so as to have almost the same depth. On the p-well on the deep n-well, a p+ layer is provided along the periphery of the p well, and an n+ layer is provided so as to sandwich an insulating layer on the inside of the p+ layer. An n+ layer is provided on the n-well on the periphery of the deep n-well. The deep n-well is a collector layer of a bipolar transistor, and the n+ layer provided on the n-well on the periphery of the deep n-well is a collector terminal. The p-well on the deep n-well is a base layer of the bipolar transistor, and the p+ layer on the p-well is a base terminal. The n+ layer on the p-well on the deep n-well is an emitter layer of the bipolar transistor and also serves as an emitter terminal. The p+ layer on the p-well is a base terminal. That is, a bipolar transistor is formed in the region.

A p-well is further provided on a side of the n-well on the periphery of the deep n-well. On the p-well, n+ layers are opposed to each other so as to apart by a predetermined distance. The region of the predetermined distance corresponds to the channel of a MOS transistor, and a gate electrode is provided above via an insulating layer. The opposed n+ layers correspond to a source terminal and a drain terminal. That is, in the p-well, the MOS transistor is formed. The p-well, the above-described n-well and p-well are provided so as to have almost the same depth.

As described above, the bipolar transistor and the MOS transistor are formed on the same semiconductor substrate in the same series of manufacture processes.

In the voltage generation circuit 1 of each of the embodiments, by employing the above-described circuit configuration for the BGR core-circuit 10, low voltage output and low-power-supply-voltage operation can be realized. The correction current Icomp is generated by the correction circuit 20 and is fed back to the BGR core circuit 10, thereby further decreasing the temperature dependency of the output voltage $V_{BGR}$. As a result, the precision of the output voltage $V_{BGR}$ is improved in a wide temperature range.

The voltage generation circuit 1 in each of the embodiments includes a plurality of correction circuits 20 having different operation temperatures (threshold temperatures) which are cascaded to the BGR core circuit. Consequently, the correction circuits can correct the output voltage $V_{BGR}$ at different temperatures. Therefore, the temperature dependency of the output voltage $V_{BGR}$ can be corrected in a wider temperature range. As a result, the precision of the output voltage $V_{BGR}$ is improved in a wider temperature range.

The voltage generation circuit 1 in each of the embodiments can selectively turn on/off a desired correction circuit 20 in the plurality of correction circuits 20 by a control signal (power-down signal). As a result, according to the ambient environment (temperature, humidity, and the like) and the precision of the output voltage VBGR requested for the system, some of the plurality of correction circuits 20 can be turned off. Therefore, the graph of temperature dependency of the output voltage $V_{BGR}$ can be formed in a desired curve. Power consumed by unnecessary correction circuits 20 can be suppressed, so that power can be saved.

The present invention achieved by the inventors herein has been described concretely above on the basis of the embodiments. Obviously, the invention is not limited to the foregoing embodiments and can be variously changed without departing from the gist of the invention.

A part or all of the embodiments and examples can be also described as in the following supplementary notes. The invention is not also limited to the following.

Supplementary Note 1

A semiconductor device having a voltage generation circuit, wherein the voltage generation circuit includes a reference voltage generation circuit which outputs reference voltage, and a plurality of correction circuits which generate correction current and make it fed back to the reference voltage generation circuit, wherein each of the plurality of correction circuits generates a sub correction current which monotonously increases from a predetermined temperature which varies among the plurality of correction circuits toward a low-temperature side or a high-temperature side, and wherein the correction current is sum of a plurality of the sub correction currents generated by the plurality of correction circuits.

Supplementary Note 2

The semiconductor device described in the supplementary note 1, wherein each of the plurality of correction circuits generates the sub correction current on the basis of the reference voltage or a voltage proportional to the reference voltage or a current corresponding to the reference voltage, and a forward voltage of a P-N junction or a current corresponding to the forward voltage.

Supplementary Note 3

The semiconductor device described in the supplementary note 2, wherein the plurality of sub correction currents of the plurality of correction circuits monotonously increase from the predetermined temperature toward a high-temperature side.

Supplementary Note 4

The semiconductor device described in the supplementary note 3, wherein each of the plurality of correction circuits includes: a first PMOS transistor whose. is coupled to a first power supply and whose drain is coupled to its gate; a second PMOS transistor whose source is coupled to the first power supply and whose gate is coupled to the gate of the first PMOS transistor; a bipolar transistor whose collector is coupled to the drain of the PMOS transistor and having a base to which voltage generated from the reference voltage is coupled; and a resistor whose one end is coupled to an emitter of the bipolar transistor and whose other end is coupled to a second power supply, wherein a voltage which corresponds to the reference voltage is a voltage obtained by dividing the reference voltage by a resistor and varies among the plurality of correction circuits, and wherein the second PMOS transistor outputs the sub correction current from the drain.

Supplementary Note 5

The semiconductor device described in the supplementary note 4, wherein each of the plurality of correction circuits further includes an amplifier having an input terminal to which the voltage corresponding to the reference voltage is coupled and having another input terminal and an output terminal coupled to the base of the bipolar transistor.

Supplementary Note 6

The semiconductor device described in the supplementary note 2, wherein the plurality of sub correction currents of the plurality of correction circuits monotonously increase from the predetermined temperature toward a low-temperature side.

Supplementary Note 7

The semiconductor device described in the supplementary note 6, wherein each of the plurality of correction circuits includes: a third PMOS transistor whose source is coupled to a first power supply and whose gate is coupled to a gate of a transistor in which reference current flows in the reference voltage generation circuit; a first PMOS transistor whose source is coupled to the first power supply and whose gate is coupled to its drain; a second PMOS transistor whose source is coupled to the first power supply and whose gate is coupled to the gate of the first PMOS transistor; a bipolar transistor whose collector is coupled to the drain of the PMOS transistor and whose base is coupled to the drain of the third PMOS transistor; a diode whose one end is coupled to the base of the bipolar transistor and whose other end is coupled to a second power supply; and a resistor whose one end is coupled to an emitter of the bipolar transistor and whose other end is coupled to the second power supply, wherein a current mirror circuit is comprised of a transistor for passing the reference current in the reference voltage generation circuit and the third PMOS transistor, and wherein a current mirror ratio of the current mirror circuit varies among the plurality of correction circuits, and the second PMOS transistor outputs the sub correction current from the drain.

Supplementary Note 8

The semiconductor device described in the supplementary note 1, wherein each of the plurality of correction circuits generates the sub correction current on the basis of at least one of the difference voltage between base-emitter voltages of two bipolar transistors having different emitter areas, current corresponding to the difference voltage, forward voltage of a P-N junction, and current corresponding to the forward voltage.

Supplementary Note 9

The semiconductor device described in the supplementary note 8, wherein the plurality of sub correction currents of the plurality of correction circuits monotonously increase from the predetermined temperature toward a high-temperature side.

Supplementary Note 10

The semiconductor device described in the supplementary note 9, wherein each of the plurality of correction circuits includes: a first PMOS transistor whose source is coupled to a first power supply and whose drain is coupled to its gate; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates current according to forward voltage of a P-N junction, wherein the second constant current supply generates current according to the difference voltage between base-emitter voltages of two bipolar transistors having different emitter areas and varies among the plurality of correction circuits, and wherein the second PMOS transistor outputs the sub correction current from the drain.

Supplementary Note 11

The semiconductor device described in the supplementary note 9, wherein each of the plurality of correction circuits includes: a first PMOS transistor whose source is coupled to a first power supply and whose gate is coupled to its drain; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates current according to forward voltage of a P-N junction and varies among the plurality of correction circuits, wherein the second constant current supply generates current according to the difference voltage between base-emitter voltages of two bipolar transistors having different emitter areas, and wherein the second PMOS transistor outputs the sub correction current from the drain.

Supplementary Note 12

The semiconductor device described in the supplementary note 9, wherein each of the plurality of correction circuits includes a resistor having one end to which a first power supply is coupled, a PMOS transistor whose source is coupled to the first power supply and whose gate is coupled to the other end of the resistor, and a constant current supply coupled between the other end of the resistor and a second power supply, wherein the constant current supply generates current according to the difference voltage of base-emitter voltages of two bipolar transistors having different emitter areas, wherein the resistor varies among the plurality of correction circuits, and wherein the PMOS transistor outputs the sub correction current from the drain.

Supplementary Note 13

The semiconductor device as described in the supplementary note 9, wherein each of the plurality of correction circuits includes a resistor having one end to which a first power supply is coupled, a PMOS transistor whose source is coupled to the first power supply and whose gate is coupled to the other end of the resistor, and a constant current-supply coupled between the other end of the resistor and a second power supply, wherein the constant current supply generates current according to the difference voltage of base-emitter voltages of two bipolar transistors having different emitter areas and varies among the plurality of correction circuits, and wherein the PMOS transistor outputs the sub correction current from the drain.

Supplementary Note 14

The semiconductor device as described in the supplementary note 8, wherein the plurality of sub correction currents of the plurality of correction circuits monotonously increase from the predetermined temperature toward a low-temperature side.

Supplementary Note 15

The semiconductor device as described in the supplementary note 14, wherein each of the plurality of correction circuits includes: a first PMOS transistor whose source is coupled to the first power supply and whose gate is coupled to its drain; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates current according to forward voltage of a P-N junction, wherein the second constant current supply generates current according to the difference voltage between base-emitter voltages of two bipolar transistors having different emitter areas and varies among the plurality of correction circuits, and wherein the second PMOS transistor outputs the sub correction current from the drain.

Supplementary Note 16

The semiconductor device as described in the supplementary note 14, wherein each of the plurality of correction circuits includes: a first PMOS transistor whose source is coupled to the first power supply and whose gate is coupled to its drain; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates current according to forward voltage of a P-N junction and varies among the plurality of correction circuits, wherein the second constant current supply generates current according to the difference voltage between base-emitter voltages of two bipolar transistors having different emitter areas, and wherein the second PMOS transistor outputs the sub correction current from the drain.

Supplementary Note 17

The semiconductor device described in the supplementary note 14, wherein each of the plurality of correction circuits includes a constant current supply having one end to which a first power supply is coupled, a PMOS transistor whose source is coupled to the first power supply and whose gate is coupled to the other end of the constant current supply, and a resistor coupled between the other end of the constant current supply and a second power supply, wherein the constant current supply generates current according to the difference voltage of base-emitter voltages of two bipolar transistors having different emitter areas, wherein the resistor varies among the plurality of correction circuits, and wherein the PMOS transistor Outputs the sub correction current from the drain.

Supplementary Note 18

The semiconductor device described in the supplementary note 14, wherein each of the plurality of correction circuits includes a constant current supply having one end to which a first power supply is coupled, a PMOS transistor whose source is coupled to the first power supply and whose gate is coupled to the other end of the constant current supply, and a resistor coupled between the other end of the constant current supply and a second power supply, wherein the constant current supply generates current according to the difference voltage of base-emitter voltages of two bipolar transistors having different emitter areas, and wherein the PMOS transistor outputs the sub correction current from the drain.

Supplementary Note 19

The semiconductor device as described in the supplementary note 8, wherein the sub correction current of a first correction circuit in the plurality of correction circuits monotonously increases from a first predetermined temperature toward a high-temperature side, and wherein the sub correction current of a second correction circuit in the plurality of correction circuits monotonously increases from a second predetermined temperature lower than the first predetermined temperature toward a low-temperature side.

Supplementary Note 20

The semiconductor device as described in the supplementary note 19, wherein the first correction circuit includes: a first PMOS transistor whose source is coupled to the first power supply and whose gate is coupled to its drain; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates first current according to forward voltage of a P-N junction, wherein the second constant current supply generates second current according to the difference voltage between base-emitter voltages of two bipolar transistors having different emitter areas, wherein the second PMOS transistor outputs the sub correction current from the drain, and wherein the second correction circuit includes:

a third PMOS transistor whose source is coupled to the first power supply and whose gate is coupled to its drain;

a fourth PMOS transistor whose source is coupled to the first power supply and whose gate is coupled to the gate of the third PMOS transistor;

a third constant current supply coupled between the first power supply and the drain of the third PMOS transistor; and a fourth constant current supply coupled between the drain of the first PMOS transistor and the second power supply, wherein the third constant current supply generates third current according to the difference voltage between base-emitter voltages of two bipolar transistors having different emitter areas, the third current is different from the second current, wherein the fourth constant current supply generates fourth current according to forward voltage of a P-N junction, the fourth current is the same as the second current, and wherein the fourth PMOS transistor outputs the sub correction current from the drain.

Supplementary Note 21

The semiconductor device as described in the supplementary note 19, wherein the first correction circuit includes: a first PMOS transistor whose source is coupled to the first power supply and whose gate is coupled to its drain; a second PMOS transistor whose source is coupled to the first power supply and whose gate is coupled to the gate of the first PMOS transistor; a first constant current supply coupled between the first power supply and the drain of the first PMOS transistor; and a second constant current supply coupled between the drain of the first PMOS transistor and a second power supply, wherein the first constant current supply generates first current according to forward voltage of a P-N junction, wherein the second constant current supply generates second current according to the difference voltage between base-emitter voltages of two bipolar transistors having different emitter areas, wherein the second PMOS transistor outputs the sub correction current from the drain, and wherein the second correction circuit includes: a third PMOS transistor whose source is coupled to the first power supply and whose gate is coupled to its drain; a fourth PMOS transistor whose source is coupled to the first power supply and whose gate is coupled to the gate of the third PMOS transistor; a third constant current supply coupled between the first power supply and the drain of the third PMOS transistor; and a fourth constant current supply coupled between the drain of the first PMOS transistor and the second power supply, wherein the third constant current supply generates third current according to the difference voltage between base emitter voltages of two bipolar transistors having different emitter areas, the third current is the same as the second current, wherein the fourth constant current supply generates fourth current according to forward voltage of a P-N junction, the fourth current is different from the second current, and wherein the fourth PMOS transistor outputs the sub correction current from the drain.

Supplementary Note 22

The semiconductor device as described in the supplementary note 19, wherein the first correction circuit includes: a first resistor having one end to which a first power supply is coupled; a first PMOS transistor whose source is coupled to the first power supply and whose gate is coupled to the other end of the first resistor; and a first constant current supply coupled between the other end of the first resistor and a second power supply, wherein the first constant current supply generates first current according to the difference voltage between base-emitter voltages of two bipolar transistors having different emitter areas, wherein the first PMOS transistor outputs the sub correction current from the drain, wherein the second correction circuit includes: a second constant current supply having one end to which the first power supply is coupled; a second PMOS transistor whose source is coupled to the first power supply and whose gate is coupled to the other end of the second constant current supply; and a second resistor coupled between the other end of the second constant current supply and a second power supply, wherein the second constant current supply generates a second current according to the difference voltage between base-emitter voltages of two bipolar transistors having different emitter areas, the second current is different from the first current, wherein the second resistor is the same as the first resistor, and wherein the PMOS transistor outputs the sub correction current from the drain.

Supplementary Note 23

The semiconductor device as described in the supplementary note 19, wherein the first correction circuit includes: a first resistor having one end to which a first power supply is coupled; a first PMOS transistor whose source is coupled to the first power supply and whose gate is coupled to the other end of the first resistor; and a first constant current supply coupled between the other end of the first resistor and a second power supply, wherein the first constant current supply generates first current according to the difference voltage between base-emitter voltages of two bipolar transistors having different emitter areas, wherein the first PMOS transistor outputs the sub correction current from the drain, wherein the second correction circuit includes: a second constant current supply having one end to which the first power supply is coupled; a second PMOS transistor whose source is coupled to the first power supply and whose gate is coupled to the other end of the second constant current supply; and a second resistor coupled between the other end of the second constant current supply and a second power supply, wherein the second constant current supply generates a second current according to the difference voltage between base-emitter voltages of two bipolar transistors having different emitter areas, the second current is the same as the first current, wherein the second resistor is different from the first resistor, and wherein the PMOS transistor outputs the sub correction current from the drain.

Supplementary Note 24

The semiconductor device as described in the supplementary note 1, wherein each of the plurality of correction circuits is selectively turned on/off by a control signal.

Supplementary Note 25

The semiconductor device as described in the supplementary note 1, wherein the reference voltage generation circuit generates reference current by adding current according to the difference voltage between base-emitter voltages of two bipolar transistors having different emitter areas, current according to forward voltage of a P-N junction, and the correction current, converts the reference current to voltage, and outputs the voltage as the reference voltage.

Supplementary Note 26

The semiconductor device as described in the supplementary note 5, wherein the reference voltage generation circuit includes a current generation unit which generates reference current obtained, by adding current according to the difference voltage between base-emitter voltages of two bipolar transistors having different emitter areas, current according to forward voltage of a P-N junction, and the correction current and an output unit which converts the reference current to voltage and outputs the voltage, wherein the current generation unit includes: a first bipolar transistor whose emitter terminal is disposed on a first potential node side; a second bipolar transistor having an emitter area larger than that of the first bipolar transistor, whose emitter terminal is coupled to an emitter terminal of the first bipolar transistor, and whose base terminal is coupled to a collector terminal of the first bipolar transistor; a first resistive element whose one end is coupled to the collector terminal of the first bipolar transistor and whose other end is coupled to the base terminal of the first bipolar transistor; a second resistive element whose one end is coupled to the collector terminal of the second bipolar transistor and whose other end is coupled to the other end of the first resistive element; a third resistive element whose one end is coupled to the base terminal of the first bipolar transistor and whose other end is coupled to the first potential node; a fourth resistive element whose one end is coupled to the emitter terminal of the first bipolar transistor and whose other end is coupled to the first potential node; an amplifier which outputs first voltage according to the difference voltage between voltage on the collector side of the first bipolar transistor and voltage on the collector side of the second bipolar transistor; and a voltage-current converter which converts the first voltage to second reference current, supplies the second reference current to a node to which the first and second resistive elements are coupled, and supplies the current as the reference current to the output unit, wherein the output unit has a fifth resistive element whose one end is coupled to the voltage-current converter and whose other end is coupled to the first potential node, wherein the fifth resistive element outputs, as the output voltage, voltage on the voltage-current converter side generated when the reference current flows and includes a plurality of sub resistive elements coupled in series, wherein a temperature characteristic of the output voltage can be adjusted by the third resistive element, wherein the absolute value of the output voltage can be adjusted by the fifth resistive element, and wherein a non-linear effect of the output voltage can be adjusted by the fourth resistive element.

What is claimed is:

1. A semiconductor device having a voltage generation circuit, wherein the voltage generation circuit comprises:
a reference voltage generation circuit which outputs reference voltage; and
a plurality of correction circuits which generate correction current and make it fed back to the reference voltage generation circuit,
wherein each of the correction circuits generates a sub correction current which monotonously increases from a predetermined temperature which varies among the correction circuits toward a low-temperature side or a high-temperature side, and wherein the correction current is sum of a plurality of the sub correction currents generated by the correction circuits.

2. The semiconductor device according to claim 1, wherein each of the correction circuits generates the sub correction current on the basis of the reference voltage or a voltage proportional to the reference voltage or a current corresponding to the reference voltage, and a forward voltage of a P-N junction or a current corresponding to the forward voltage.

3. The semiconductor device according to claim 2, wherein the sub correction currents of the correction circuits monotonously increase from the predetermined temperature toward a high-temperature side.

4. The semiconductor device according to claim 3, wherein each of the correction circuits comprises:
a first PMOS transistor whose source is coupled to a first power supply and whose drain is coupled to its gate;
a second PMOS transistor whose source is coupled to the first power supply and whose gate is coupled to the gate of the first PMOS transistor;
a bipolar transistor whose collector is coupled to the drain of the PMOS transistor and having a base to which voltage generated from the reference voltage is coupled; and
a resistor whose one end is coupled to an emitter of the bipolar transistor and whose other end is coupled to a second power supply,
wherein a Voltage which corresponds to the reference voltage is a voltage obtained by dividing the reference voltage by a resistor and varies among the correction circuits, and
wherein the second PMOS transistor outputs the sub correction current from the drain.

5. The semiconductor device according to claim 4, wherein each of the correction circuits further comprises an amplifier having an input terminal to which the voltage corresponding to the reference voltage is coupled and having another input terminal and an output terminal coupled to the base of the bipolar transistor.

6. The semiconductor device according to claim 2, wherein the sub correction currents of the correction circuits monotonously increase from the predetermined temperature toward a low-temperature side.

7. The semiconductor device according to claim 6, wherein each of the correction circuits comprises:
a third PMOS transistor whose source is coupled to a first power supply and whose gate is coupled to a gate of a transistor in which reference current flows in the reference voltage generation circuit;
a first PMOS transistor whose source is coupled to the first power supply and whose gate is coupled to its drain;
a bipolar transistor whose collector is coupled to the drain of the PMOS transistor and whose base is coupled to the drain of the third PMOS transistor;
a diode whose one end is coupled to the base of the bipolar transistor and whose other end is coupled to a second power supply; and
a resistor whose one end is coupled to an emitter of the bipolar transistor and whose other end is coupled to the second power supply,
wherein a current mirror circuit is comprised of a transistor for passing the reference current in the reference voltage generation circuit and the third PMOS transistor, and
wherein a current mirror ratio of the current mirror circuit varies among the correction circuits, and the second PMOS transistor outputs the sub correction current from the drain.

8. The semiconductor device according to claim 1, Wherein each of the correction circuits generates the sub correction current on the basis of at least one of the difference voltage between base-emitter voltages of two bipolar transistors having different emitter areas, a current corresponding to the difference voltage, forward voltage of a P-N junction, and current corresponding to the forward voltage.

9. The semiconductor device according to claim 8, wherein the sub correction currents of the correction circuits monotonously increase from the predetermined temperature toward a high-temperature side.

10. The semiconductor device according to claim 9, wherein each of the correction circuits comprises:
a first PMOS transistor whose source is coupled to a first power supply and whose gate is coupled to its drain;
a second PMOS transistor whose source is coupled to the first power supply and whose gate is coupled to the gate of the first PMOS transistor;
a first constant current supply coupled between the first power supply and the drain of the first PMOS transistor; and
a second constant current supply coupled between the drain of the first PMOS transistor and a second power supply,
wherein the first constant current supply generates current according to forward voltage of a P-N junction,
wherein the second constant current supply generates current according to the difference voltage between base-emitter voltages of two bipolar transistors having different emitter areas and varies among the correction circuits, and
wherein the second PMOS transistor outputs the sub correction current from the drain.

11. The semiconductor device according to claim 9, wherein each of the correction circuits comprises:
a first PMOS transistor whose source is coupled to a first power supply and whose gate is coupled to its drain;
a second PMOS transistor whose source is coupled to the first power supply and whose gate is coupled to the gate of the first PMOS transistor;
a first constant current supply coupled between the first power supply and the drain of the first PMOS transistor; and
a second constant current supply coupled between the drain of the first PMOS transistor and a second power supply,
wherein the first constant current supply generates current according to forward voltage of a P-N junction and varies among the correction circuits,
wherein the second constant current supply generates current according to the difference voltage between base-emitter voltages of two bipolar transistors having different emitter areas, and
wherein the second PMOS transistor outputs the sub correction current from the drain.

12. The semiconductor device according to claim 8, wherein the sub correction currents of the correction circuits monotonously increase from the predetermined temperature toward a low-temperature side.

13. The semiconductor device according to claim 12, wherein each of the correction circuits comprises:
a first PMOS transistor whose source is coupled to the first power supply and whose gate is coupled to its drain;
a second PMOS transistor whose source is coupled to the first power supply and whose gate is coupled to the gate of the first PMOS transistor;

a first constant current supply coupled between the first power supply and the drain of the first PMOS transistor; and
a second constant current supply coupled between the drain of the first PMOS transistor and a second power supply,
wherein the first constant current supply generates current according to forward voltage of a P-N junction,
wherein the second constant current supply generates current according to the difference voltage between base-emitter voltages of two bipolar transistors having different emitter areas, and
wherein the second PMOS transistor outputs the sub correction current from the drain.

14. The semiconductor device according to claim 12, wherein each of the correction circuits comprises:
a first PMOS transistor whose source is coupled to the first power supply and whose gate is coupled to its drain;
a second PMOS transistor whose source is coupled to the first power supply and whose gate is coupled to the gate of the first PMOS transistor;
a first constant current supply coupled between the first power supply and the drain of the first PMOS transistor; and
a second constant current supply coupled between the drain of the first PMOS transistor and a second power supply,
wherein the first constant current supply generates current according to forward voltage of a P-N junction and varies among the correction circuits,
wherein the second constant current supply generates current according to the difference voltage between base-emitter voltages of two bipolar transistors having different emitter areas, and
wherein the second PMOS transistor outputs the sub correction current from the drain.

15. The semiconductor device according to claim 8,
wherein the sub correction current of a first correction circuit in the correction circuits monotonously increases from a first predetermined temperature toward a high-temperature side, and
wherein the sub correction current of a second correction circuit in the correction circuits monotonously increases from a second predetermined temperature lower than the first predetermined temperature toward a low-temperature side.

16. The semiconductor device according to claim 15,
wherein the first correction circuit comprises:
a first PMOS transistor whose source is coupled to the first power supply and whose gate is coupled to its drain;
a second PMOS transistor whose source is coupled to the first power supply and whose gate is coupled to the gate of the first PMOS transistor;
a first constant current supply coupled between the first power supply and the drain of the first PMOS transistor; and
a second constant current supply coupled between the drain of the first PMOS transistor and a second power supply,
wherein the first constant current supply generates first current according to forward voltage of a P-N junction,
wherein the second constant current supply generates second current according to the difference voltage between base-emitter voltages of two bipolar transistors having different emitter areas,
wherein the second PMOS transistor outputs the sub correction current from the drain,
wherein the second correction circuit comprises:
a third PMOS transistor whose source is coupled to the first power supply and whose gate is coupled to its drain;
a fourth PMOS transistor whose source is coupled to the first power supply and whose gate is coupled to the gate of the third PMOS transistor;
a third constant current supply coupled between the first power supply and the drain of the third PMOS transistor; and
a fourth constant current supply coupled between the drain of the first PMOS transistor and the second power supply,
wherein the third constant current supply generates third current according to the difference voltage between base-emitter voltages of two bipolar transistors having different emitter areas, the third current being different from the second current,
wherein the fourth constant current supply generates fourth current according to forward voltage of a P-N junction, the fourth current being the same as the second current, and
wherein the fourth PMOS transistor outputs the sub correction current from the drain.

17. The semiconductor device according to claim 15,
wherein the first correction circuit comprises:
a first PMOS transistor whose source is coupled to the first power supply and whose gate is coupled to its drain;
a second PMOS transistor whose source is coupled to the first power supply and whose gate is coupled to the gate of the first PMOS transistor;
a first constant current supply coupled between the first power supply and the drain of the first PMOS transistor; and
a second constant current supply coupled between the drain of the first PMOS transistor and a second power supply,
wherein the first constant current supply generates first current according to forward voltage of a P-N junction,
wherein the second constant current supply generates second current according to the difference voltage between base-emitter voltages of two bipolar transistors having different emitter areas, and
wherein the second PMOS transistor outputs the sub correction current from the drain,
wherein the second correction circuit comprises:
a third PMOS transistor whose source is coupled to the first power supply and whose gate is coupled to its drain;
a fourth PMOS transistor whose source is coupled to the first power supply and whose gate is coupled to the gate of the third PMOS transistor;
a third constant current supply coupled between the first power supply and the drain of the third PMOS transistor; and
a fourth constant current supply coupled between the drain of the first PMOS transistor and the second power supply,
wherein the third constant current supply generates third current according to the difference voltage between base-emitter voltages of two bipolar transistors having different emitter areas, the third current being the same as the second current,
wherein the fourth constant current supply generates fourth current according to forward voltage of a P-N junction, the fourth current being different from the second current, and
wherein the fourth PMOS transistor outputs the sub Correction current from the drain.

18. The semiconductor device according to claim 15,
wherein the first correction circuit comprises:
a first resistor having one end to which a first power supply is coupled;
a first PMOS transistor whose source is coupled to the first power supply and whose gate is coupled to the other end of the first resistor; and
a first constant current supply coupled between the other end of the first resistor and a second power supply,
wherein the first constant current supply generates first current according to the difference voltage between base-emitter voltages of two bipolar transistors having different emitter areas, and
wherein the first PMOS transistor outputs the sub correction current from the drain,
wherein the second correction circuit comprises:
a second constant current supply having one end, to which the first power supply is coupled;
a second PMOS transistor whose source is coupled to the first power supply and whose gate is coupled to the other end of the second constant current supply; and
a second resistor coupled between the other end of the second constant current supply and a second power supply,
wherein the second constant current supply generates a second current according to the difference voltage between base-emitter voltages of two bipolar transistors having different emitter areas, the second current being different from the first current,
wherein the second resistor is the same as the first resistor, and
wherein the PMOS transistor outputs the sub correction current from the drain.

19. The semiconductor device according to claim 1, wherein each of the correction circuits is selectively turned on/off by a control signal.

20. The semiconductor device according to claim 1, wherein the reference voltage generation circuit generates reference current by adding current according to the difference voltage between base-emitter voltages of two bipolar transistors having different emitter areas, current according to forward voltage of a P-N junction, and the correction current, converts the reference current to voltage, and outputs the voltage as the reference voltage.

* * * * *